(12) United States Patent
Lee

(10) Patent No.: US 9,741,935 B2
(45) Date of Patent: *Aug. 22, 2017

(54) ORGANIC LIGHT-EMITTING DEVICE

(71) Applicant: Samsung Display Co., Ltd., Yongin, Gyeonggi-Do (KR)

(72) Inventor: Jae-Yong Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 636 days.

This patent is subject to a terminal disclaimer.

(21) Appl. No.: 14/205,129

(22) Filed: Mar. 11, 2014

(65) Prior Publication Data

US 2015/0162539 A1    Jun. 11, 2015

(30) Foreign Application Priority Data

Dec. 5, 2013  (KR) .................. 10-2013-0150835

(51) Int. Cl.
*H01L 51/00* (2006.01)
*H01L 51/50* (2006.01)
*C09K 11/06* (2006.01)

(52) U.S. Cl.
CPC .......... *H01L 51/0054* (2013.01); *C09K 11/06* (2013.01); *H01L 51/0052* (2013.01); *H01L 51/0067* (2013.01); *H01L 51/0072* (2013.01); *H01L 51/0073* (2013.01); *H01L 51/0074* (2013.01); *H01L 51/0081* (2013.01); *H01L 51/0085* (2013.01); *H01L 51/5016* (2013.01); *H01L 2251/5384* (2013.01)

(58) Field of Classification Search
CPC ......... H01L 2251/5384; H01L 51/0052; H01L 51/0054; H01L 51/0067; H01L 51/0072; H01L 51/0073; H01L 51/0074; H01L 51/0081; H01L 51/0085; H01L 51/5016; C09K 11/06

See application file for complete search history.

(56) References Cited

U.S. PATENT DOCUMENTS

| 8,343,638 | B2 * | 1/2013 | Yang | ................... | H01L 51/0058 |
| | | | | | 313/502 |
| 9,082,988 | B2 * | 7/2015 | Lee | ...................... | H01L 51/5016 |
| 9,362,507 | B2 * | 6/2016 | Lee | ...................... | H01L 51/0071 |
| 2006/0280965 | A1 | 12/2006 | Kwong et al. | | |
| 2008/0286606 | A1 * | 11/2008 | Hwang | ................... | C09K 11/06 |
| | | | | | 428/690 |
| 2010/0237334 | A1 * | 9/2010 | Ma | ........................ | C07D 307/91 |
| | | | | | 257/40 |
| 2014/0239275 | A1 | 8/2014 | Lee | | |
| 2015/0001489 | A1 * | 1/2015 | Lee | ...................... | H01L 51/0054 |
| | | | | | 257/40 |

FOREIGN PATENT DOCUMENTS

| KR | 10-0611219 B1 | 8/2006 |
| KR | 10-2007-0037070 A | 4/2007 |
| KR | 10-2008-0013934 A | 2/2008 |
| KR | 10-2011-0066766 A | 6/2011 |
| KR | 10-2011-0077909 A | 7/2011 |
| KR | 10-2011-0092262 A | 8/2011 |
| KR | 10-2014-0108022 A | 9/2014 |

* cited by examiner

*Primary Examiner* — Dawn Garrett
(74) *Attorney, Agent, or Firm* — Knobbe Martens Olson & Bear LLP

(57) ABSTRACT

An organic light-emitting device including a first electrode, a second electrode and an organic layer disposed between the first electrode and the second electrode is provided.

23 Claims, 1 Drawing Sheet

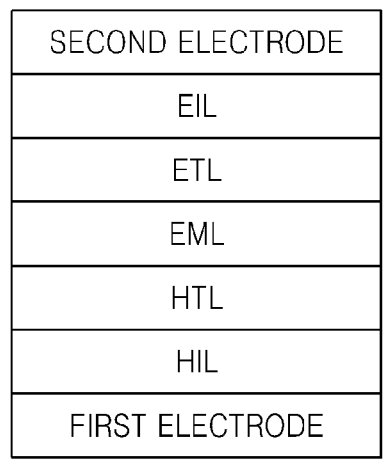

ORGANIC LIGHT-EMITTING DEVICE

INCORPORATION BY REFERENCE TO ANY PRIORITY APPLICATIONS

Any and all priority claims identified in the Application Data Sheet, or any correction thereto, are hereby incorporated by reference under 37 CFR 1.57. For example, this application claims the benefit of Korean Patent Application No. 10-2013-0150835 filed in the Korean Intellectual Property Office on Dec. 5, 2013, the disclosure of which is incorporated herein in its entirety by reference.

BACKGROUND

Field

This disclosure relates to an organic light-emitting device.

Description of the Related Technology

Organic light-emitting devices (OLEDs), which are self-emitting devices, have advantageous characteristics such as wide viewing angles, excellent contrast, quick response, high brightness, excellent driving voltage characteristics, and can provide multicolored images.

A typical OLED has a structure including a substrate, and an anode, a hole transport layer (HTL), an emission layer (EML), an electron transport layer (ETL), and a cathode which are sequentially stacked on the substrate. In this regard, the HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

A major factor that affects the emission efficiency of an OLED is its light-emitting material. Fluorescent materials are widely used as light-emitting materials, and it is also an effective method for emission efficiency improvement to use phosphorescent materials that are capable of improving emission efficiency up to four times based on theoretical electroluminescence mechanisms. Iridium (III) complex-based phosphorescent materials such as $(acac)Ir(btp)_2$, $Ir(ppy)_3$, and Firpic may be used for red, green, and blue emission, respectively.

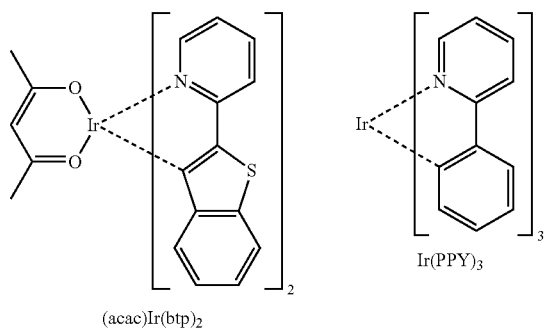

(acac)Ir(btp)$_2$

Ir(PPY)$_3$

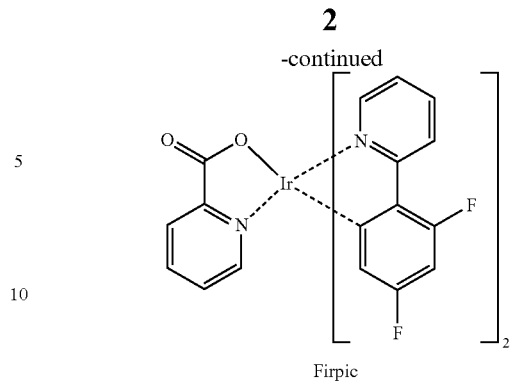

Firpic 4,4'-N,N'-dicarbazole-biphenyl (CBP) is one example of known phosphorescent host materials.

Although advantageous in terms of light-emitting characteristics existing light-emitting materials may have a low glass transition temperature and poor thermal stability, and thus may be deteriorated during a high-temperature deposition process under vacuum. According to the relationship that "power efficiency=($\pi$/voltage)×current efficiency", i.e., the power efficiency of an OLED is in inverse proportion to a voltage, the power efficiency of the OLED may be increased to lower consumption power of the OLED. In practice, an OLED using a common phosphorescent (host) material such as BAlq or CBP may have a considerably higher current efficiency (cd/A), but also have a higher driving voltage, as compared with an OLED using a fluorescent material, and thus is not advantageous in terms of power efficiency (lm/w).

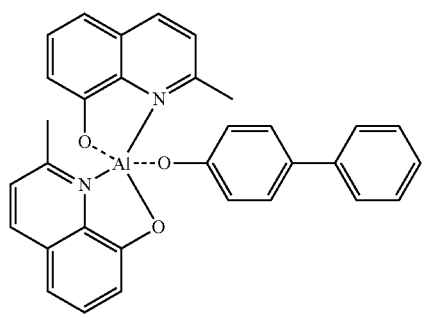

BAlq

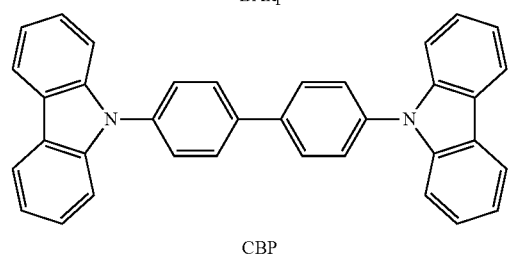

CBP

OLEDs using such an existing host material are also not satisfactory in terms of lifetime, and thus there is a need to develop a more stable host material with improved characteristics.

SUMMARY

One or more embodiments of the present disclosure include high-efficiency organic light-emitting devices with improved lifetime characteristics.

Additional aspects will be set forth in part in the description which follows and, in part, will be apparent from the description, or may be learned by practice of the presented embodiments.

According to one or more embodiments of the present disclosure, an organic light-emitting device includes: a first electrode; a second electrode; and an organic layer disposed between the first electrode and the second electrode, wherein the organic layer includes a compound represented by Formula 1 and a compound represented by Formula 2:

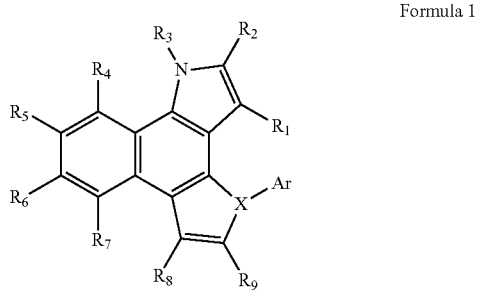

Formula 1 wherein, in Formula 1, $R_1$ to $R_9$ are each independently a hydrogen, a deuterium, a substituted or unsubstituted C1-C60 alkyl group, a substituted or unsubstituted C3-C60 cycloalkyl group, a substituted or unsubstituted C6-C60 aryl group, a substituted or unsubstituted C1-C60 heteroaryl group, C6-C60 arylsilyl group, or a substituted or unsubstituted C6-C60 condensed polycyclic group, Ar is a lone pair of electrons, a substituted or unsubstituted C6-C60 aryl group, a substituted or unsubstituted C1-C60 heteroaryl group, or a substituted or unsubstituted C6-C60 condensed polycyclic group, and X is N (nitrogen) or S (sulfur), provided when X is N (nitrogen) then Ar is a substituted or unsubstituted C6-C60 aryl group, a substituted or unsubstituted C1-C60 heteroaryl group, or a substituted or unsubstituted C6-C60 condensed polycyclic group, and when X is S (sulfur) Ar is a lone pair of electrons,

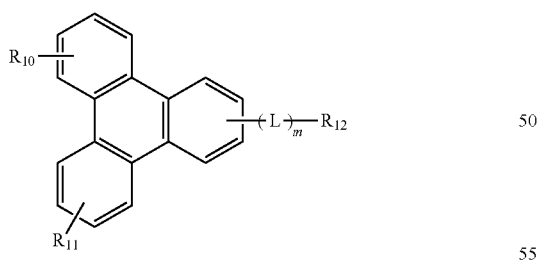

Formula 2 wherein, in Formula 2, L is a substituted or unsubstituted C6-C60 arylene group, or a substituted or unsubstituted C1-C60 heteroarylene group, $R_{10}$ to $R_{12}$ are each independently a hydrogen, a deuterium, a substituted or unsubstituted C1-C60 alkyl group, a substituted or unsubstituted C3-C60 cycloalkyl group, a substituted or unsubstituted C6-C60 aryl group, a substituted or unsubstituted C1-C60 heteroaryl group, or an amine group substituted with a C6-C60 aryl group or a C1-C60 heteroaryl group, and m is an integer of 0 to 5.

According to one or more embodiments of the present disclosure, a flat panel display device includes the above-described organic light-emitting device, wherein the first electrode of the organic light-emitting device is electrically connected to a source electrode or a drain electrode of a thin-film transistor.

BRIEF DESCRIPTION OF THE DRAWINGS

These and/or other aspects will become apparent and more readily appreciated from the following description of the embodiments, taken in conjunction with the accompanying drawings in which:

The FIGURE is a schematic view of a structure of an organic light-emitting device according to an embodiment of the present disclosure.

DETAILED DESCRIPTION

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

According to an embodiment of the present disclosure, an organic light-emitting device includes a first electrode; a second electrode; and an organic layer disposed between the first electrode and the second electrode, wherein the organic layer includes a compound represented by Formula 1 and a compound represented by Formula 2:

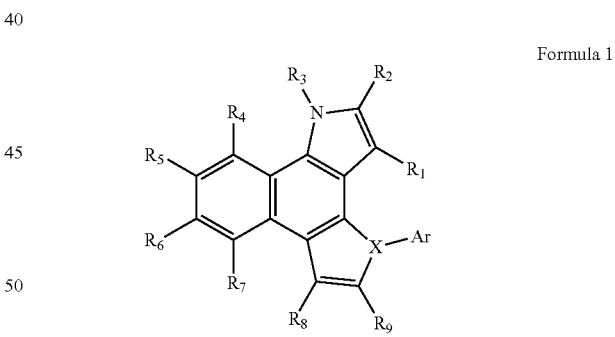

Formula 1 wherein in Formula 1, $R_1$ to $R_9$ may be each independently a hydrogen, a deuterium, a substituted or unsubstituted C1-C60 alkyl group, a substituted or unsubstituted C3-C60 cycloalkyl group, a substituted or unsubstituted C6-C60 aryl group, a substituted or unsubstituted C1-C60 heteroaryl group, C6-C60 arylsilyl group, or a substituted or unsubstituted C6-C60 condensed polycyclic group, Ar may be a lone pair of electrons, a substituted or unsubstituted C6-C60 aryl group, a substituted or unsubstituted C1-C60 heteroaryl group, or a substituted or unsubstituted C6-C60 condensed polycyclic group, and X may be N (nitrogen) or S (sulfur), provided when X is N (nitrogen) then Ar is a substituted or unsubstituted C6-C60 aryl group, a substituted or unsubstituted C1-C60 heteroaryl group, or a substituted or unsubstituted C6-C60 condensed polycyclic group, and when X is S (sulfur) Ar is a lone pair of electrons,

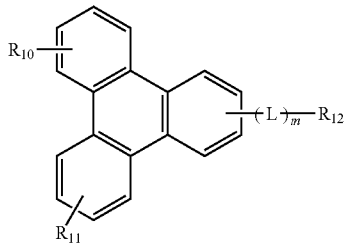

Formula 2 wherein in Formula 2,

L may be a substituted or unsubstituted C6-C60 arylene group, or a substituted or unsubstituted C1-C60 heteroarylene group, $R_{10}$ to $R_{12}$ may be each independently a hydrogen, a deuterium, a substituted or unsubstituted C1-C60 alkyl group, a substituted or unsubstituted C3-C60 cycloalkyl group, a substituted or unsubstituted C6-C60 aryl group, a substituted or unsubstituted C1-C60 heteroaryl group, or an amine group substituted with a C6-C60 aryl group or a C1-C60 heteroaryl group, and m may be an integer of 0 to 5.

In some embodiments, the compound of Formula 1 may have a high glass transition temperature (Tg) or melting point due to inclusion of a heterocyclic group. Thus, the compound of Formula 1 may high heat resistance against Joule's heat generated during light emission, and may have high durability in high-temperature environments. In some embodiments, an organic light-emitting device manufactured using the compound of Formula 1 may have high durability when operated or stored at high temperatures. In some embodiments, the compound of Formula 1 may have improved hole and electron injection and migration characteristics, i.e., improved hole and electron characteristics. However, the compound of Formula 1 may have a relatively short lifetime when used alone as a luminescent host material.

In some embodiments, the compound of Formula 2 may have a wide band gap, and accordingly may have poor hole and electron characteristics when used alone as a luminescent host material, and consequently lower current-voltage characteristics of an organic light-emitting device. As a result, the organic light-emitting device may have a higher driving voltage and consume more power. However, the compound of Formula 2 may have a strong molecular structure robust against oxidation-reduction and have a high T1 (triplet) energy level of about 2.6 eV to about 2.7 eV, and may be used as an efficient phosphorescent host in an emission layer when the emission layer is formed using an appropriate method.

In embodiments of the present disclosure, the compound of Formula 1 and the compound of Formula 2 may be used together as emission host materials to compensate for drawbacks of each of the compounds and provide a synergy effect. The use of the compound of Formula 1 and the compound of Formula 2 together may reduce electronic stress on an emission layer and may improve an electron-hole balance to improve the lifetime characteristics and high-efficiency characteristics of an organic light-emitting device.

Substituents in Formula 1 of the compound will be described in greater detail.

In some embodiments, $R_3$ in Formula 1 may be represented by at least one of Formulae 2a to 2d:

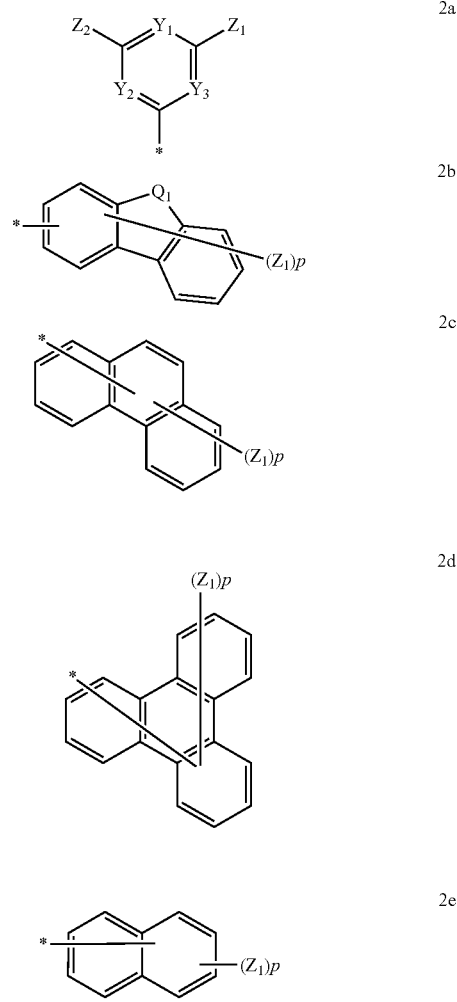

where * may indicate an attachment position.

In Formulae 2a to 2e, $Y_1$, $Y_2$, and $Y_3$ may be each independently CH or N (nitrogen);

$Q_1$ may be —$CR_{50}R_{51}$— or —S—;

$Z_1$, $Z_2$, $R_{50}$, and $R_{51}$ may be each independently a hydrogen, a deuterium, a substituted or unsubstituted C1-C20 alkyl group, a substituted or unsubstituted C6-C20 aryl group, a substituted or unsubstituted C1-C20 heteroaryl group, a substituted or unsubstituted C6-C20 condensed polycyclic group, an amino group substituted with a C6-C20 aryl group or a C1-C20 heteroaryl group, a halogen group, a cyano group, a nitro group, a hydroxy group, or a carboxyl group;

p may be an integer of 1 to 11; and

* may indicate an attachment position.

In some embodiments, $R_6$ in Formula 1 may be represented by at least one of Formulae 3a to 3g:

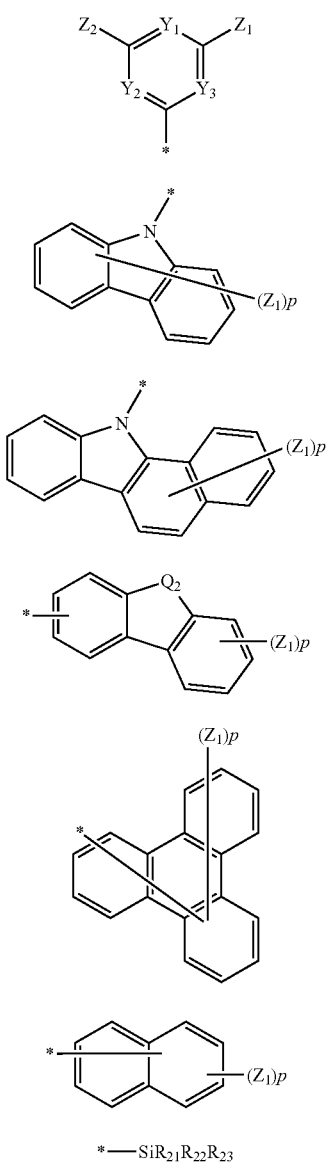

In Formulae 3a to 3g, $Y_1$, $Y_2$, and $Y_3$ may be each independently CH or N (nitrogen);

$Q_2$ may be —O— or —S—;

$Z_1$, $Z_2$, $R_{21}$, $R_{22}$, and $R_{23}$ may be each independently a hydrogen, a deuterium, a substituted or unsubstituted C1-C20 alkyl group, a substituted or unsubstituted C6-C20 aryl group, a substituted or unsubstituted C1-C20 heteroaryl group, a substituted or unsubstituted C6-C20 condensed polycyclic group, An amino group substituted with a C6-C20 aryl group or a C1-C20 heteroaryl group, a halogen group, a cyano group, a nitro group, a hydroxy group, or a carboxyl group;

p may be an integer of 1 to 11; and

* may indicate an attachment position.

In some other embodiments, $R_9$ in Formula 1 may be a hydrogen, a deuterium, or wherein $Z_1$ may be a hydrogen, a deuterium, a substituted or unsubstituted C1-C20 alkyl group, a substituted or unsubstituted C6-C20 aryl group, a substituted or unsubstituted C1-C20 heteroaryl group, a substituted or unsubstituted C6-C20 condensed polycyclic group, An amino group substituted with a C6-C20 aryl group or a C1-C20 heteroaryl group, a halogen group, a cyano group, a nitro group, a hydroxy group, or a carboxyl group;

p may be an integer of 1 to 5; and

* may indicate an attachment position.

In some other embodiments, Ar in Formula 1 may be a lone pair of electrons, or is represented by at least one of Formulae 4a to 4e:

In Formulae 4a to 4e, $Y_1$, $Y_2$, and $Y_3$ may be each independently CH or N (nitrogen);

$Q_3$ may be —$CR_{50}R_{51}$—, —$NR_{52}$—, or —S—;

$Z_1$, $Z_2$, $R_{50}$, $R_{51}$, and $R_{52}$ may be each independently a hydrogen, a deuterium, a substituted or unsubstituted C1-C20 alkyl group, a substituted or unsubstituted C6-C20 aryl group, a substituted or unsubstituted C1-C20 heteroaryl group, a substituted or unsubstituted C6-C20 condensed polycyclic group, an amino group substituted with a C6-C20 aryl group or a C1-C20 heteroaryl group, a halogen group, a cyano group, a nitro group, a hydroxy group, or a carboxyl group;

p may be an integer of 1 to 9; and

* may indicate an attachment position.

In some other embodiments, $R_1$, $R_2$, $R_4$, $R_5$, $R_7$, and $R_8$ in Formula 1 may be each independently a hydrogen or a deuterium.

In some other embodiments, $R_{10}$ and $R_{11}$ in Formula 2 may be each independently a hydrogen or a deuterium.

In some other embodiments, L in Formula 2 may be represented by one of Formulae 5a and 5b:

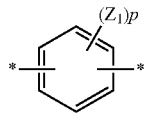
5a

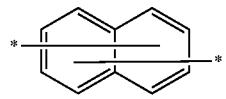
5b wherein in Formulae 5a and 5b, $Z_1$ may be a hydrogen, a deuterium, a substituted or unsubstituted C1-C20 alkyl group, a substituted or unsubstituted C6-C20 aryl group, a substituted or unsubstituted C1-C20 heteroaryl group, a substituted or unsubstituted C6-C20 condensed polycyclic group, an amino group substituted with a C6-C20 aryl group or a C1-C20 heteroaryl group, a halogen group, a cyano group, a nitro group, a hydroxy group, or a carboxyl group; and

* may indicate an attachment position.

In some other embodiments, $R_{11}$ in Formula 2 may be represented by one of Formulae 6a to 6g:

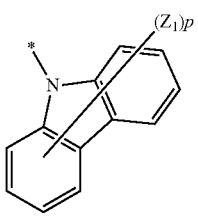
6a

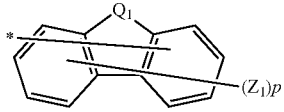
6b

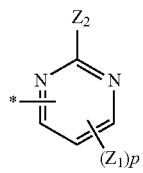
6c

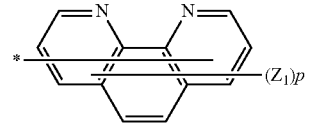
6d

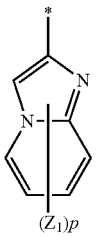
6e

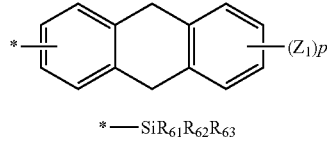
6f $$*\!-\!\!-\text{SiR}_{61}\text{R}_{62}\text{R}_{63}$$
6g

In Formulae 6a to 6g, $Q_1$ may be $-NR_{51}$, $-CR_{52}R_{53}-$, or $-S-$;

$Z_1$, $Z_2$, $R_{51}$, $R_{52}$, $R_{53}$, $R_{61}$, $R_{62}$, and $R_{63}$ may be each independently a hydrogen, a deuterium, a substituted or unsubstituted C1-C20 alkyl group, a substituted or unsubstituted C6-C20 aryl group, a substituted or unsubstituted C1-C20 heteroaryl group, a substituted or unsubstituted C6-C20 condensed polycyclic group, an amino group substituted with a C6-C20 aryl group or a C1-C20 heteroaryl group, a halogen group, a cyano group, a nitro group, a hydroxy group, or a carboxyl group;

p may be an integer of 1 to 9; and

* may indicate an attachment position.

In some other embodiments, m in Formula 2 may be an integer of 0 to 3.

Hereinafter, substituents described with reference to the formulae will now be described in detail. In this regard, the numbers of carbons in substituents are presented only for illustrative purposes and do not limit the characteristics of the substituents. The substituents not defined herein are construed as the same meanings understood by one of ordinary skill in the art.

The term "C1-C60 alkyl group" as used herein refers to a linear or branched saturated hydrocarbon. The C1-C60 alkyl group may be substituted or unsubstituted. Examples of the alkyl group may include, but are not limited to, a methyl group, an ethyl group, a propyl group, an isobutyl group, a sec-butyl group, a pentyl group, an iso-amyl group, a hexyl group, a heptyl group, an octyl group, a nonanyl group, and a dodecyl group. At least one hydrogen atom of the alkyl group may be substituted with a deuterium atom, a halogen atom, a hydroxyl group, a nitro group, a cyano group, an amino group, an amidino group, a hydrazine, a hydrazone, a carboxyl group or a salt thereof, a sulfonic acid group or a salt thereof, a phosphoric acid group or a salt thereof, a C1-C10 alkyl group, a C1-C10 alkoxy group, a C2-C10 alkenyl group, a C2-C10 alkynyl group, a C6-C16 aryl group, an alkylsilyl group, an arylsilyl group, or a C2-C16 heteroaryl group.

The term "C2-C60 alkenyl group" as used herein refers to an unsaturated alkyl groups having at least one carbon-carbon double bond in the center or at a terminal of the alkyl group. The C2-C60 alkenyl group may be substituted or unsubstituted. Examples of the alkenyl group are an ethenyl group, a propenyl group, and a butenyl group. At least one hydrogen atom in the unsubstituted alkenyl group may be substituted with a substituent described above in conjunction with the alkyl group.

The term "C2-C60 alkynyl group" as used herein refers to an alkyl group having at least one carbon-carbon triple bond in the center or at a terminal of the alkyl group. The C2-C60 alkynyl group may be substituted or unsubstituted. Non-limiting examples of the unsubstituted C2-C20 alkynyl group are acetylene, propylene, phenylacetylene, naphthylacetylene, isopropylacetylene, t-butylacetylene, and diphenylacetylene. At least one hydrogen atom in the alkynyl group may be substituted with a substituent described above in conjunction with the alkyl group.

The term "C3-C60 cycloalkyl group" as used herein refers to a C3-C60 mono or polycyclic hydrocarbon group. The C3-C60 cycloalkyl group may be substituted or unsubstituted. In some embodiments, the cyclic alkyl group may be substituted with a substituent described above in conduction with the C1-C60 alkyl group.

The term "C1-C60 alkoxy group" as used herein refers to a group having a structure of —OA wherein A is an C1-C60 alkyl group as described above. The C1-C60 alkoxy group may be substituted or unsubstituted. Non-limiting examples of the unsubstituted C1-C60 alkoxy group are a methoxy group, an ethoxy group, a propoxy group, an isopropyloxy group, a butoxy group, and a pentoxy group. At least one hydrogen atom of the alkoxy group may be substituted with a substituent such as those described above in conjunction with the alkyl group.

The term "C6-C60 aryl group" or "C6-C60 arylene group" as used herein refers to a carbocyclic aromatic system containing at least one ring. The C6-C60 aryl group may be substituted or unsubstituted. In some embodiments, at least two rings may be fused to each other or linked to each other by a single bond. In some embodiments, the C6-C60 aryl group may be phenyl, naphthyl, or anthracenyl. In some embodiments, at least one hydrogen atom in the aryl group may be substituted with a substituent described above in conjunction with the unsubstituted C1-C60 alkyl group.

The term "C6-C60 arylsilyl group" as used herein refers to a group in which one, two, or three C6-C60 aryl groups are attached to silicon (Si).

Non-limiting examples of the substituted or unsubstituted C6-C60 aryl group are a phenyl group, a C1-C10 alkylphenyl group (for example, an ethylphenyl group), halophenyl group (for example, o-, m- or p-fluorophenyl group, dichlorophenyl group), a cyanophenyl group, a dicyanophenyl group, a trifluoromethoxyphenyl group, a biphenyl group, a halobiphenyl group, a cyanobiphenyl group, a C1-C10 alkyl biphenyl group, a C1-C10 alkoxybiphenyl group, a o-, m-, and p-toryl group, an o-, m-, and p-cumenyl group, a mesityl group, a phenoxyphenyl group, a (α,α-dimethylbenzene) phenyl group, a (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a C1-C10 alkylnaphthyl group (for example, a methylnaphthyl group), a C1-C10 alkoxynaphthyl group (for example, a methoxynaphthyl group), cyanonaphthyl group, an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrycenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronelyl group, a trinaphthylenyl group, a heptaphenyl group, a heptacenyl group, a pyranthrenyl group, and an ovalenyl group.

The term "C1-C60 heteroaryl group" or "C1-C60 heteroarylene group" as used herein refers to an aromatic ring or ring system including one, two, three, or four heteroatoms selected from N (nitrogen), O (oxygen), P (phosphorus) and S (sulfur) in the ring or ring system backbone. The C1-C60 heteroaryl group may be substituted or unsubstituted. In some embodiments, at least two rings may be fused to each other or linked to each other by a single bond. Non-limiting examples of the unsubstituted C1-C60 heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazol group, an indol group, a quinolyl group, an isoquinolyl group, and a dibenzothiophene group. In addition, at least one hydrogen atom in the heteroaryl group may be substituted with a substituent described above in conjunction with the unsubstituted C1-C60 alkyl group.

The term "C6-C60 aryloxy group" as used herein refers to a group represented by —OA$_1$, wherein A$_1$ may be a C6-C60 aryl group. The C6-C60 aryloxy group may be substituted or unsubstituted. An example of the aryloxy group is a phenoxy group. In some embodiments, at least one hydrogen atom in the aryloxy group may be substituted with a substituent described above in conjunction with the unsubstituted C1-C60 alkyl group.

The term "C6-C60 arylthio group" as used herein refers to a group represented by —SA$_1$, wherein A$_1$ may be a C6-C60 aryl group. The C6-C60 arylthio group may be substituted or unsubstituted. Non-limiting examples of the arylthio group are a benzenethio group and a naphthylthio group. In some embodiments, at least one hydrogen atom in the arylthio group may be substituted with a substituent described above in conjunction with the unsubstituted C1-C60 alkyl group.

The term "C6-C60 condensed polycyclic group" as used herein refers to a substituent including at least two rings wherein at least one aromatic ring and at least one non-aromatic ring are fused to each other, or refers to a substituent having an unsaturated group in a ring that may not form a conjugate structure. The C6-C60 condensed polycyclic group may be substituted or unsubstituted. The C6-C60 condensed polycyclic group is distinct from an aryl group or a heteroaryl group in terms of being non-aromatic.

Non-limiting examples of the compound of Formula 1 are Compounds 1 to 21 below:

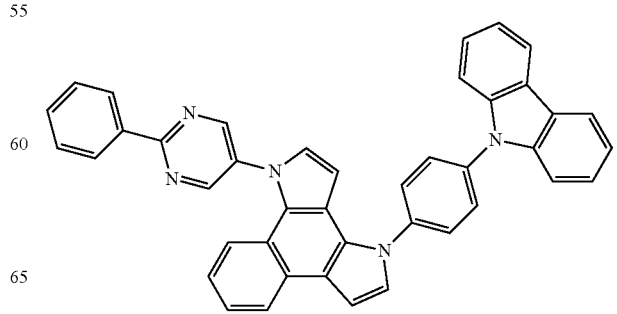

1

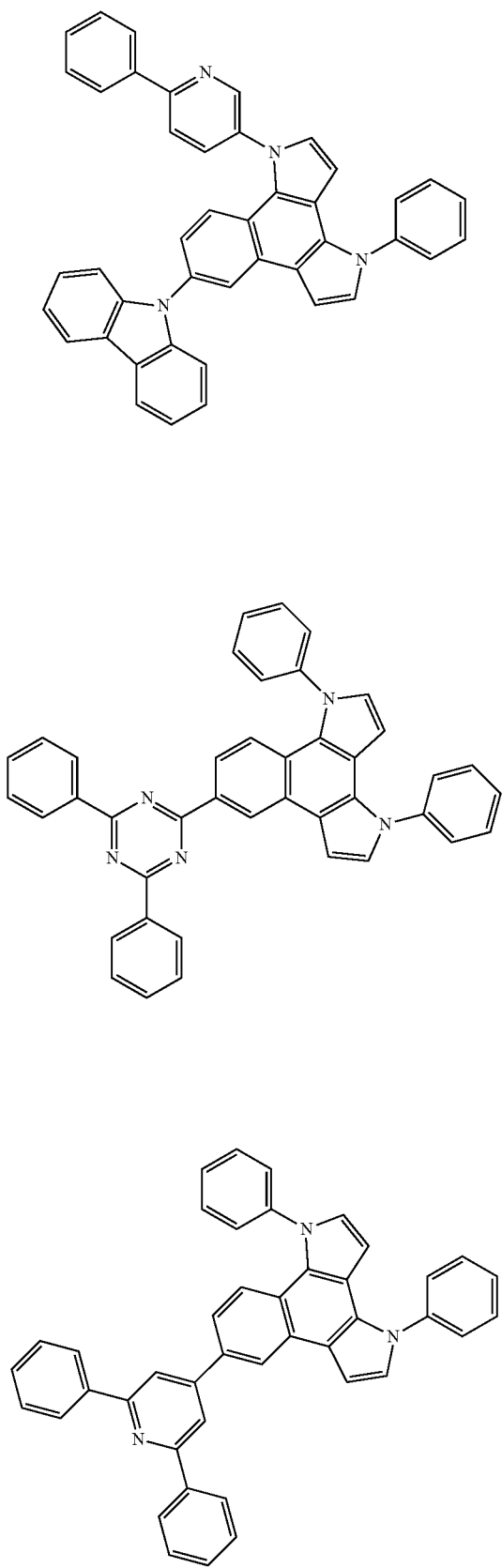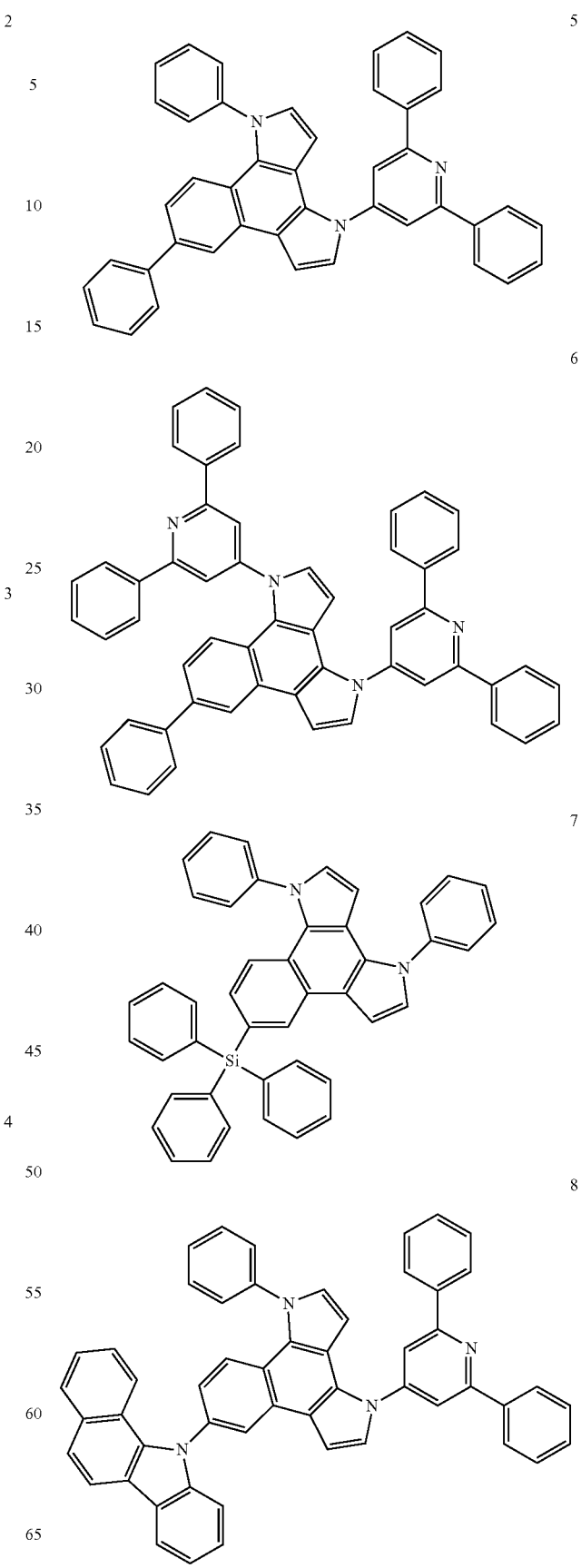

-continued
9
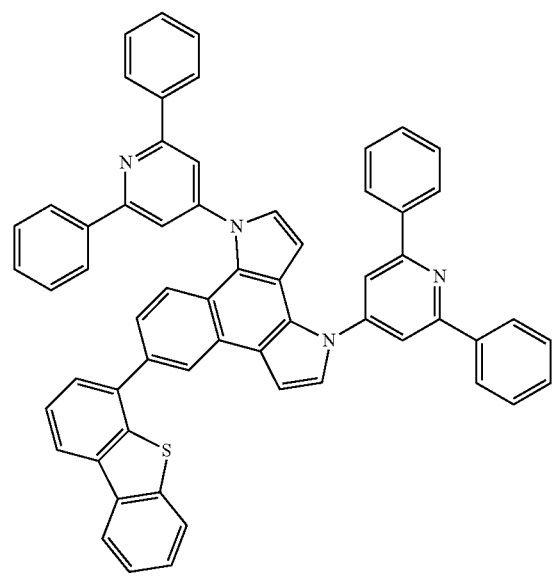
10
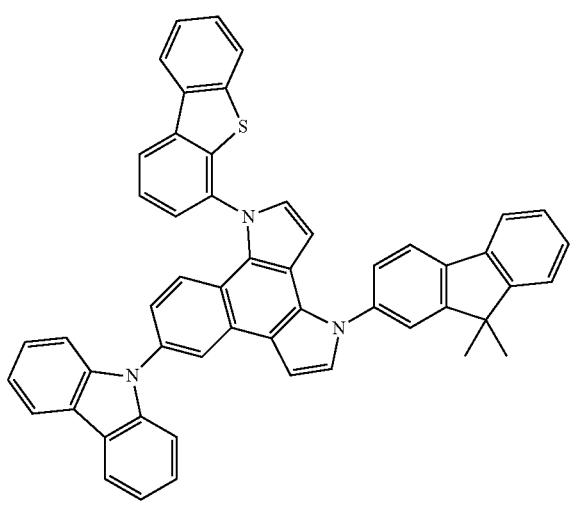
11
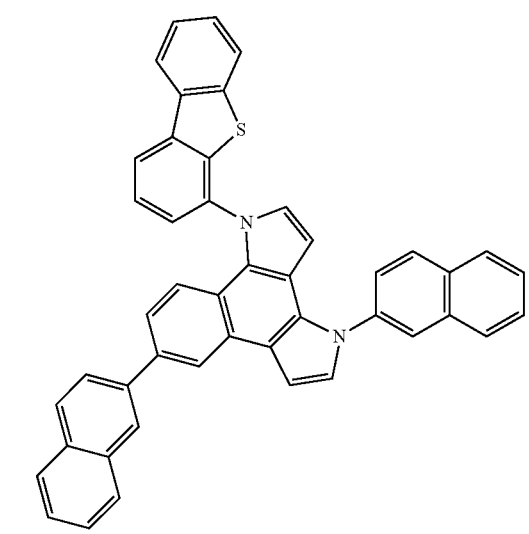
-continued
12
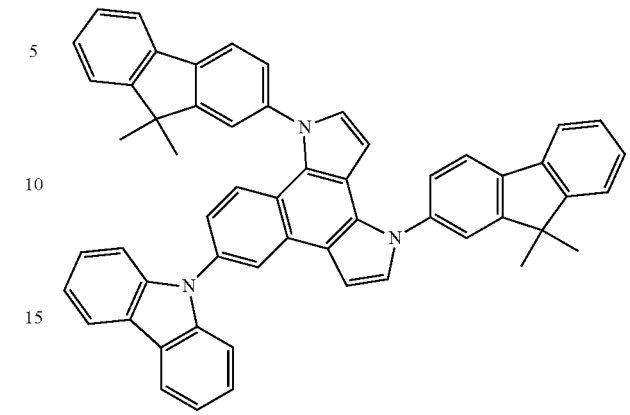
13
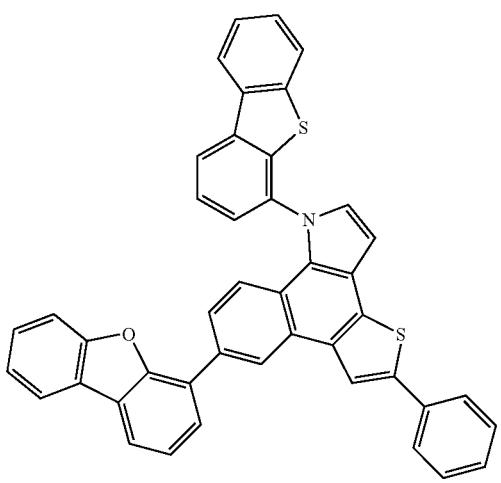
14
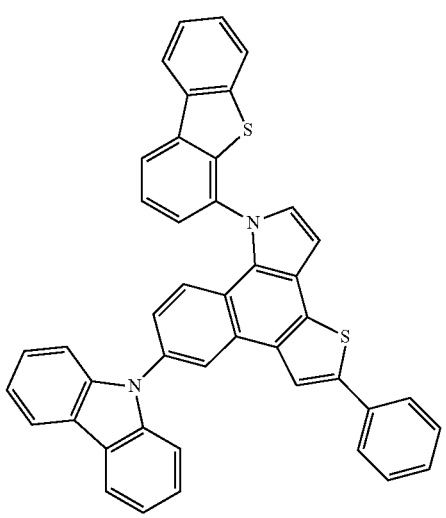

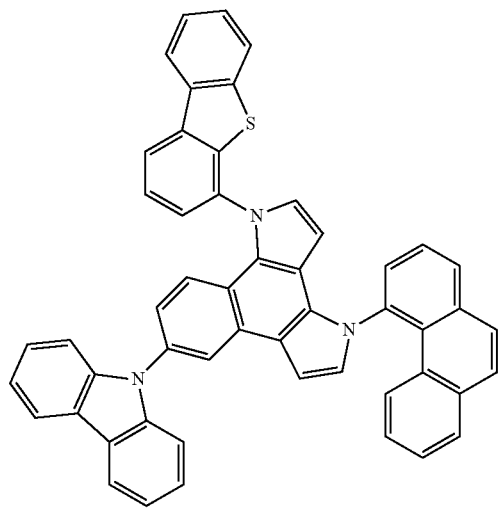
15
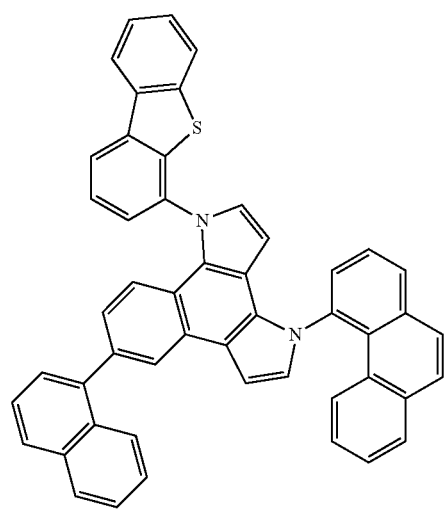
16
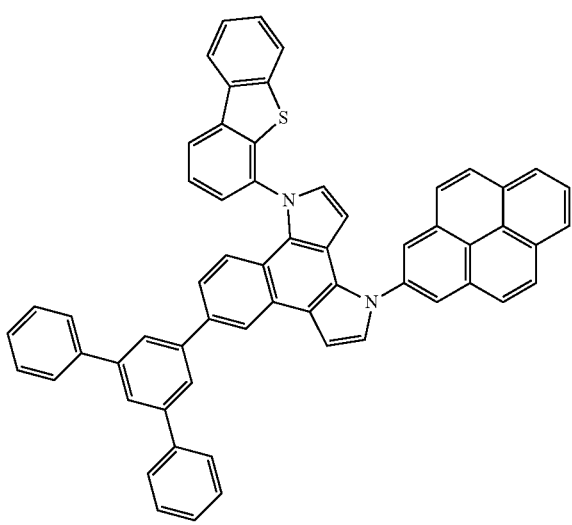
17
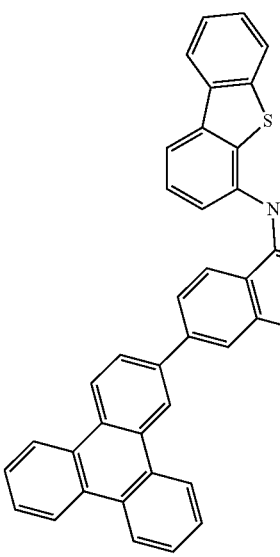
18
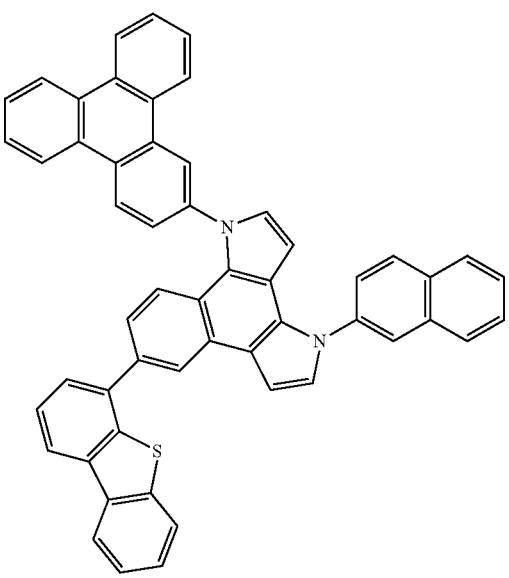
19

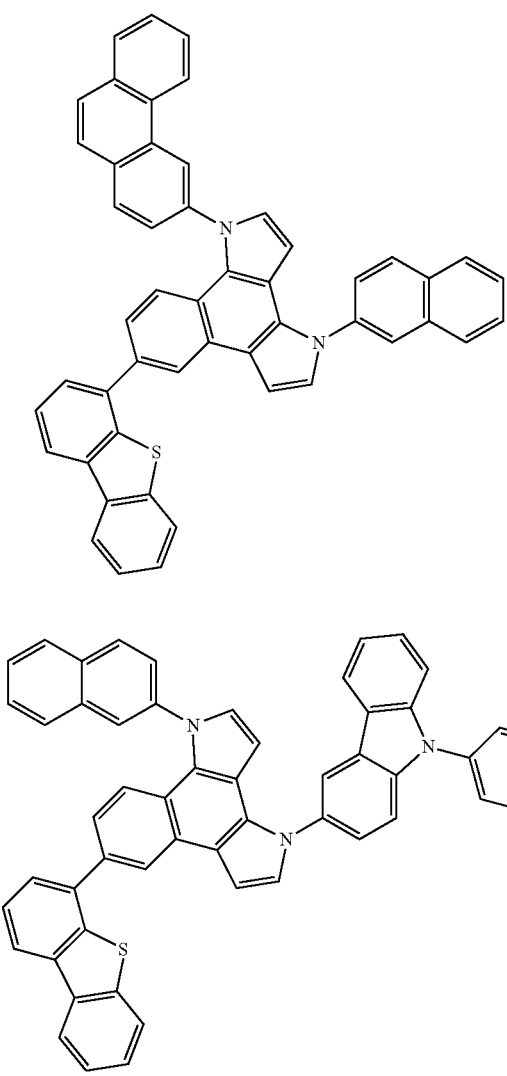
Non-limiting examples of the compound of Formula 2 are Compounds [2-1] to [2-31] below. It will be understood by those of ordinary skill in the art that these compounds may be synthesized using known intermediates and know synthesis methods.
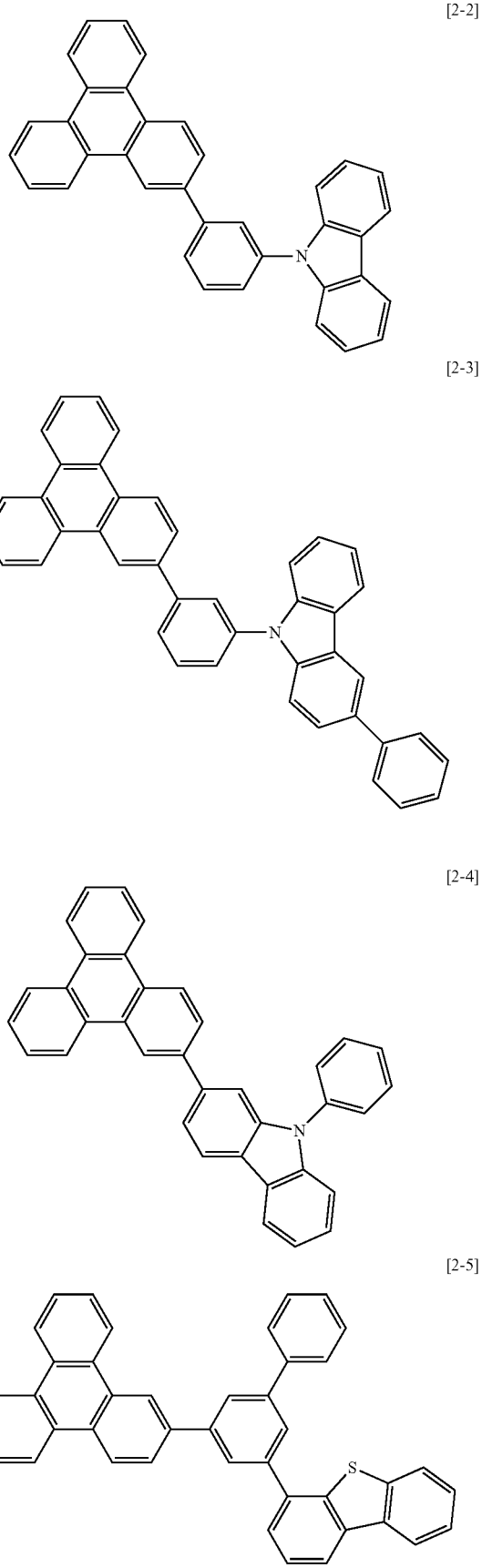

[2-6]
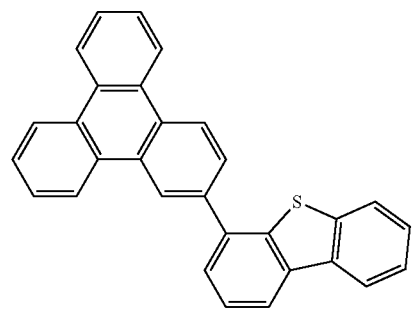
[2-7]
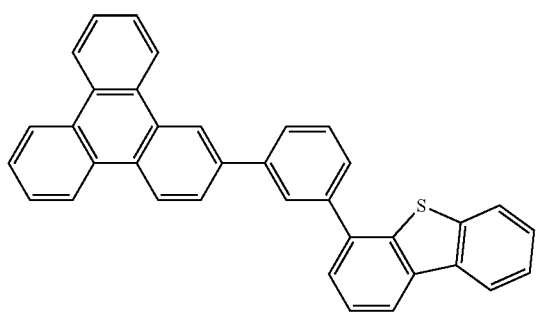
[2-8]
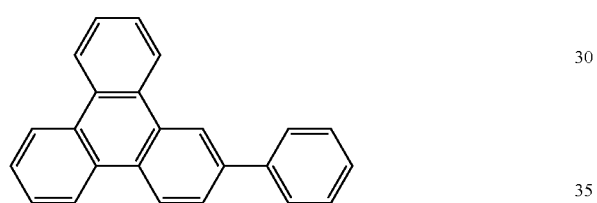
[2-9]
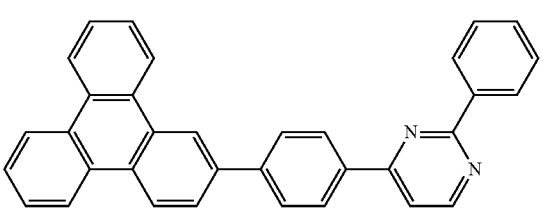
[2-10]
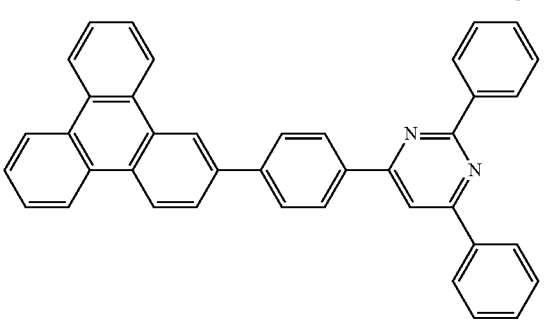
[2-11]
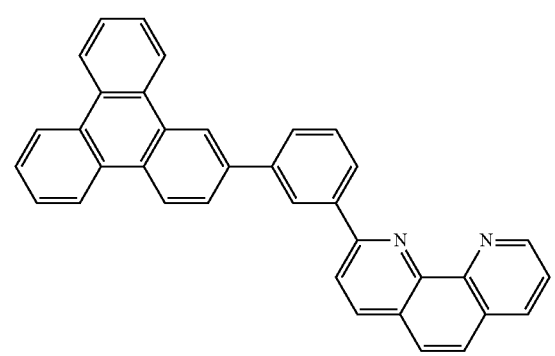
[2-12]
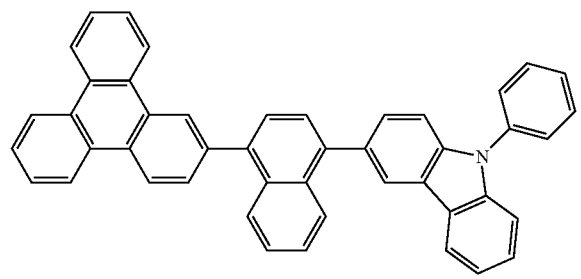
[2-13]
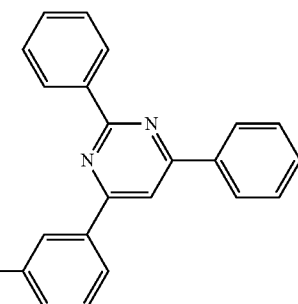
[2-14]
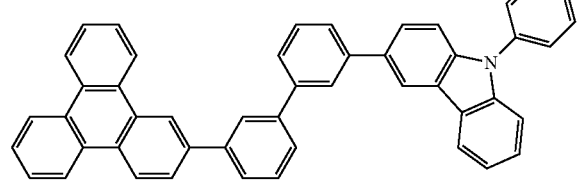

[2-15]
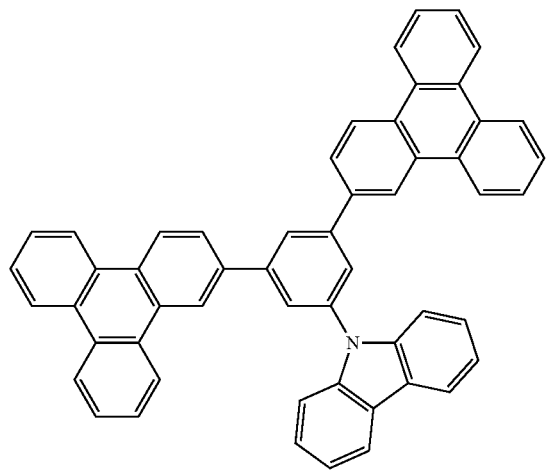
[2-16]
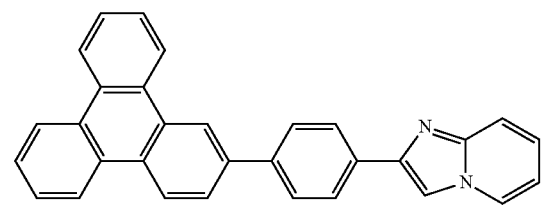
[2-17]
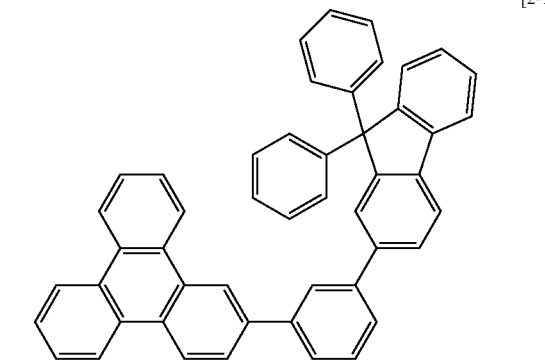
[2-18]
[2-19]
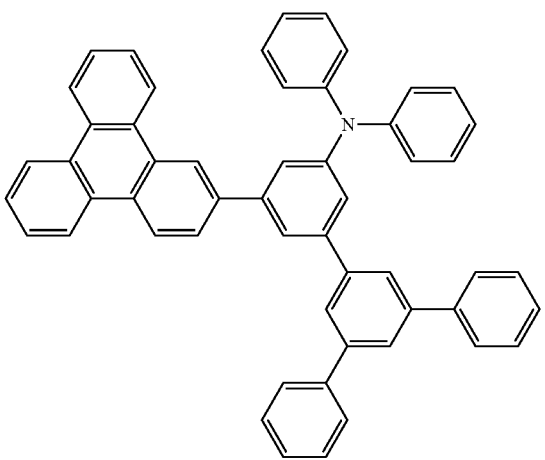
[2-20]
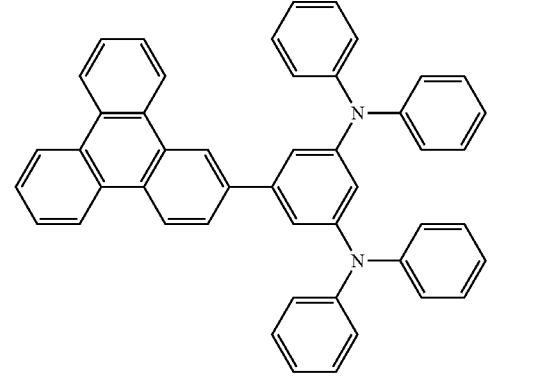
[2-21]
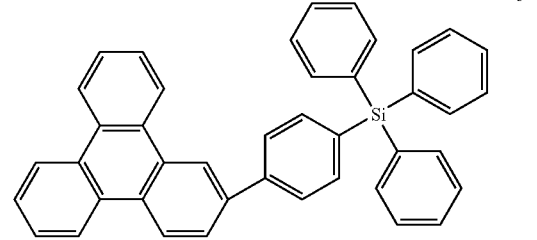
[2-22]
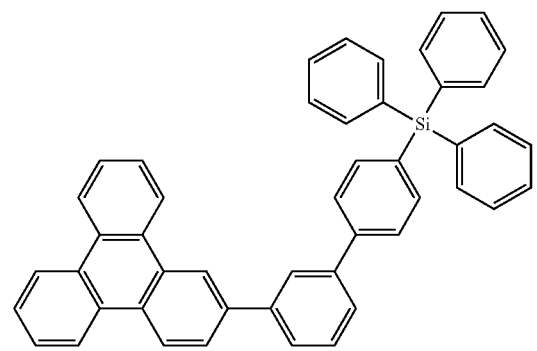

[2-23]
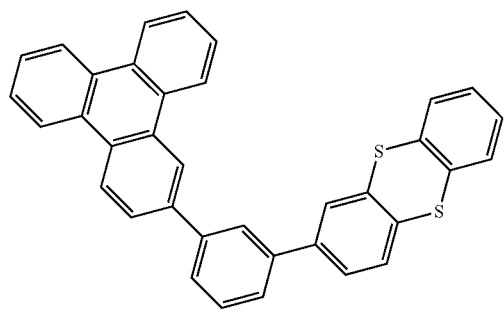
[2-24]
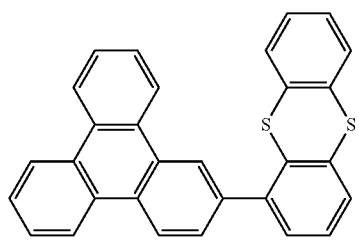
[2-25]
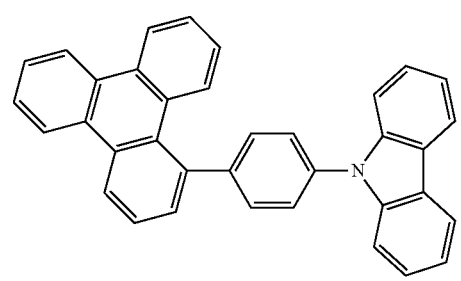
[2-26]
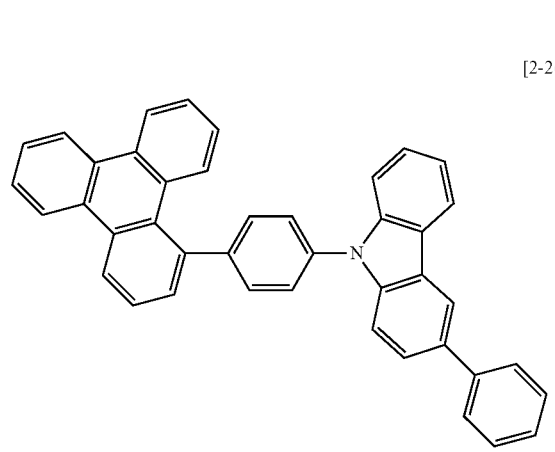
[2-27]
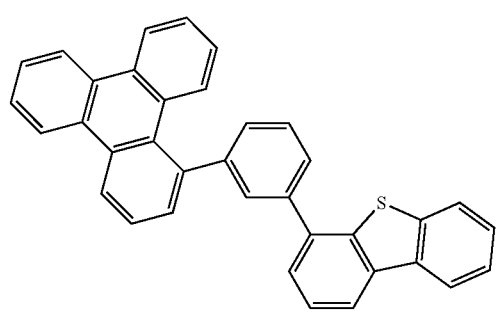
[2-28]
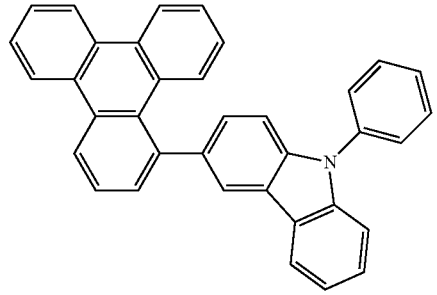
[2-29]
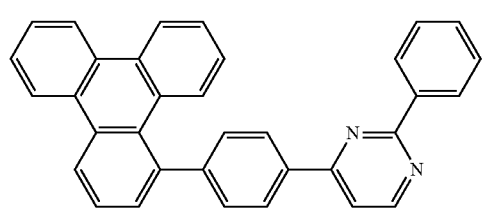
[2-30]
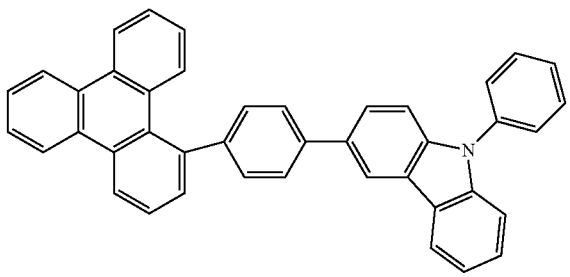
[2-31]
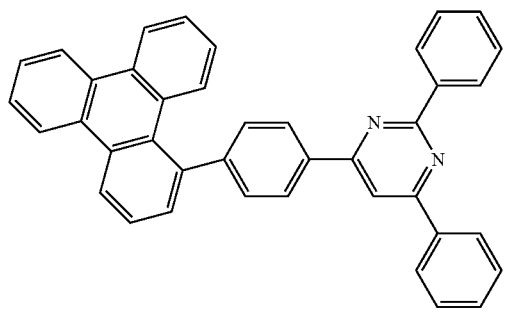
[2-32]
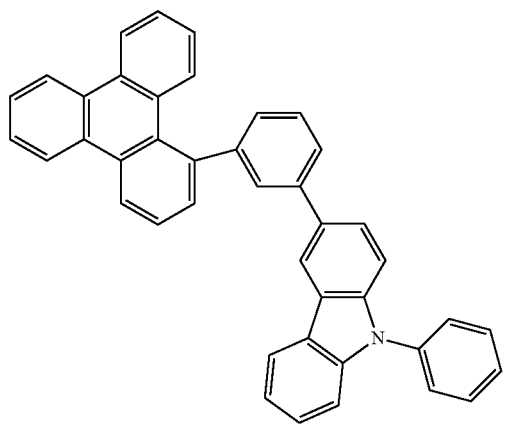
In some embodiments, the organic layer of the organic light-emitting device may include at least one layer selected from among a hole injection layer, a hole transport layer, a functional layer having both hole injection and hole transport capabilities (hereinafter, "H-functional layer"), a buffer layer, an electron blocking layer, an emission layer, a hole blocking layer, an electron transport layer, an electron injection layer, and a functional layer having both electron injection and electron transport capabilities (hereinafter, "E-functional layer").

For example, the organic layer may be used as an emission layer, for example, a phosphorescent green emission layer.

In some embodiments, the organic light-emitting device may include an electron injection layer, an electron transport layer, an emission layer, a hole injection layer, a hole transport layer, or a functional layer having both hole injection and transport capabilities, and the emission layer may include a compound of Formula 1 and a compound of Formula 2 as described in the above-embodiments. In some embodiments, the emission layer may further include an anthracene-based compound, an arylamine-based compound or a styryl-based compound.

In some other embodiments, the organic light-emitting device may include an electron injection layer, an electron transport layer, an emission layer, a hole injection layer, a hole transport layer, or a functional layer having both hole injection and transport capabilities; at least one of a red emission layer, a green emission layer, a blue emission layer, and a white emission layer of the emission layer may include a phosphorescent compound; and at least one of the hole injection layer, the hole transport layer, and the functional layer having both hole injection and hole transport capabilities may include a charge-generating material. In some embodiments, the charge-generating material may be a p-type dopant, and the p-type dopant may be a quinine derivative, a metal oxide or a cyano group-containing compound.

In some embodiments, the organic film may include an electron transport layer, and the electron transport layer may include an electron-transporting organic compound and a metal complex. The metal complex may be a lithium (Li) complex.

The term "organic layer" as used herein refers to a single layer and/or a plurality of layers disposed between the first and second electrodes of the organic light-emitting device.

The FIGURE is a schematic sectional view of an organic light-emitting device according to an embodiment of the present disclosure. Hereinafter, a structure of an organic light-emitting device according to an embodiment of the present disclosure and a method of manufacturing the same will now be described with reference to the FIGURE.

A substrate (not shown) may be any substrate that is used in existing organic light emitting devices. In some embodiments the substrate may be a glass substrate or a transparent plastic substrate with strong mechanical strength, thermal stability, transparency, surface smoothness, ease of handling, and water resistance.

In some embodiments, the first electrode may be formed by depositing or sputtering a first electrode-forming material on the substrate. When the first electrode is an anode, a material having a high work function may be used as the first electrode-forming material to facilitate hole injection. In some embodiments, the first electrode may be a reflective electrode or a transmission electrode. Transparent and conductive materials such as ITO, IZO, $SnO_2$, and ZnO may be used to form the first electrode. In some embodiments, the first electrode may be formed as a reflective electrode using magnesium (Mg), aluminum (Al), aluminum-lithium (Al—Li), calcium (Ca), magnesium-indium (Mg—In), magnesium-silver (Mg—Ag), or the like.

In some embodiments, the first electrode may have a single-layer structure or a multi-layer structure including at least two layers.

For example, the first electrode may have a three-layered structure of ITO/Ag/ITO, but is not limited thereto.

An organic layer(s) is disposed on the first electrode.

In some embodiments, the organic layer may include a hole injection layer (HIL), a hole transport layer (HTL), a buffer layer (not shown), an emission layer (EML), an electron transport layer (ETL), or an electron injection layer (EIL).

In some embodiments, the HIL may be formed on the first electrode by vacuum deposition, spin coating, casting, Langmuir-Blodgett (LB) deposition, or the like.

When the HIL is formed using vacuum deposition, vacuum deposition conditions may vary depending on the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary depending on the compound that is used to form the HIL, and the desired structure and thermal properties of the HIL to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

The HIL may be formed of any material that is commonly used to form a HIL. Non-limiting examples of the material that can be used to form the HIL are N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline)/poly(4-styrenesulfonate (PANI/PSS).

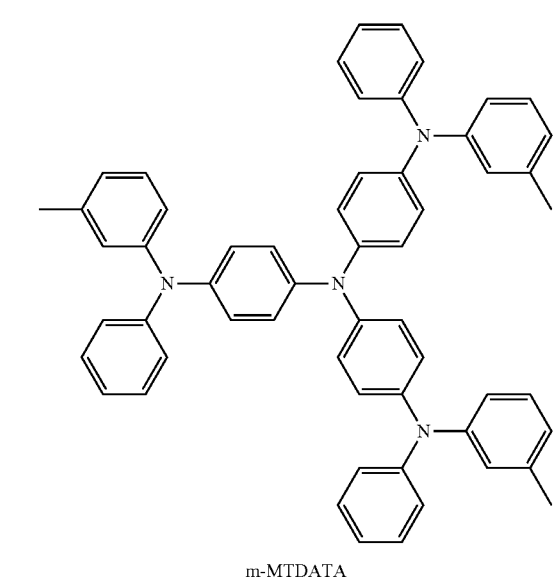

m-MTDATA

-continued

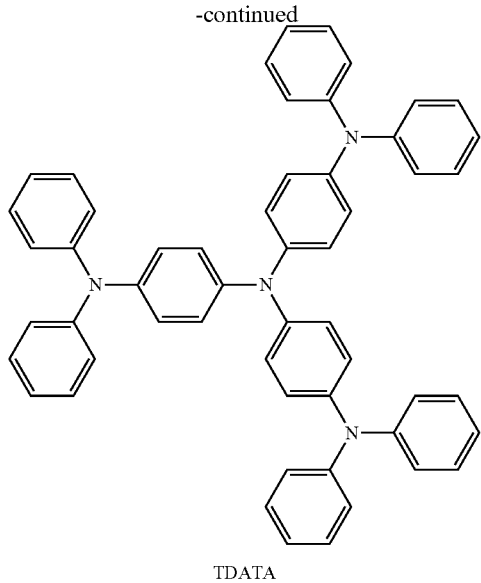

TDATA

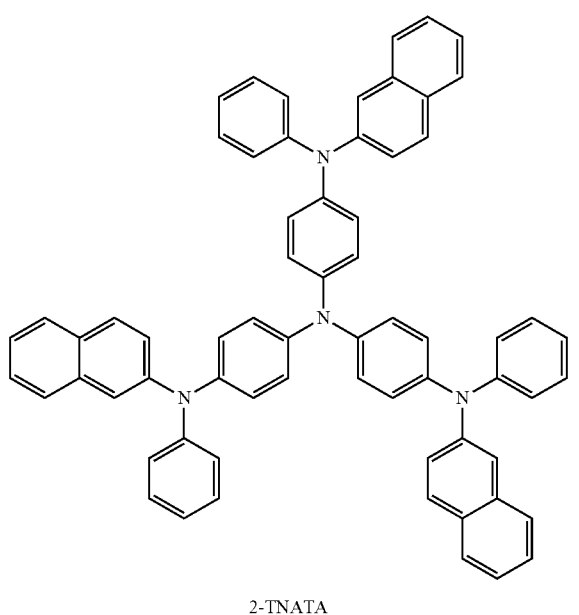

2-TNATA

In some embodiments, the thickness of the HIL may be about 100 Å to about 10000 Å, and in some embodiments, may be from about 100 Å to about 1000 Å. When the thickness of the HIL is within these ranges, the HIL may have good hole injecting ability without a substantial increase in driving voltage.

Then, a HTL may be formed on the HIL by using vacuum deposition, spin coating, casting, Langmuir-Blodgett (LB) deposition, or the like. When the HTL is formed using vacuum deposition or spin coating, the conditions for deposition and coating may be similar to those for the formation of the HIL, though the conditions for the deposition and coating may vary depending on the material that is used to form the HTL.

In some embodiments, the HTL may be formed of any known hole-transporting materials. Non-limiting examples of suitable known HTL forming materials are carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine) (NPB).

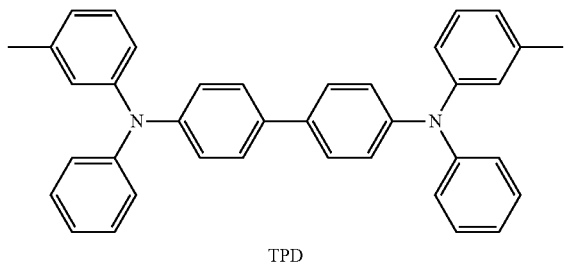

TPD

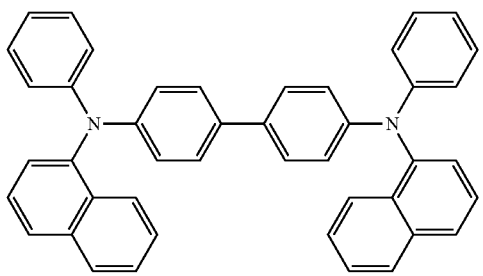

NPB

In some embodiments, the thickness of the HTL may be from about 50 Å to about 2000 Å, and in some embodiments, may be from about 100 Å to about 1500 Å. When the thickness of the HTL is within these ranges, the HTL may have good hole transporting ability without a substantial increase in driving voltage.

In some embodiments, the H-functional layer (having both hole injection and hole transport capabilities) may contain at least one material from each group of the hole injection layer materials and hole transport layer materials. In some embodiments, the thickness of the H-functional layer may be from about 500 Å to about 10,000 Å, and in some embodiments, may be from about 100 Å to about 1,000 Å. When the thickness of the H-functional layer is within these ranges, the H-functional layer may have good hole injection and transport capabilities without a substantial increase in driving voltage.

In some embodiments, at least one of the HIL, HTL, and H-functional layer may include at least one of a compound of Formula 300 below and a compound of Formula 350 below:

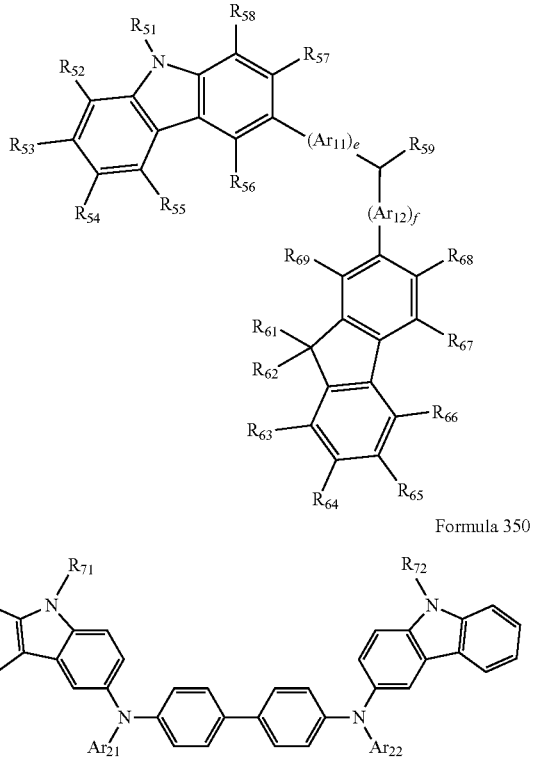

Formula 300

Formula 350 wherein in Formulae 300 and 350, $Ar_{11}$, $Ar_{11}$, $Ar_2$, and $Ar_{22}$ may be each independently a substituted or unsubstituted $C_5$-$C_{60}$ arylene group.

In Formula 300, e and f may be each independently an integer from 0 to 5, for example, may be 0, 1, or 2. For example, e may be 1, and f may be 0, but not limited thereto.

In Formulae 300 and 350, $R_{51}$ to $R_{58}$, $R_{61}$ to $R_{69}$, and $R_{71}$ and $R_{72}$ may be each independently a hydrogen, a deuterium, a halogen, a hydroxyl group, a cyano group, a nitro group, an amino group, an amidino group, a hydrazine group, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group. In some embodiments, $R_{51}$ to $R_{58}$, $R_{61}$ to $R_{69}$, $R_{71}$, and $R_{72}$ may be each independently one of a hydrogen; a deuterium; a halogen; a hydroxyl group; a cyano group; a nitro group; an amino group; an amidino group; a hydrazine; a hydrazone; a carboxyl group or a salt thereof; a sulfonic acid group or a salt thereof; a phosphoric acid group or a salt thereof; a $C_1$-$C_{10}$ alkyl group (for example, a methyl group, an ethyl group, a propyl group, a butyl group, a pentyl group, a hexyl group, or the like); a $C_1$-$C_{10}$ alkoxy group (for example, a methoxy group, an ethoxy group, a propoxy group, a butoxy group, a pentoxy group, or the like); a $C_1$-$C_{10}$ alkyl group and a $C_1$-$C_{10}$ alkoxy group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group; a naphthyl group; an anthryl group; a fluorenyl group; a pyrenyl group; and a phenyl group, a naphthyl group, an anthryl group, a fluorenyl group, and a pyrenyl group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group.

In some embodiments of Formula 300, $R_{109}$ may be one of a phenyl group, a naphthyl group, an anthryl group, a biphenyl group, a pyridyl group; and a phenyl group, a naphthyl group, an anthryl group, a biphenyl group, and a pyridyl group that are substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

In an embodiment the compound of Formula 300 may be a compound represented by Formula 300 Å below:

Formula 300A

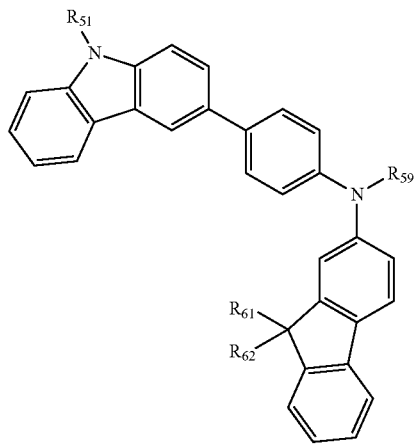

In Formula 300 Å, $R_{51}$, $R_{61}$, $R_{62}$, and $R_{59}$ may be as defined above.

In some non-limiting embodiments, at least one of the HIL, HTL, and H-functional layer may include at least one of compounds represented by Formulae 301 to 320 below:

301

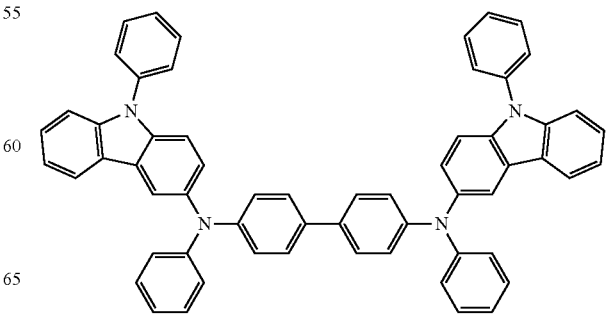

-continued
302
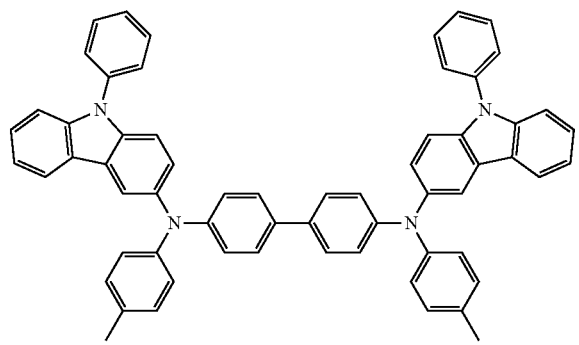
303
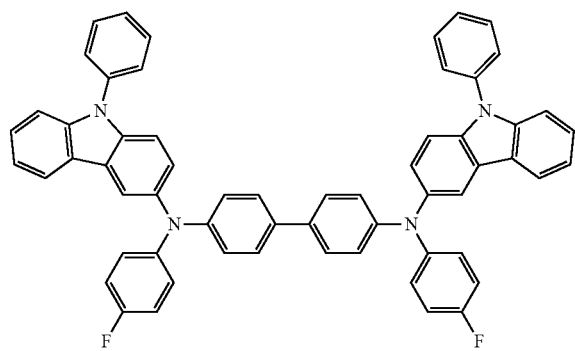
304
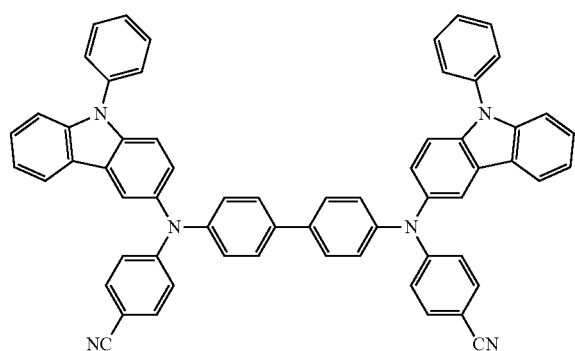
305
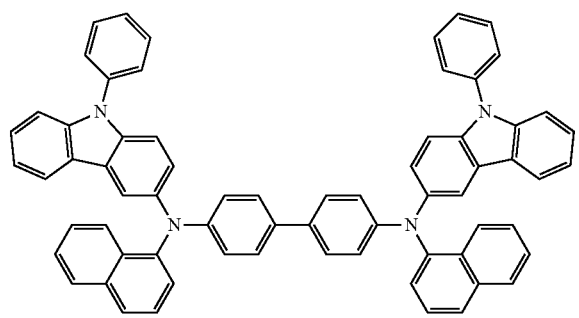
-continued
306
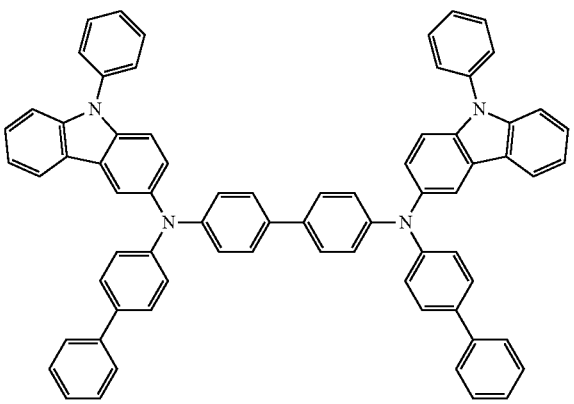
307
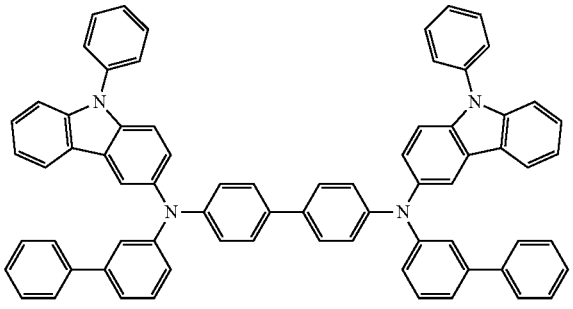
308
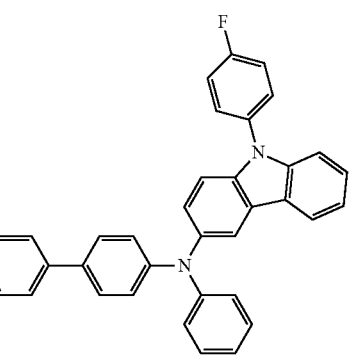
309
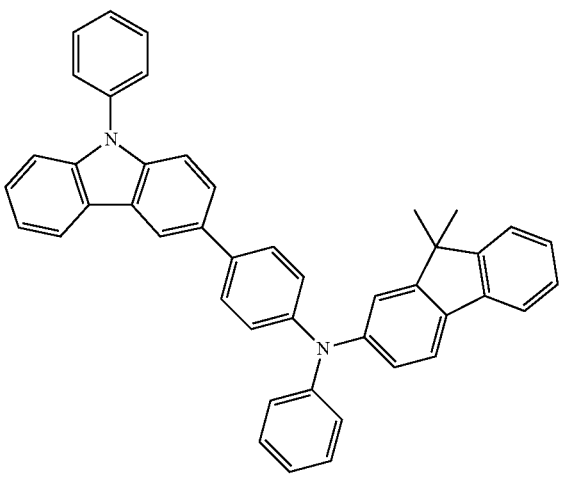

310
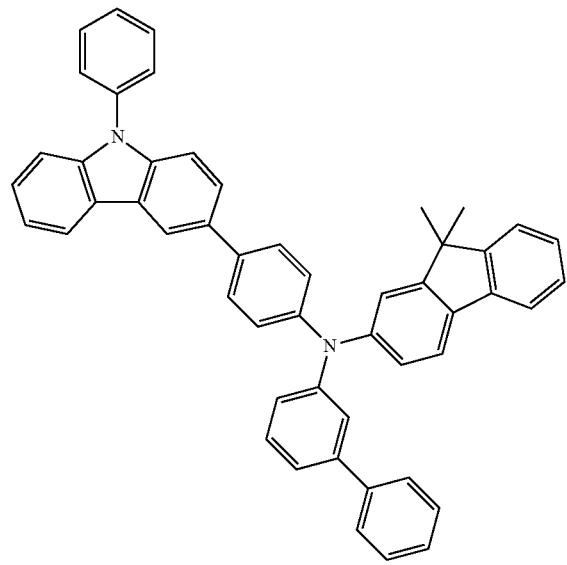
311
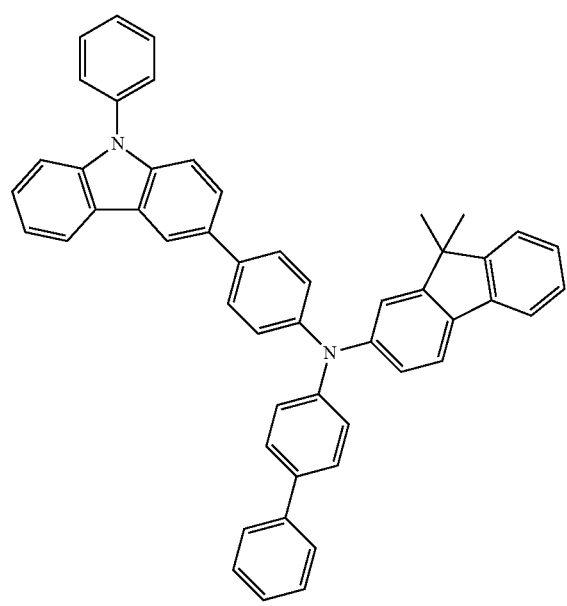
312
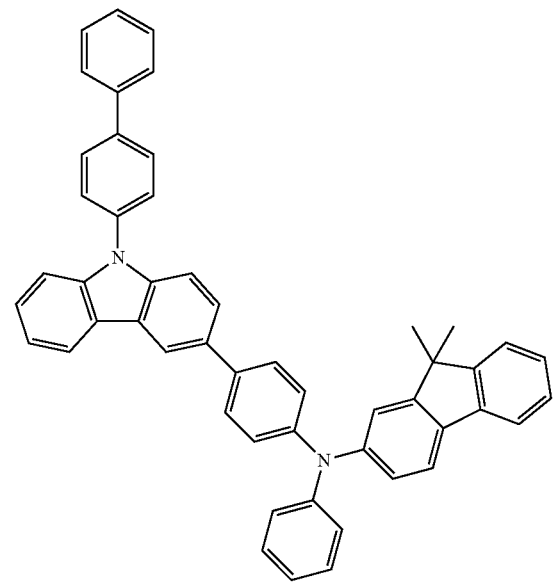
313
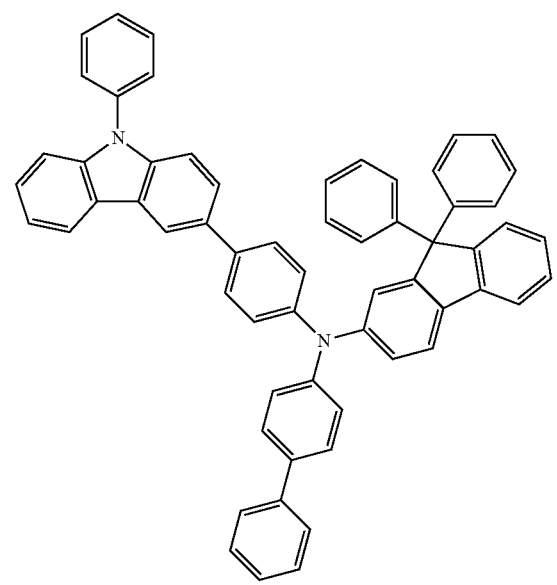

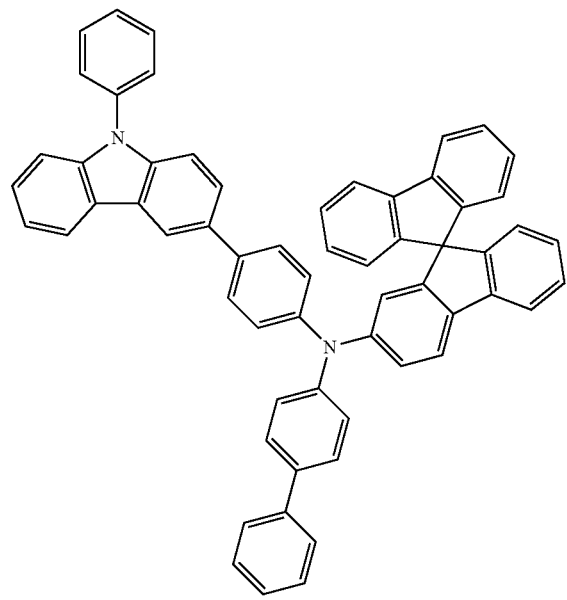
314
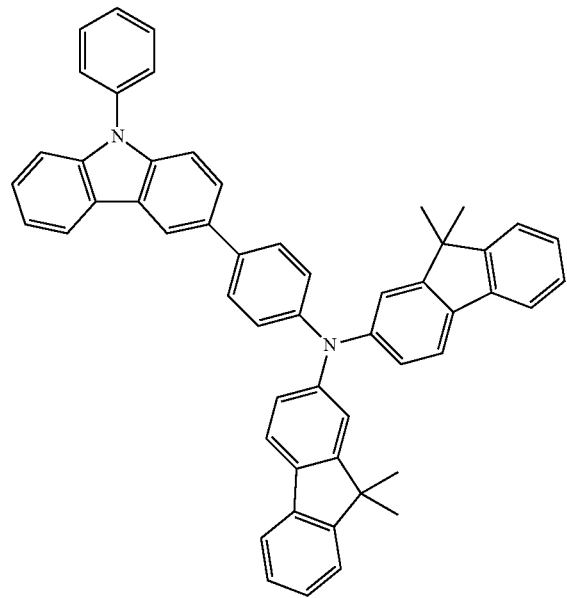
315
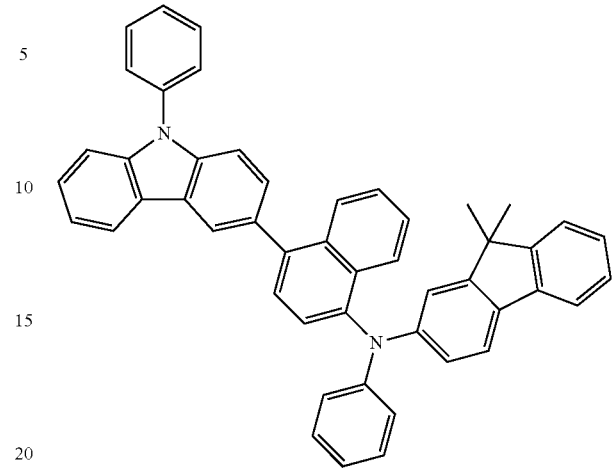
316
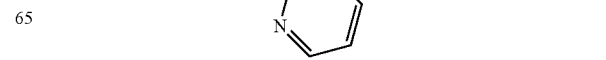

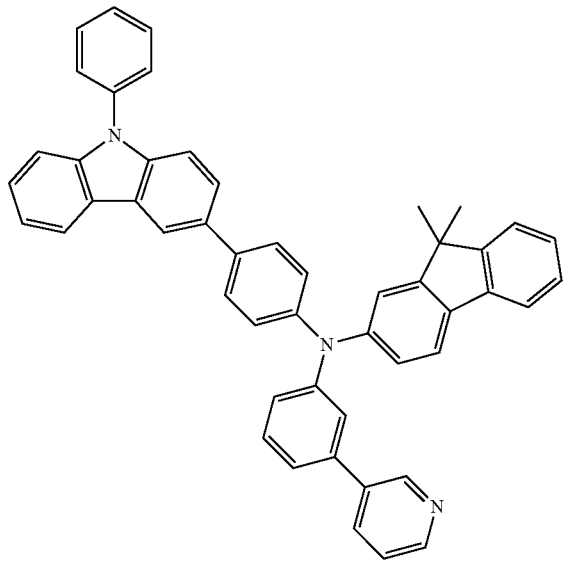

319

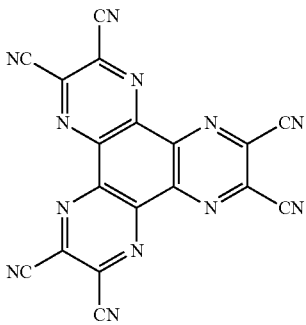

Compound 200

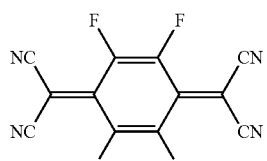

F4-TCNQ

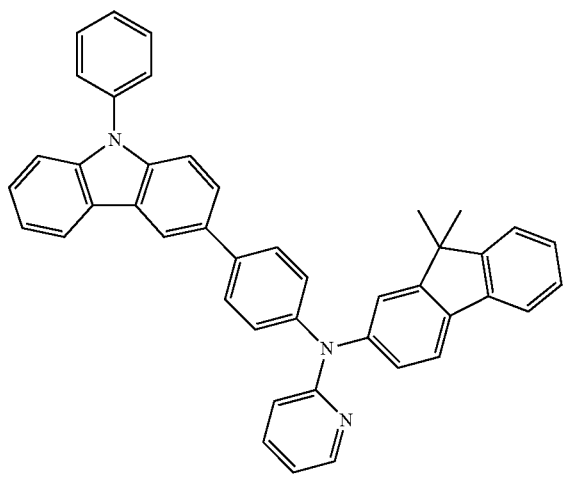

320

In some embodiments, at least one of the HIL, HTL, and H-functional layer may further include a charge-generating material for improving conductivity of the layer, in addition to a known hole injecting material, hole transport material, and/or material having both hole injection and hole transport capabilities as described above.

In some embodiments, the charge-generating material may be, for example, a p-dopant. The p-dopant may be one of quinone derivatives, metal oxides, or compounds with a cyano group, but are not limited thereto. Non-limiting examples of the p-dopant are quinone derivatives such as tetracyanoquinonedimethane (TCNQ), 2,3,5,6-tetrafluoro-tetracyano-1,4-benzoquinonedimethane (F4-TCNQ), and the like; metal oxides such as tungsten oxide, molybdenum oxide, and the like; and cyano-containing compounds such as Compound 200 below.

When the hole injection layer, hole transport layer, or H-functional layer further includes a charge-generating material, the charge-generating material may be homogeneously dispersed or inhomogeneously distributed in the layer.

In some embodiments, a buffer layer may be disposed between at least one of the HIL, HTL, and H-functional layer, and the EML. In some embodiments, the buffer layer may compensate for an optical resonance distance of light according to a wavelength of the light emitted from the EML, and thus may increase efficiency. In some embodiments, the buffer layer may include any hole injecting material or hole transporting material that are widely known. In some other embodiments, the buffer layer may include the same material as one of the materials included in the HIL, HTL, and H-functional layer that underly the buffer layer.

Then, an EML may be formed on the HTL, H-functional layer, or buffer layer by vacuum deposition, spin coating, casting, Langmuir-Blodget (LB) deposition, or the like. When the EML is formed using vacuum deposition or spin coating, the deposition and coating conditions may be similar to those for the formation of the HIL, though the conditions for deposition and coating may vary depending on the material that is used to form the EML.

In some embodiments, the EML may be formed using the compounds of Formulae 1 and 2 above, or any of a variety of known light-emitting materials, such as known hosts and dopants. Dopants that may be used to form the EML may include either a fluorescent dopant or a phosphorescent dopant which are widely known in the art.

Non-limiting examples of the known host are $Alq_3$, 4,4'-N,N'-dicarbazole-biphenyl (CBP), poly(n-vinylcarbazole) (PVK), 9,10-di(naphthalene-2-yl)anthracene (DNA), TCTA, 1,3,5-tris(N-phenylbenzimidazole-2-yl)benzene (TPBI), 3-tert-butyl-9,10-di-2-naphthylanthracene (TBADN), E3, distyrylarylene (DSA), dmCBP (see a formula below), and Compounds 501 to 509 below.

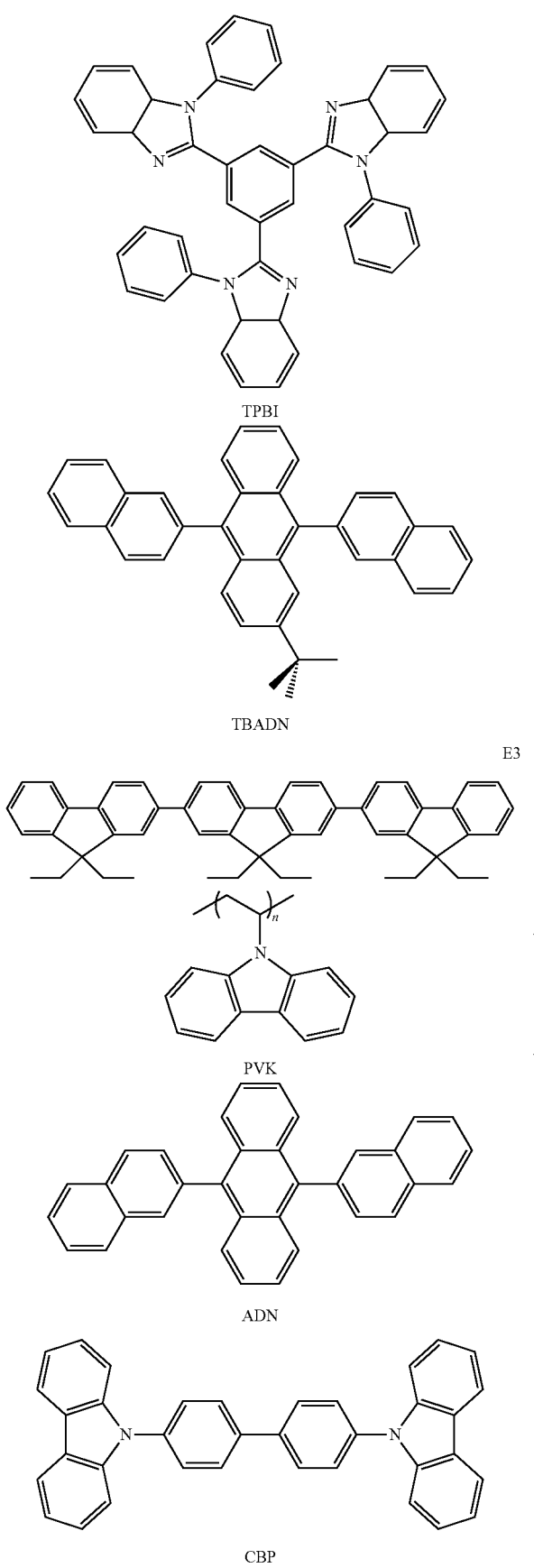
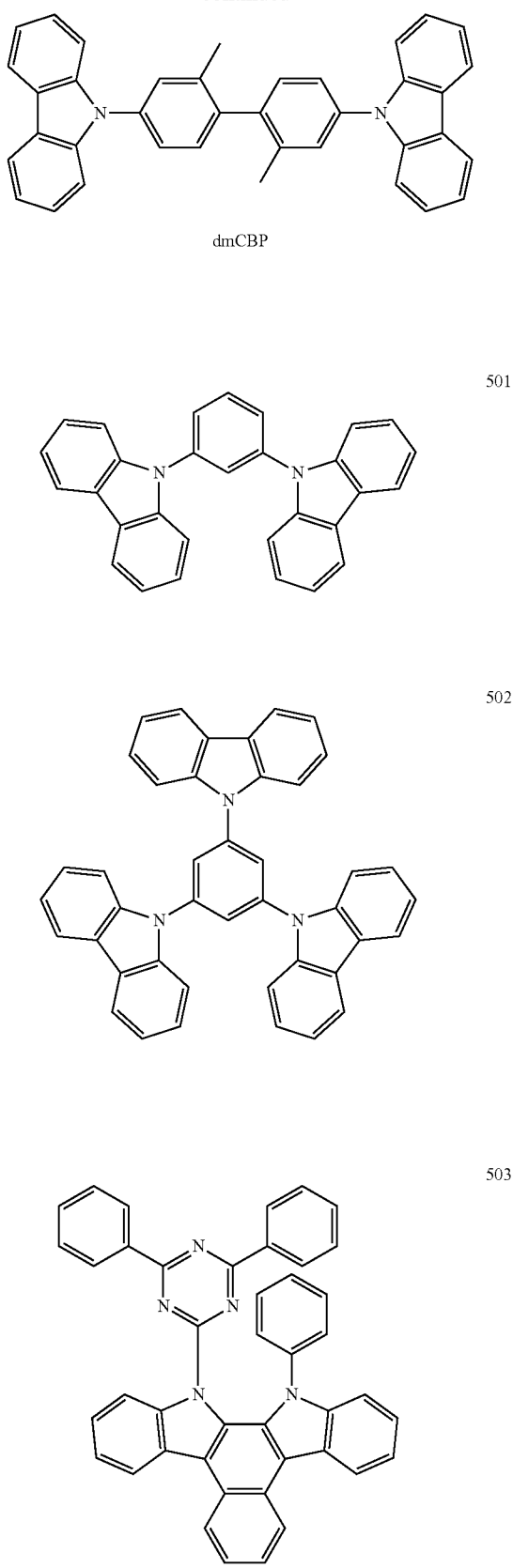

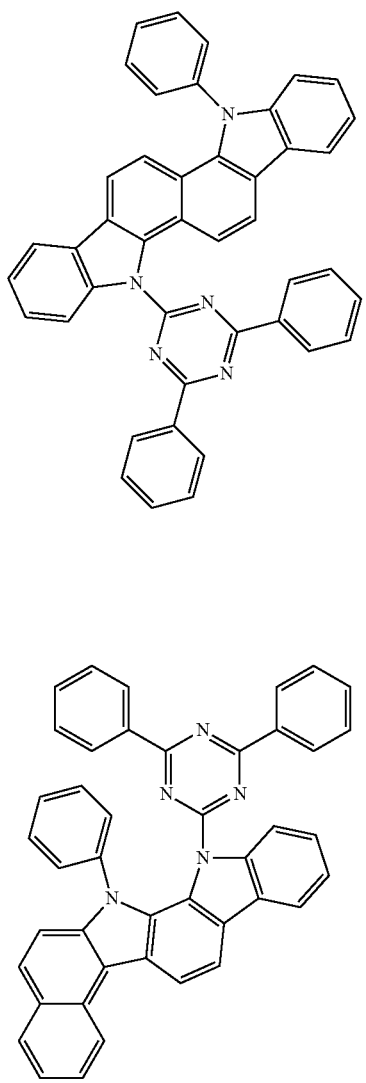

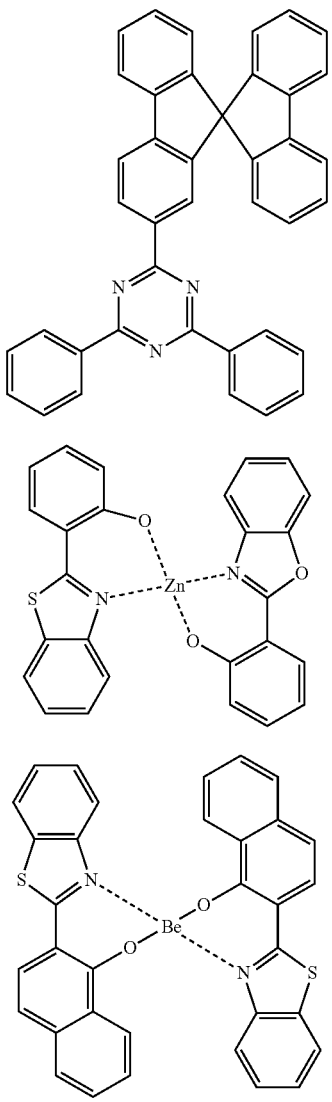

In some embodiments, an anthracene-based compound represented by Formula 400 below may be used as the host.

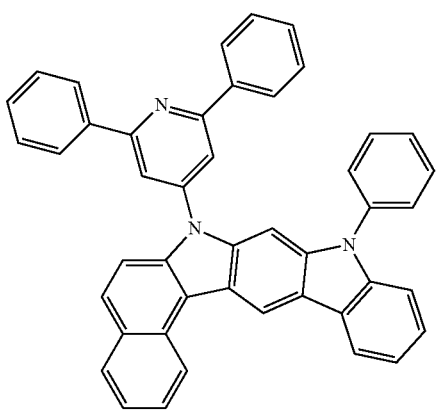

Formula 400 wherein in Formula 400, $Ar_{111}$ and $Ar_{112}$ are each independently a substituted or unsubstituted $C_6$-$C_{60}$ arylene group; $Ar_{113}$ to $Ar_{116}$ are each independently a substituted or unsubstituted $C_1$-$C_{10}$ alkyl group, or a substituted or unsubstituted $C_5$-$C_{60}$ aryl group; and g, h, I, and j are each independently an integer from 0 to 4.

In some embodiments, $Ar_{111}$ and $Ar_{112}$ in Formula 400 may be each independently a phenylene group, a naphthylene group, a phenanthrenylene group, or a pyrenylene group; or a phenylene group, a naphthylene group, a phenanthrenylene group, a fluorenyl group, or a pyrenylene group that are substituted with at least one of a phenyl group, a naphthyl group, and an anthryl group.

In Formula 400 above, g, h, I, and j may be each independently 0, 1, or 2.

In some embodiments, $Ar_{113}$ to $Ar_{116}$ in Formula 400 may be each independently one of a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group, each substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group, and

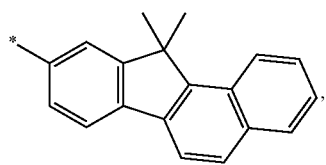 [SMILES: *c1ccc2c(c1)C(C)(C)c1c-2ccc2ccccc12]

but are not limited thereto.

For example, the anthracene-based compound of Formula 400 above may be one of the compounds represented by the following formulae, but is not limited thereto:

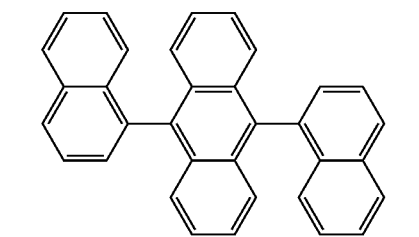

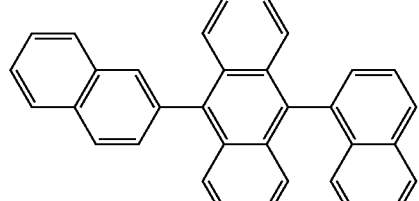

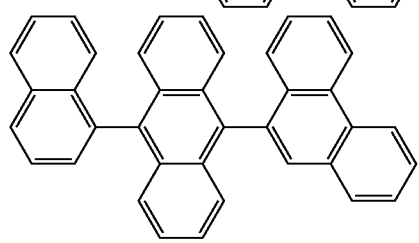

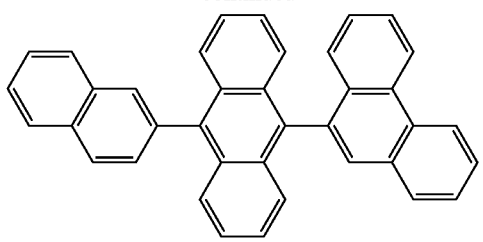

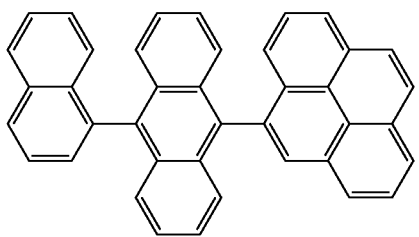

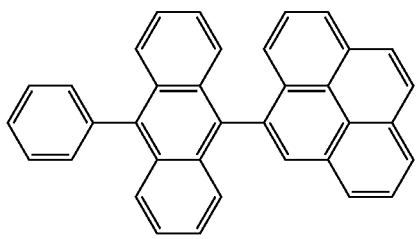

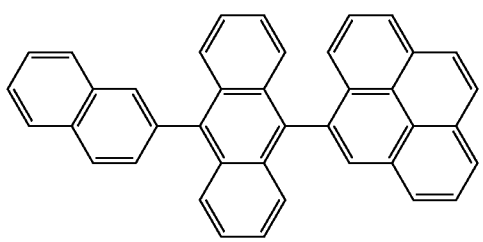

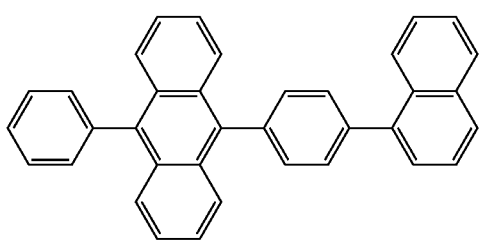

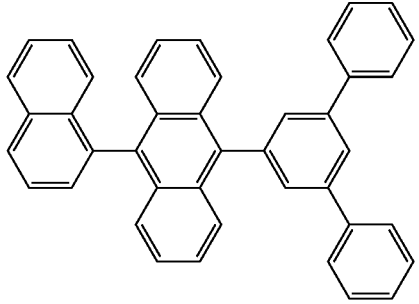

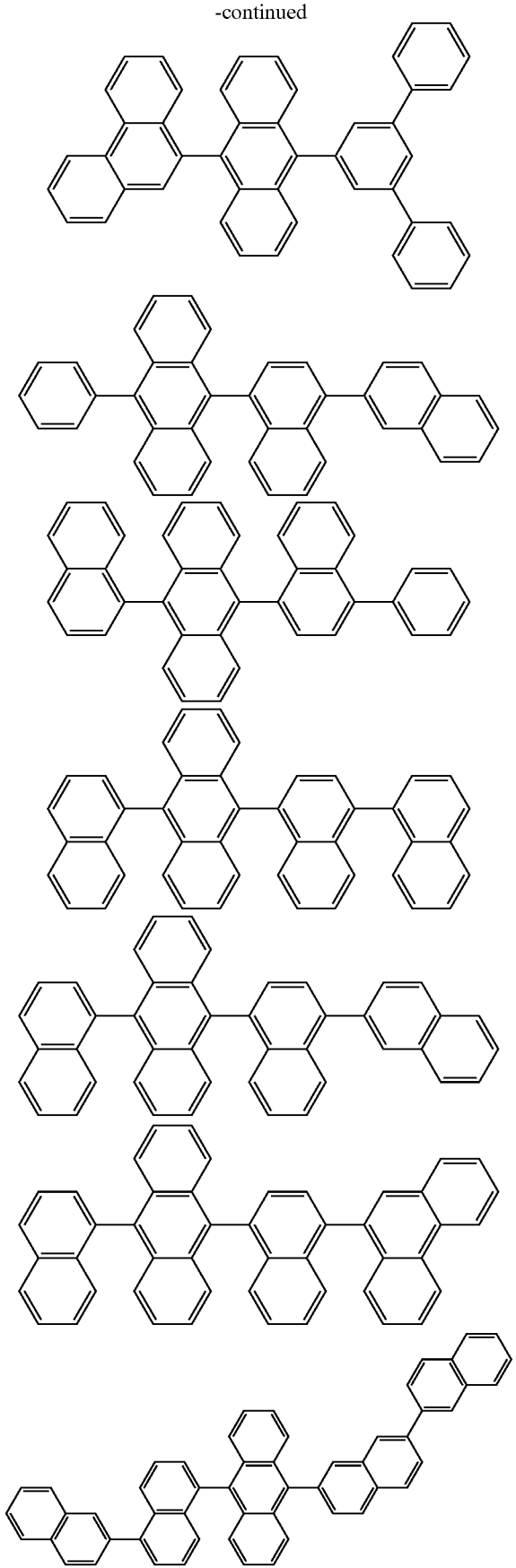
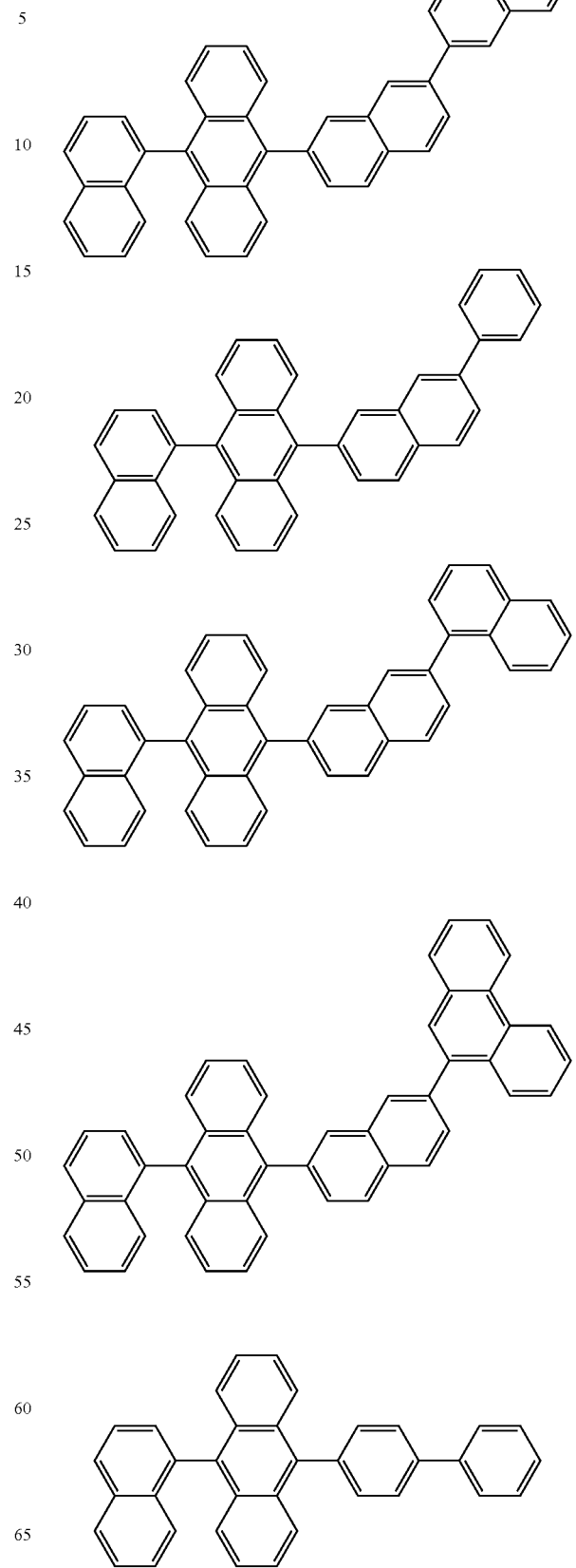

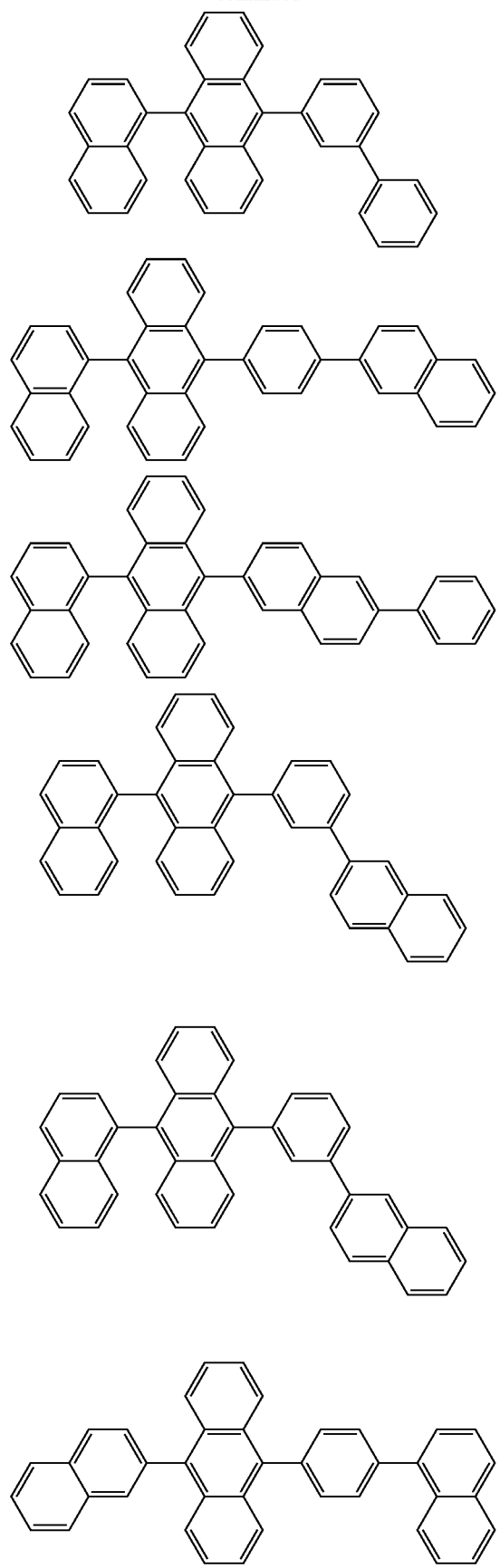
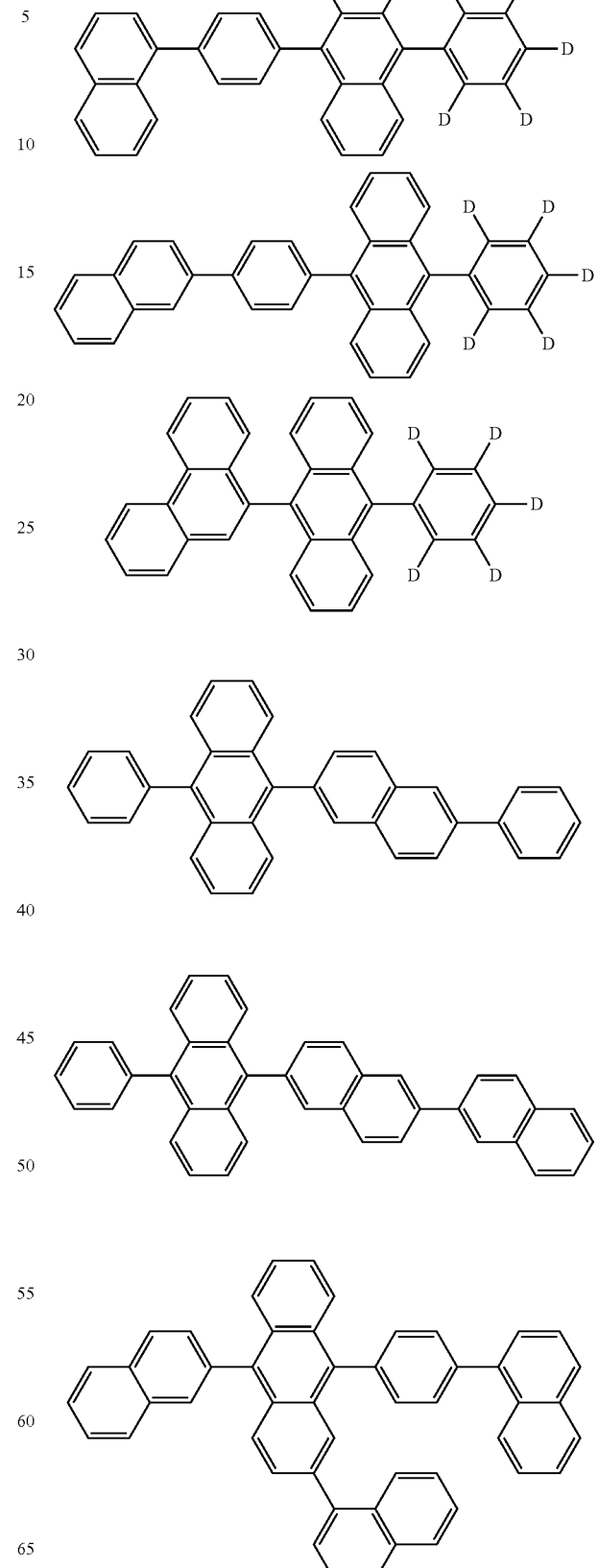

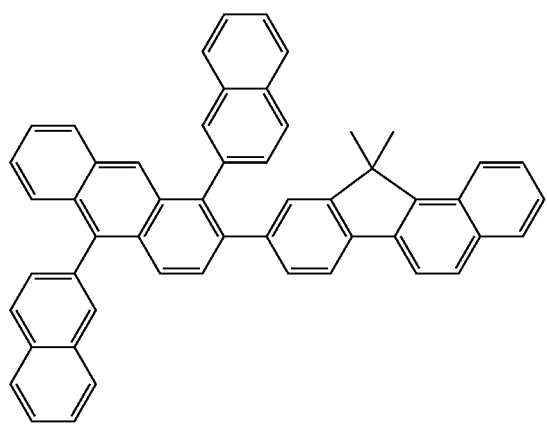

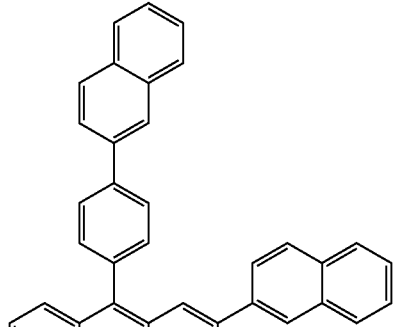

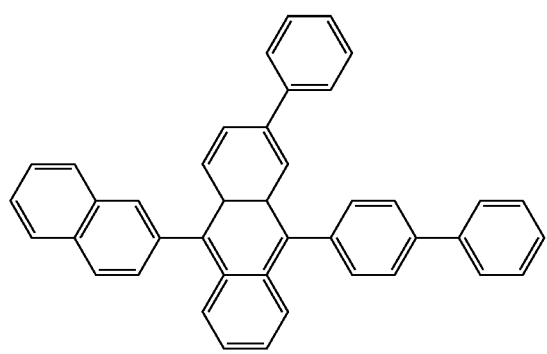

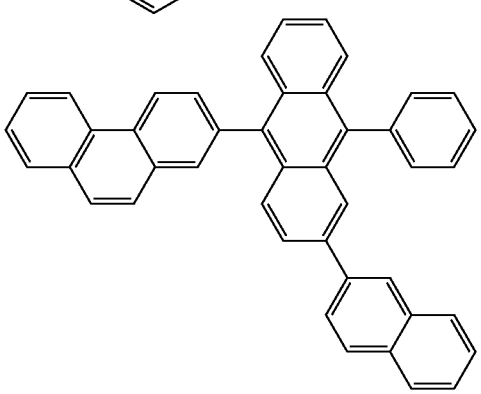

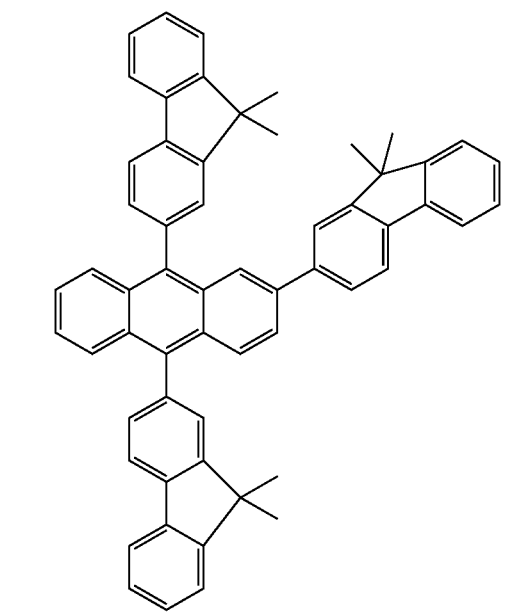

In some embodiments, an anthracene-based compound represented by Formula 401 below may be used as the host.

Formula 401

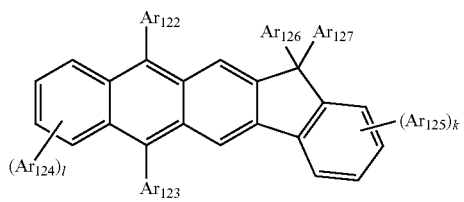

$Ar_{122}$ to $Ar_{125}$ in Formula 401 above may be defined as described above in conjunction with $Ar_{113}$ of Formula 400, and thus detailed descriptions thereof will not be provided here.

$Ar_{126}$ and $Ar_{127}$ in Formula 401 above may be each independently a $C_1$-$C_{10}$ alkyl group, for example, a methyl group, an ethyl group, or a propyl group.

In Formula 401, k and l may be each independently an integer from 0 to 4, for example, 0, 1, or 2.

For example, the anthracene compound of Formula 401 above may be one of the compounds represented by the following formulae, but is not limited thereto:

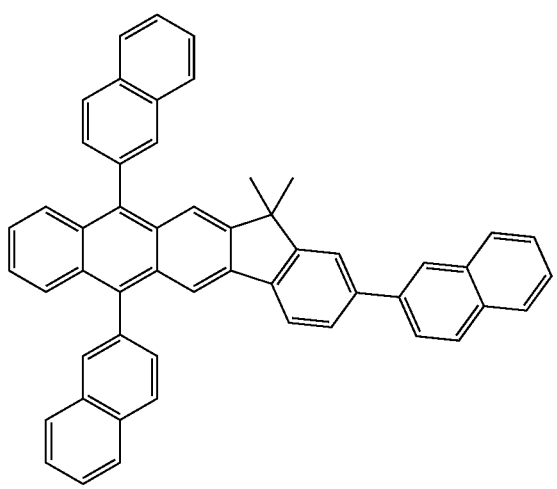
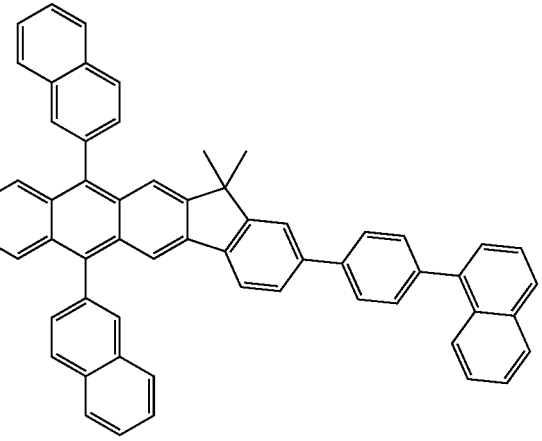
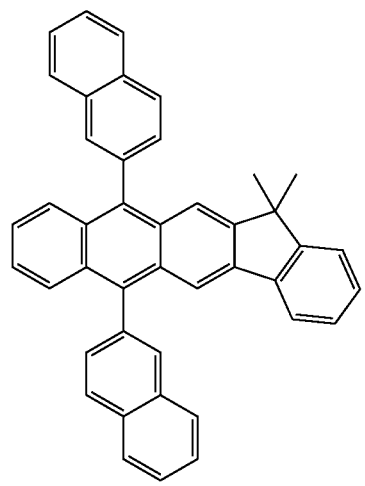

When the organic light-emitting device is a full color organic light-emitting device, the emission layer may be patterned into a red emission layer, a green emission layer, and a blue emission layer.

In some embodiments, at least one of the red EML, the green EML, and the blue EML may include a dopant below (ppy=phenylpyridine).

Non-limiting examples of the blue dopant are compounds represented by the following formulae.

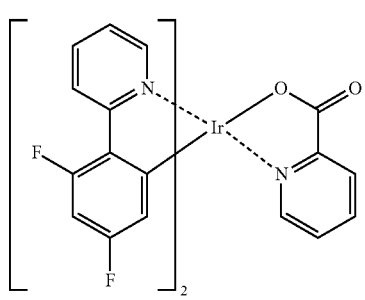

F₂Irpic

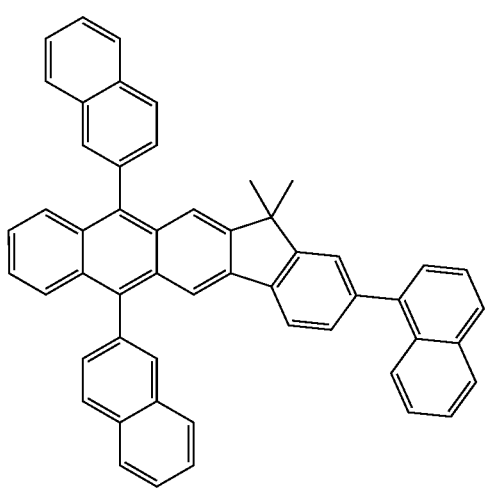
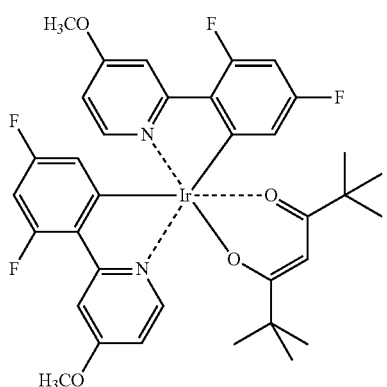

(F₂ppy)₂Ir(tmd)

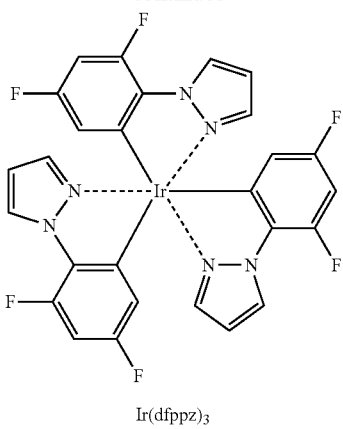
Ir(dfppz)₃
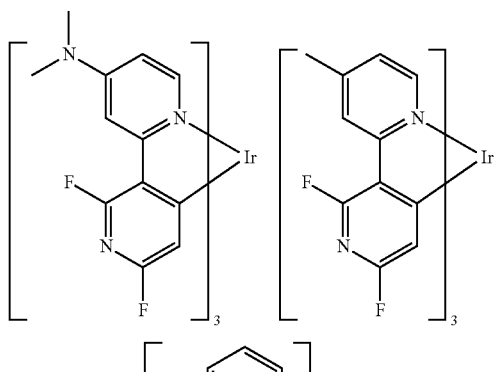
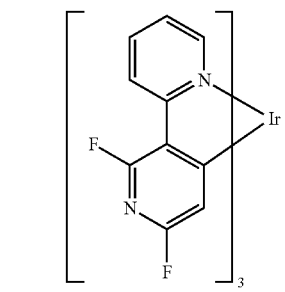
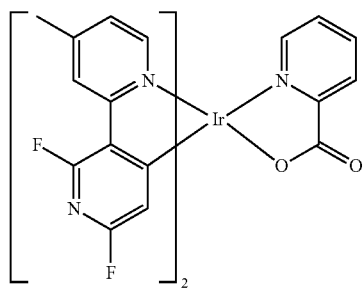
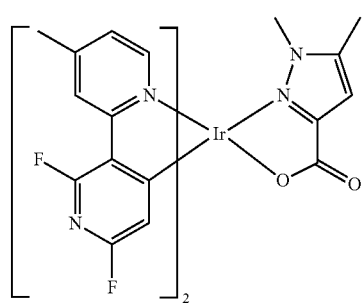
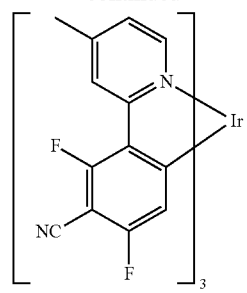
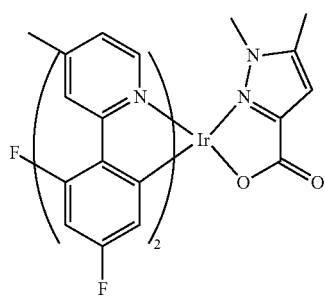
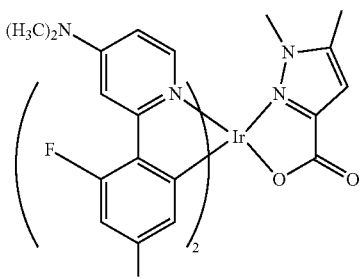
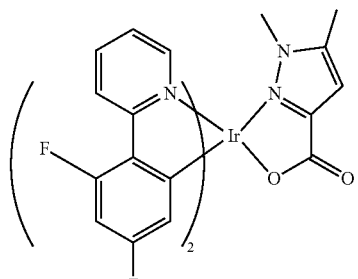
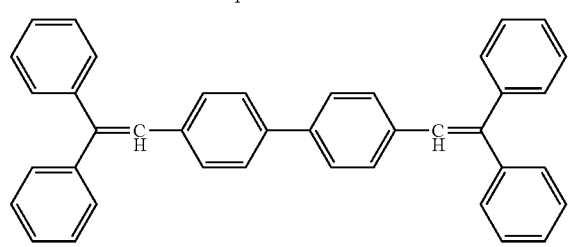
DPVBi
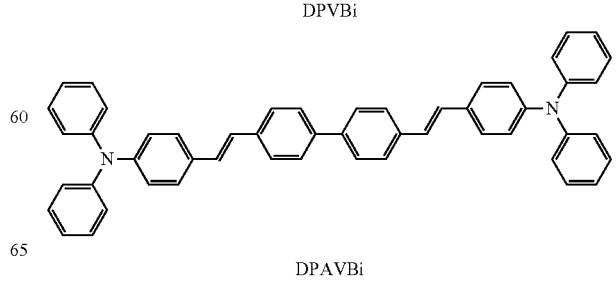
DPAVBi

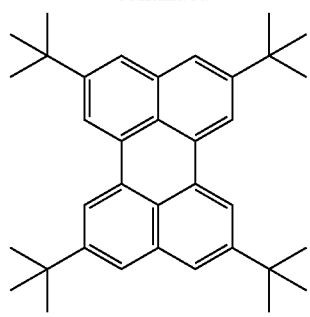
TBPe
Non-limiting examples of the red dopant are compounds represented by the following formulae.
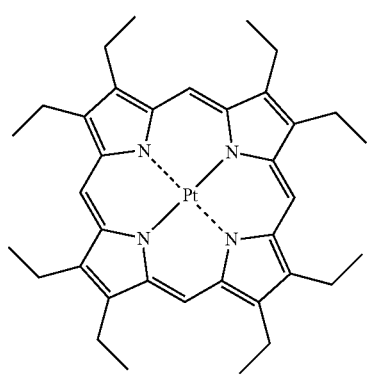
PtOEP
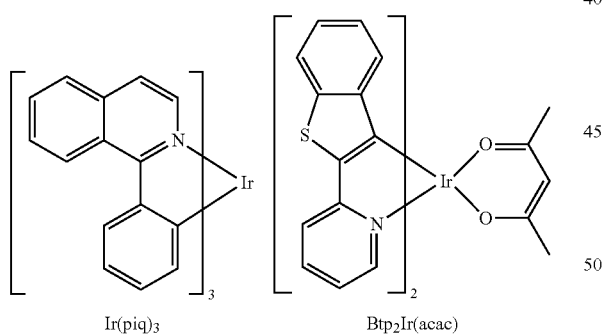
Ir(piq)₃          Btp₂Ir(acac)
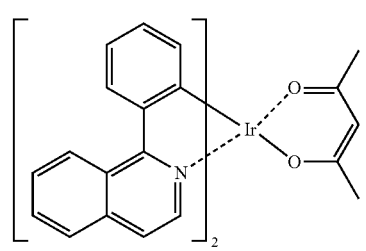
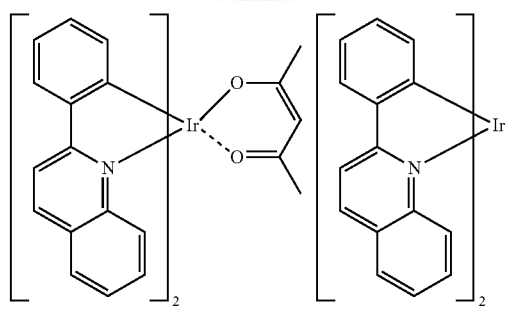
Ir(pq)₂(acac)          Ir(2-phq)₃
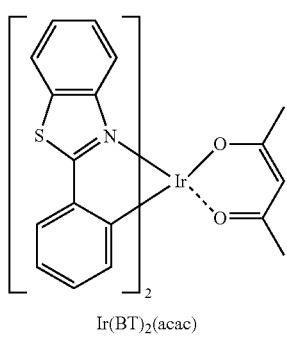
Ir(BT)₂(acac)
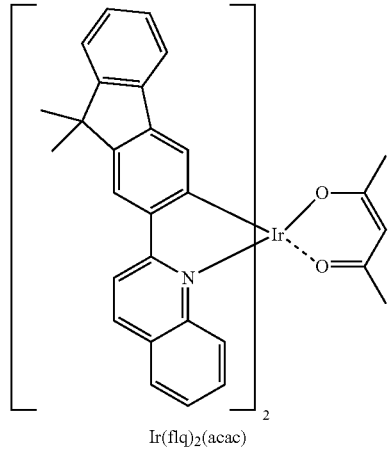
Ir(flq)₂(acac)
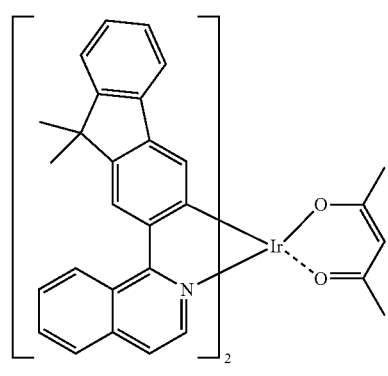
Ir(fliq)₂(acac)

-continued
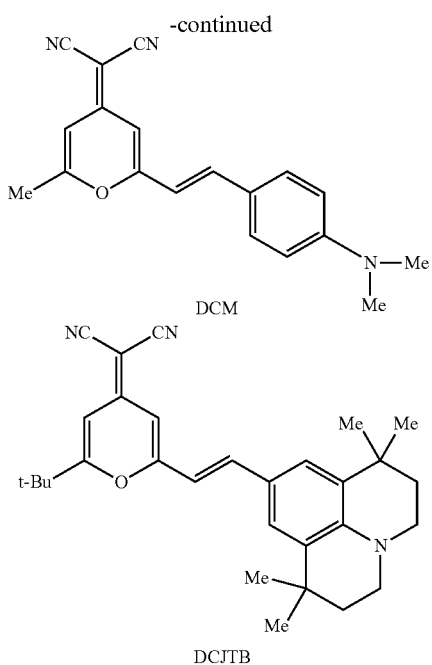
DCM
DCJTB
Non-limiting examples of the green dopant are compounds represented by the following formulae.
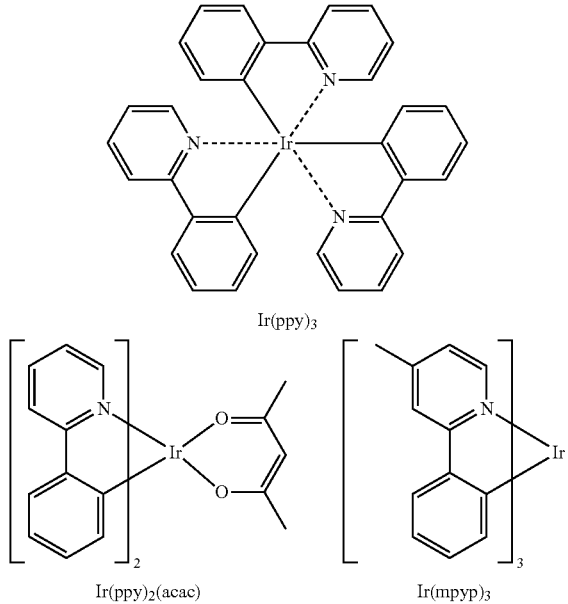
Ir(ppy)₃
Ir(ppy)₂(acac)          Ir(mpyp)₃
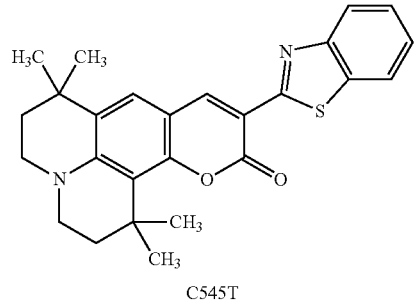
C545T
Non-limiting examples of the dopant that may be used in the EML are Pd complexes or Pt complexes represented by the following formulae.
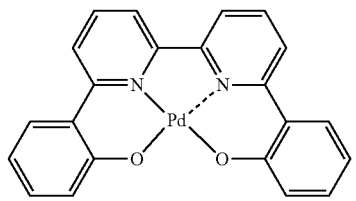
D1
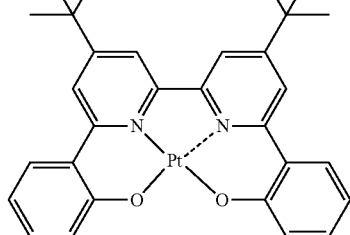
D2
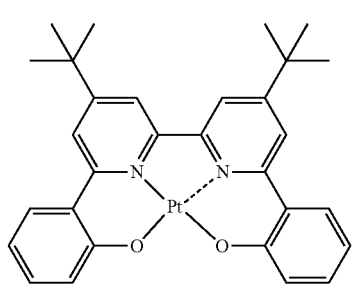
D3
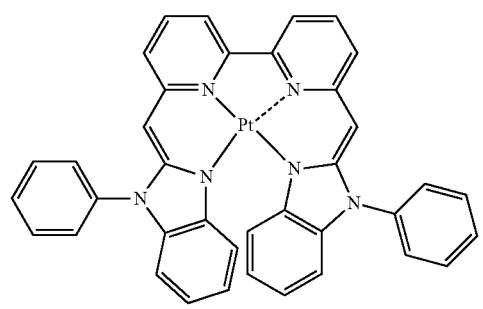
D4
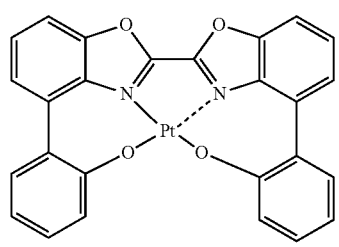
D5
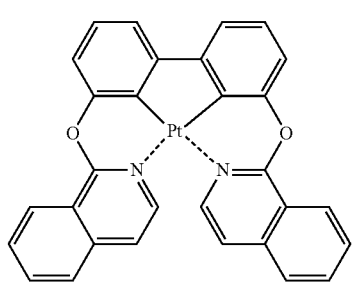
D6

-continued
D7
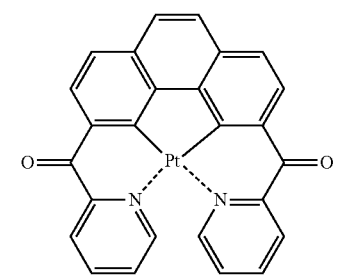
D8
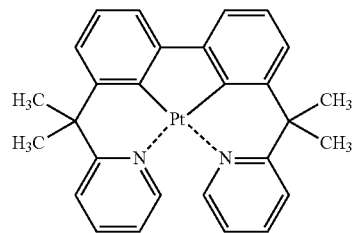
D9
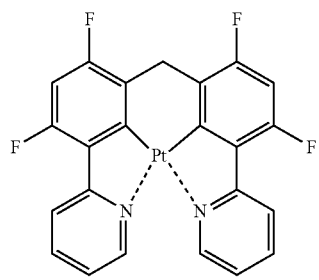
D10
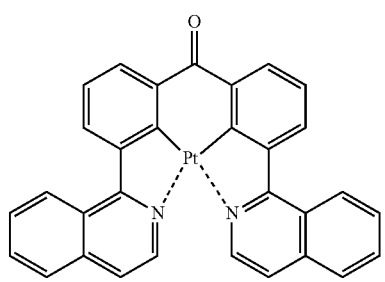
D11
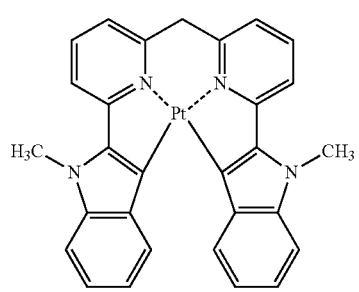
D12
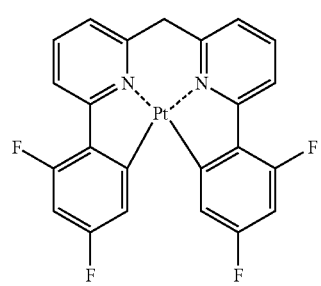
-continued
D13
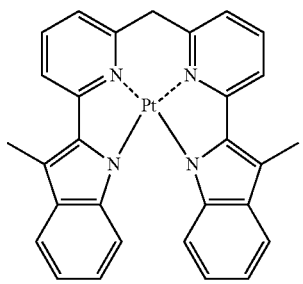
D14
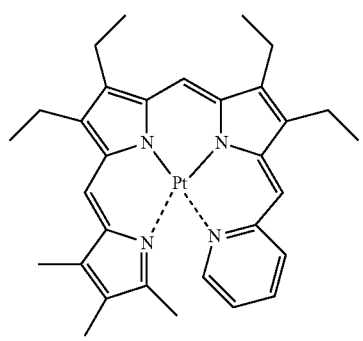
D15
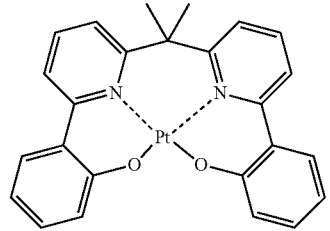
D16
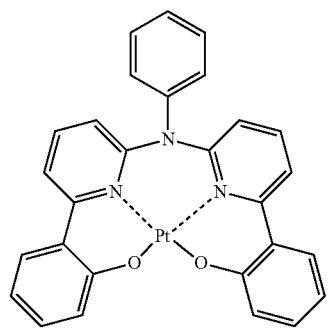
D17
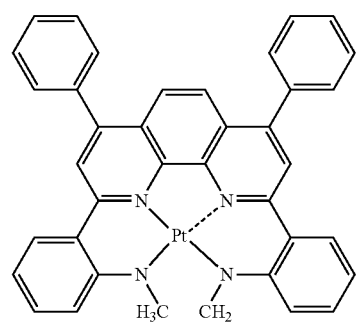

D18 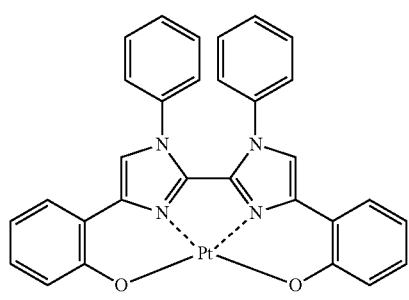
D19 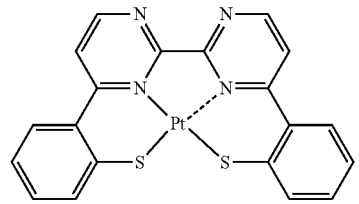
D20 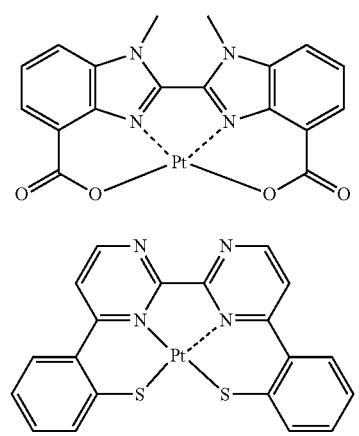
D21 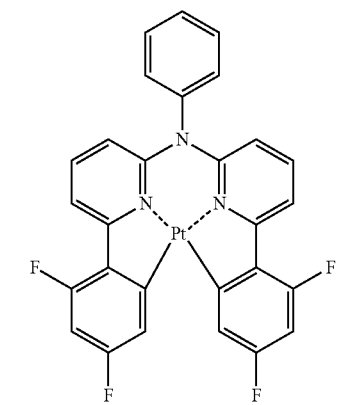
D22 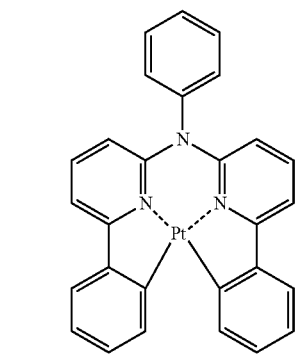
D23 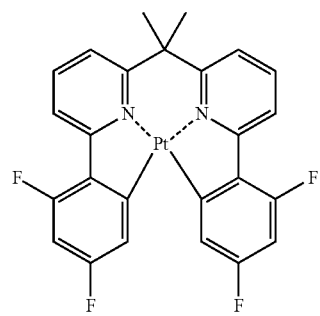
D24 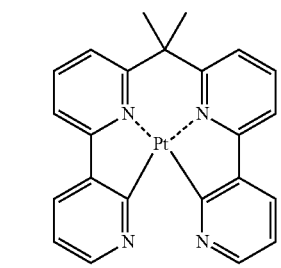
D25 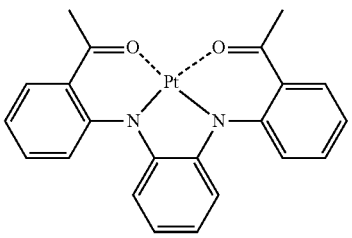
D26 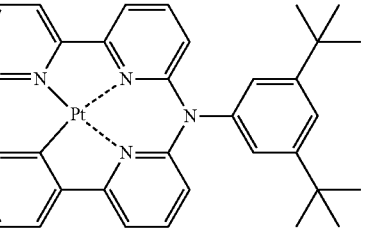
D27 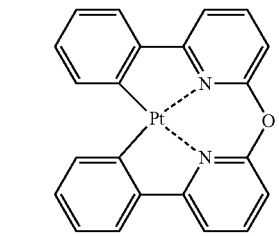
D28 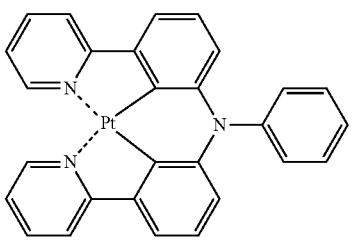

-continued
D29
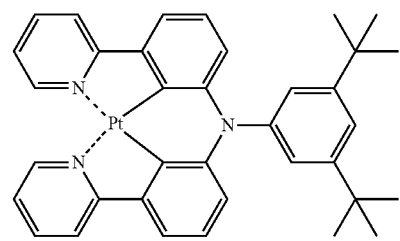
D30
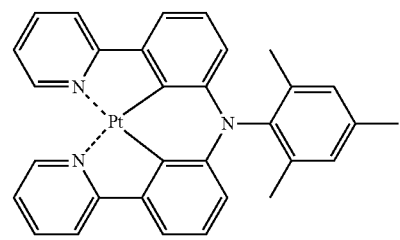
D31
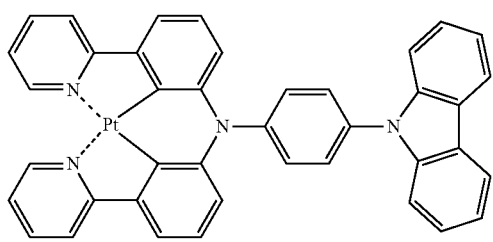
D32
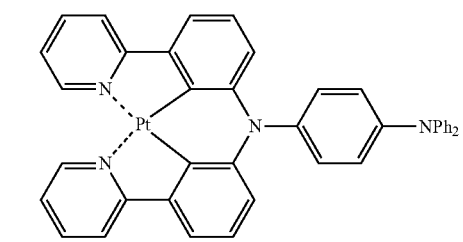
D33
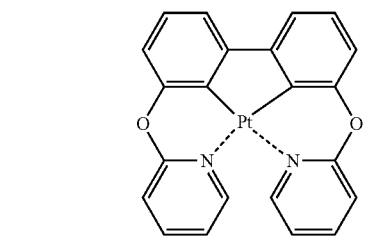
D34
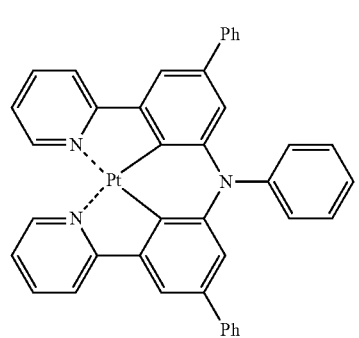
-continued
D35
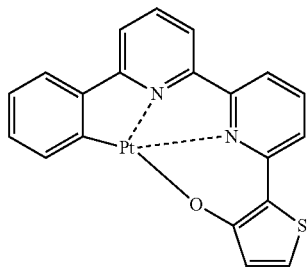
D36
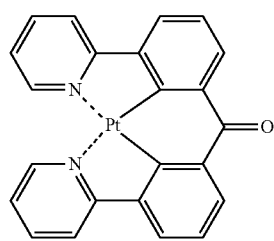
D37
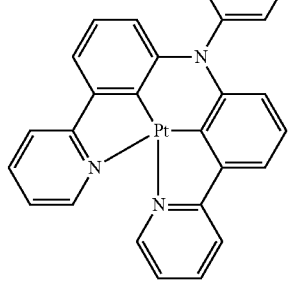
D38
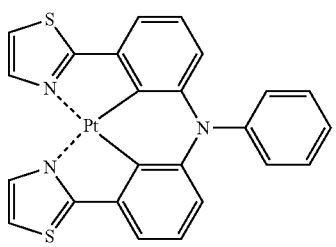
D39
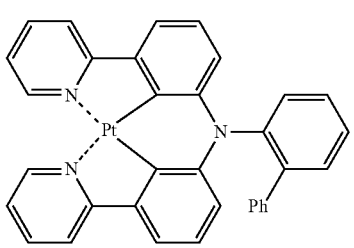

-continued
D40 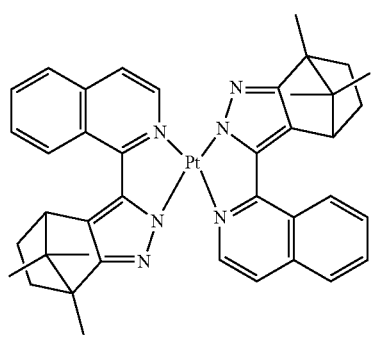
D41 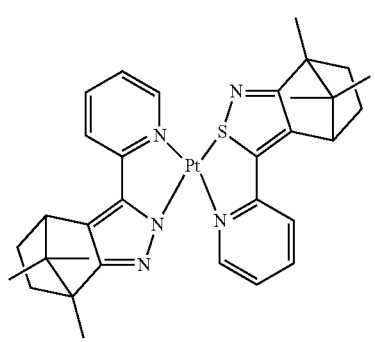
D42 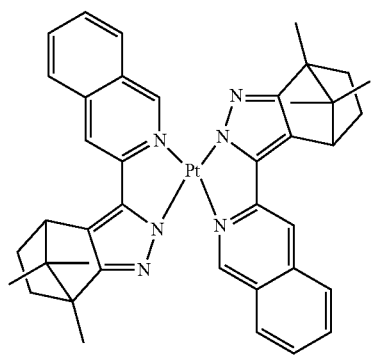
D43 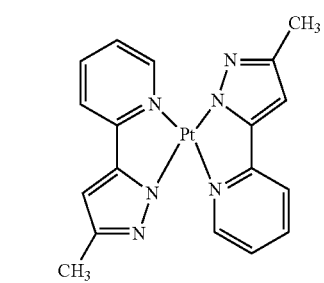
D44 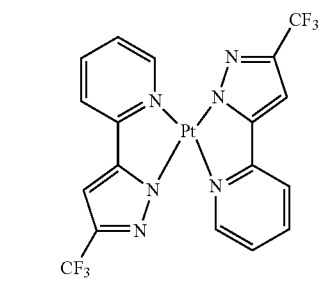
-continued
D45 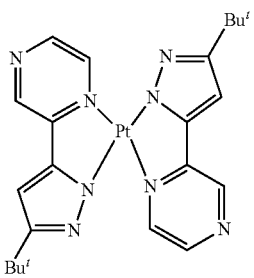
D46 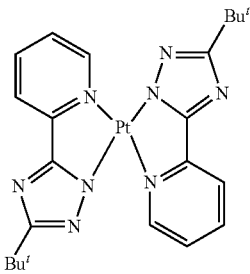
D47 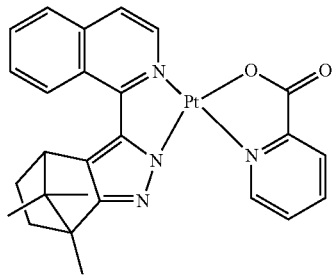
D48 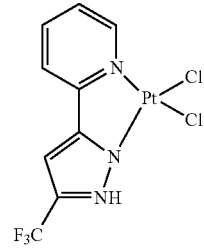
D49 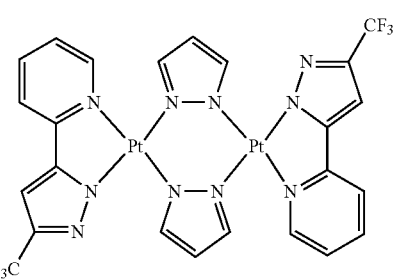

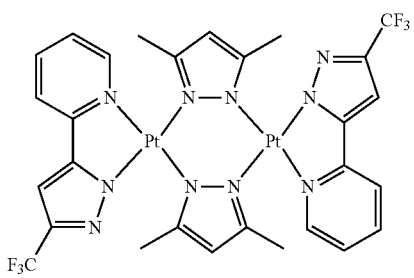

D50

Non-limiting examples of the dopant that may be used in the EML are Os (osmium) complexes represented by the following formulae.

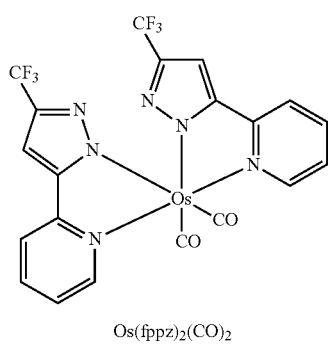

Os(fppz)₂(CO)₂

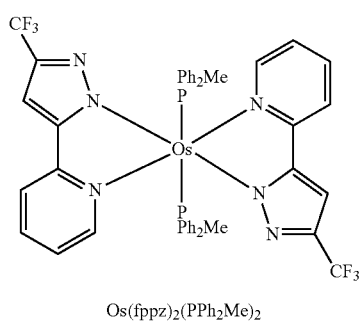

Os(fppz)₂(PPh₂Me)₂

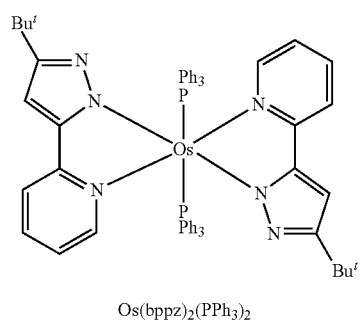

Os(bppz)₂(PPh₃)₂

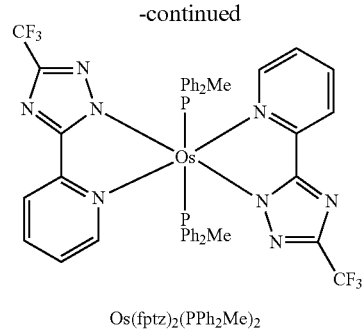

Os(fptz)₂(PPh₂Me)₂

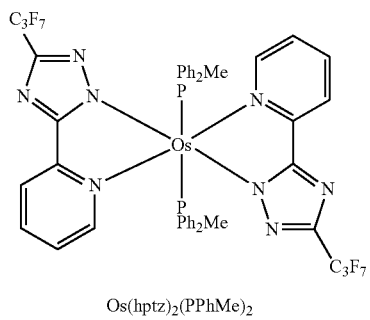

Os(hptz)₂(PPhMe)₂

When the EML includes both a host and a dopant, the amount of the dopant may be from about 0.01 to about 15 parts by weight based on 100 parts by weight of the host. However, the amount of the dopant is not limited to this range.

In some embodiments, the thickness of the EML may be about 100 Å to about 1000 Å, and in some embodiments, may be from about 200 Å to about 600 Å. When the thickness of the EML is within these ranges, the EML may have good light emitting ability without a substantial increase in driving voltage.

Then, an ETL may be formed on the EML by vacuum deposition, spin coating, casting, or the like. When the ETL is formed using vacuum deposition or spin coating, the deposition and coating conditions may be similar to those for the formation of the HIL, though the deposition and coating conditions may vary depending on a compound that is used to form the ETL.

A material for forming the ETL may be the compound of Formula 4 or 5 above or any known material that can stably transport electrons injected from an electron injecting electrode (cathode).

Non-limiting examples of materials for forming the ETL are a quinoline derivative, such as tris(8-quinolinorate) aluminum (Alq₃), TAZ, BAlq, beryllium bis(benzoquinolin-10-olate) (Bebq₂), 9,10-di(naphthalene-2-yl)anthracene (ADN), Compound 201, and Compound 202.

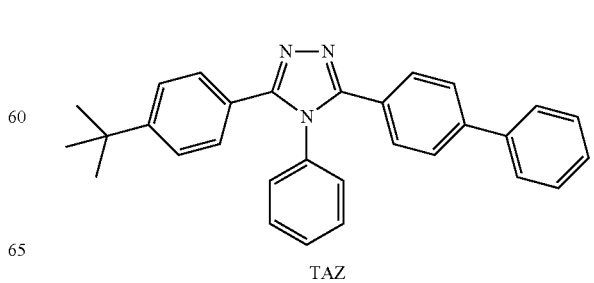

TAZ

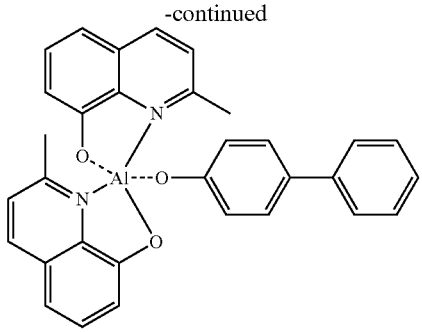

BAlq

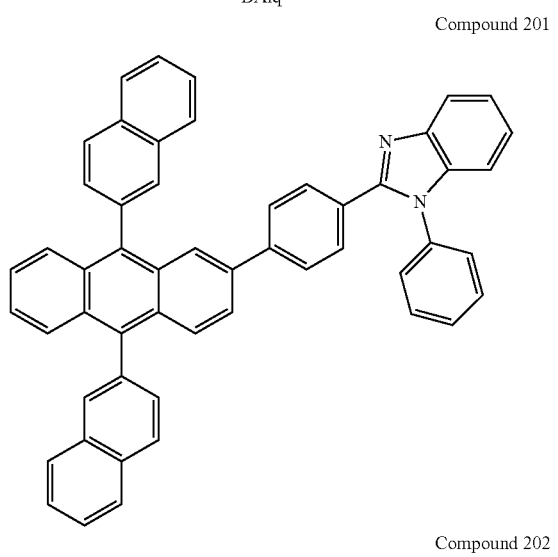

Compound 201

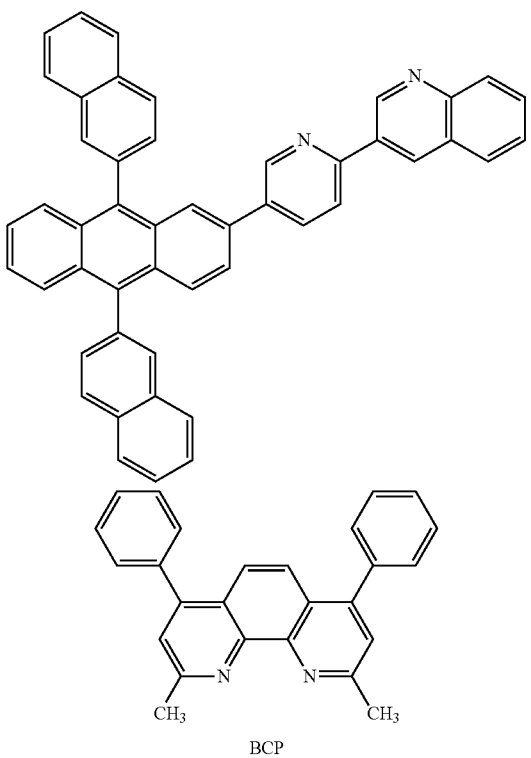

Compound 202

BCP

In some embodiments, the thickness of the ETL may be from about 100 Å to about 1,000 Å, and in some embodiments, may be from about 150 Å to about 500 Å. When the thickness of the ETL is within these ranges, the ETL may have satisfactory electron transporting ability without a substantial increase in driving voltage.

In some embodiments the ETL may further include a metal-containing material, in addition to any known electron-transporting organic compound.

In some embodiments, the metal-containing material may include a lithium (Li) complex. Non-limiting examples of the Li complex are lithium quinolate (LiQ) and Compound 203 below:

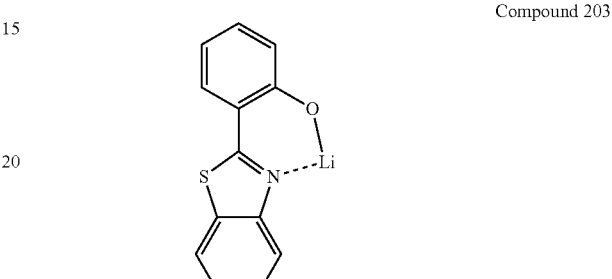

Compound 203

Then, an EIL, which facilitates injection of electrons from the cathode, may be formed on the ETL. Any suitable electron-injecting material may be used to form the EIL.

Non-limiting examples of materials for forming the EIL are LiF, NaCl, CsF, $Li_2O$, and BaO. In some embodiments, the deposition and coating conditions for forming the EIL may be similar to those for the formation of the HIL, though the deposition and coating conditions may vary depending on the material that is used to form the EIL.

In some embodiments, the thickness of the EIL may be from about 1 Å to about 100 Å, and in some embodiments, may be from about 3 Å to about 90 Å. When the thickness of the EIL is within these ranges, the EIL may have satisfactory electron injection ability without a substantial increase in driving voltage.

Finally, the second electrode is disposed on the organic layer. In some embodiments, the second electrode may be a cathode that is an electron injection electrode. A material for forming the second electrode may be a metal, an alloy, an electro-conductive compound, which have a low work function, or a mixture thereof. In this regard, the second electrode may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting device, the transmission electrode may be formed of indium tin oxide (ITO) or indium zinc oxide (IZO).

Although the organic light-emitting device of the FIGURE is described above, embodiments of the present disclosure are not limited thereto.

When a phosphorescent dopant is used in the EML, a HBL may be formed between the HTL and the EML or between the H-functional layer and the EML by using vacuum deposition, spin coating, casting, Langmuir-Blodgett (LB) deposition, or the like, in order to prevent diffusion of triplet excitons or holes into the ETL. When the HBL is formed using vacuum deposition or spin coating, the conditions for deposition and coating may be similar to those for the formation of the HIL, although the conditions for deposition and coating may vary depending on the material that is used to form the HBL. Any known hole-blocking material may be used. Non-limiting examples of hole-blocking materials are oxadiazole derivatives, triazole derivatives, and phenanthroline derivatives. For example, bathocuproine (BCP) represented by the following formula may be used as a material for forming the HBL.

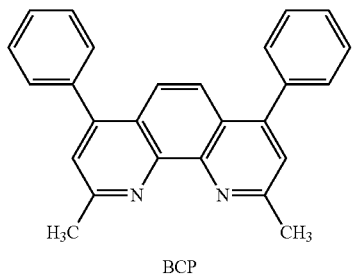 [SMILES: Cc1cc(-c2ccccc2)c2ccc3c(-c4ccccc4)cc(C)nc3c2n1 ; "BCP"]

BCP

In some embodiments, the thickness of the HBL may be from about 20 Å to about 1000 Å, and in some embodiments, may be from about 30 Å to about 300 Å. When the thickness of the HBL is within these ranges, the HBL may have improved hole blocking ability without a substantial increase in driving voltage.

According to embodiments of the present disclosure, the organic light-emitting device may be included in various types of flat panel display devices, such as in a passive matrix organic light-emitting display device or in an active matrix organic light-emitting display device. In particular, when the organic light-emitting device is included in an active matrix organic light-emitting display device including a thin-film transistor, the first electrode on the substrate may function as a pixel electrode, electrically connected to a source electrode or a drain electrode of the thin-film transistor. Moreover, the organic light-emitting device may also be included in flat panel display devices having double-sided screens.

In some embodiments, the organic layer of the organic light-emitting device may be formed of the compound of Formula 1 and the compound of Formula 2 by using a deposition method or may be formed using a wet method of coating a solution including the compound of Formula 1 and the compound of Formula 2.

Hereinafter, the present embodiments will be described in detail with reference to the following synthesis examples and other examples. However, these examples are for illustrative purposes only and are not intended to limit the scope of the present embodiments.

EXAMPLE

Synthesis Example 1

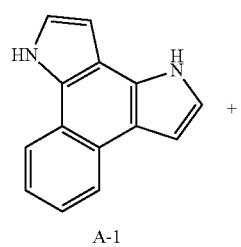

A-1

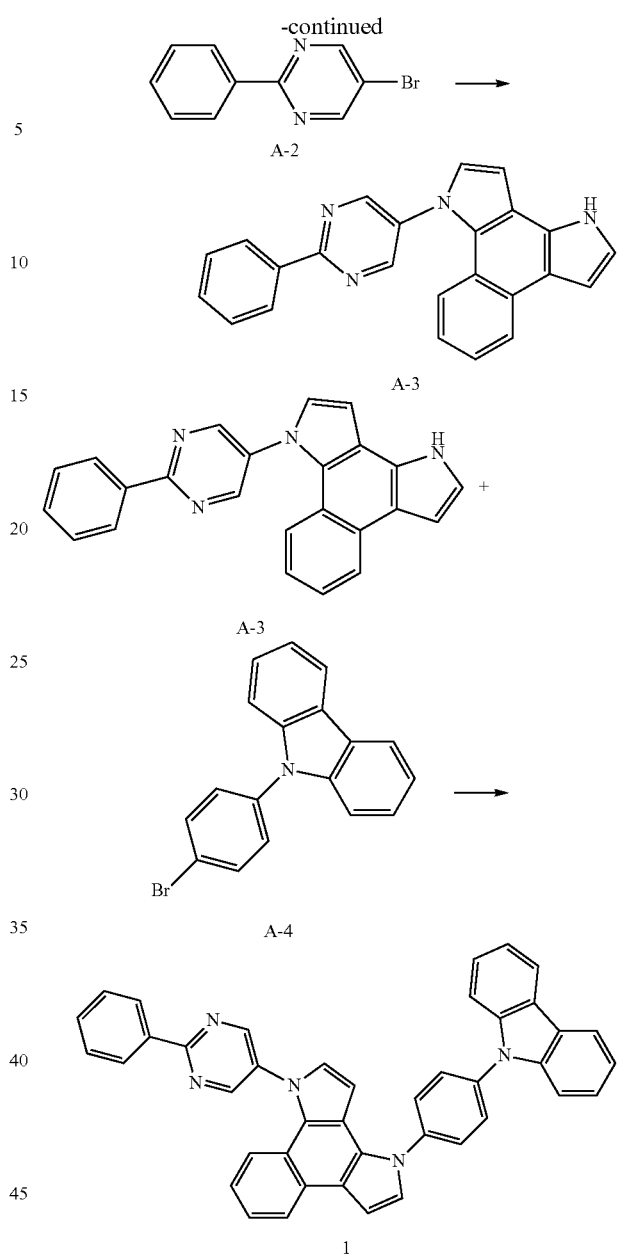

Synthesis of Intermediate A-3

10 g (1 eq, 0.048 mol) of compound A-1, and 14.06 g (1.1 eq, 0.049 mol) of compound A-2 were dissolved in 700 mL of toluene in a flask. 0.08 g (0.03 eq, 0.000144 mmol) of Pd$_2$(dba)$_3$, 4.27 g (1.2 eq, 0.057 mol) of Na(t-bu)O, 0.07 g (0.06 eq, 0.00288 mmol) of P(t-Bu)$_3$ were added to the solution, and then dissolved by further addition of 150 mL of toluene and then heated while stirring for about 12 hours. A reaction solution after termination of the reaction was filtered through a Celite, and a filtered product was refined by column chromatography to obtain 14.7 g of Compound 1 with a yield of about 84.2%.

Elemental Analysis for C24H16N4: calcd C, 79.98; H, 4.47; N, 15.55.

HRMS for C24H16N4 [M]+: calcd 360.14, found 360.

Synthesis of Compound 1

8 g (1 eq, 0.022 mol) of compound A-3, and 7.84 g (1.1 eq, 0.0242 mol) of compound A-4 were dissolved in 500 mL of toluene in a flask. 0.08 g (0.03 eq, 0.000144 mmol) of Pd$_2$(dba)$_3$, 4.27 g (1.2 eq, 0.057 mol) of Na(t-bu)O, 0.07 g (0.06 eq, 0.00288 mmol) of P(t-Bu)$_3$ were added to the solution, and then dissolved by further addition of 150 mL of toluene and then heated while stirring for about 12 hours. A reaction solution after termination of the reaction was filtered through a Celite, and a filtered product was refined by column chromatography to obtain 11.1 g of Compound 1 with a yield of about 84%.

Elemental Analysis for C42H27N5: calcd C, 83.84; H, 4.52; N, 11.64.

HRMS for C42H27N5 [M]+: calcd 601.23, found 601.

Synthesis Example 2

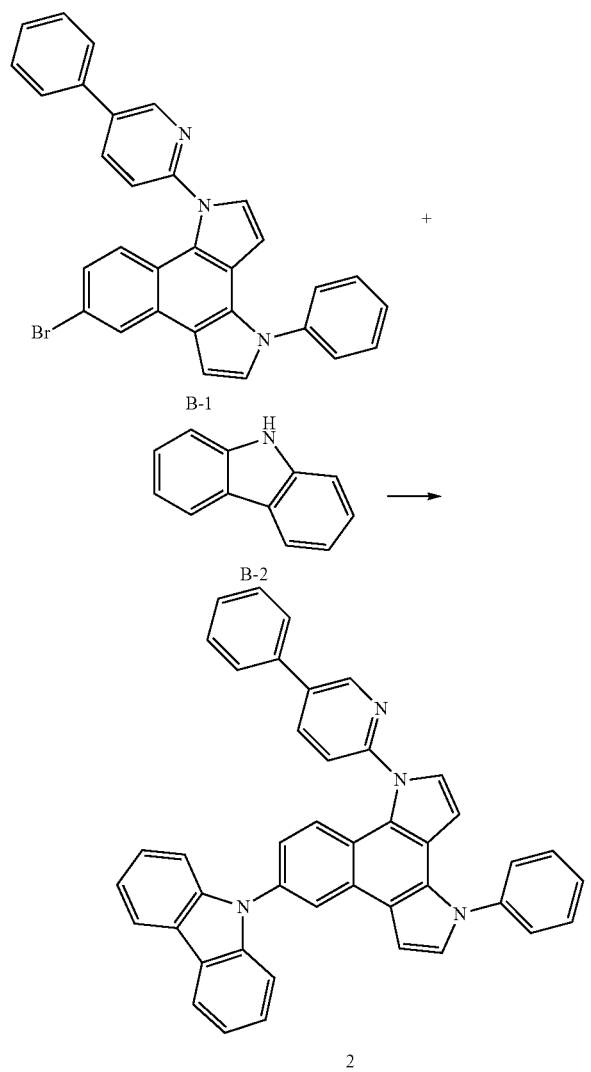

2

Synthesis of Compound 2

10 g (1 eq, 0.019 mol) of compound B-1, and 3.58 g (1.1 eq, 0.0214 mol) of compound B-2 were dissolved in 450 mL of toluene in a flask. 0.52 g (0.03 eq, 0.00057 mmol) of Pd$_2$(dba)$_3$, 3.79 g (1.2 eq, 0.022 mol) of Na(t-bu)O, 1.57 g (0.06 eq, 0.0114 mmol) of P(t-Bu)$_3$ were added to the solution, and then dissolved by further addition of 150 mL of toluene and then heated while stirring for about 12 hours. A reaction solution after termination of the reaction was filtered through a Celite, and a filtered product was refined by column chromatography to obtain 9.0 g of Compound 2 with a yield of about 79%.

Elemental Analysis for C43H28N4: calcd C, 85.98; H, 4.70; N, 9.33.

HRMS for C43H28N4 [M]+: calcd 600.23, found 600.

Synthesis Example 3

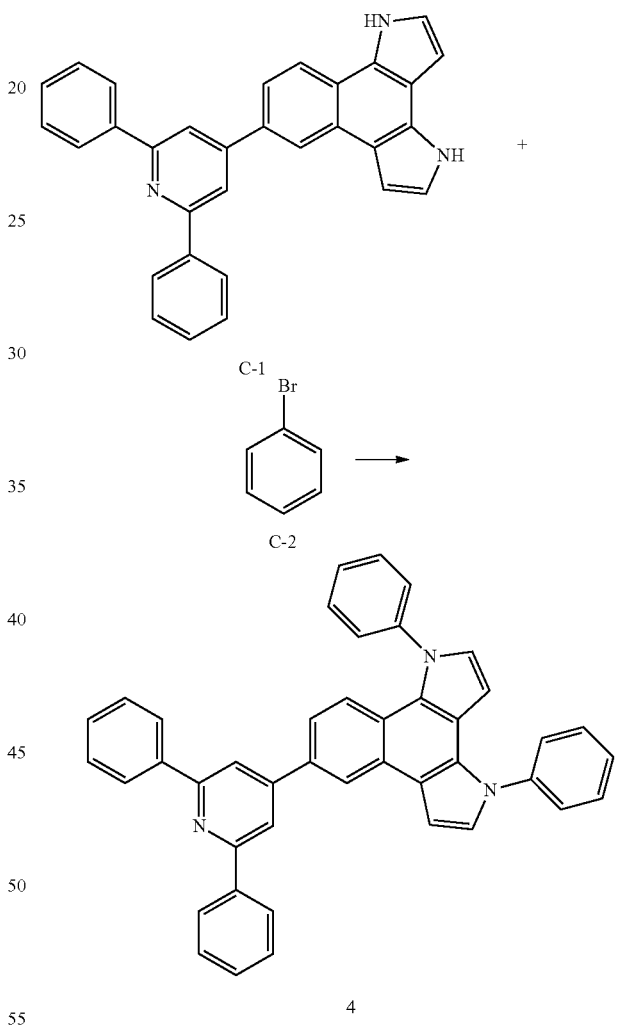

4

10 g (1 eq, 0.022 mol) of compound C-1, and 7.8 g (2.2 eq, 0.05 mol) of compound C-2 were dissolved in 300 mL of toluene in a flask. 0.64 g (0.03 eq, 0.00066 mmol) of Pd$_2$(dba)$_3$, 6.59 g (2.2 eq, 0.05 mol) of Na(t-bu)O, 1.22 g (0.06 eq, 0.0132 mmol) of P(t-Bu)$_3$ were added to the solution, and then dissolved by further addition of 150 mL of toluene and then heated while stirring for about 12 hours. A reaction solution after termination of the reaction was filtered through a Celite, and a filtered product was refined by column chromatography to obtain 10.9 g of Compound 4 with a yield of about 85%.

Elemental Analysis for C43H29N3: calcd C, 87.88; H, 4.97; N, 7.15.

HRMS for C43H29N3 [M]+: calcd 587.24, found 587.

Synthesis Example 4

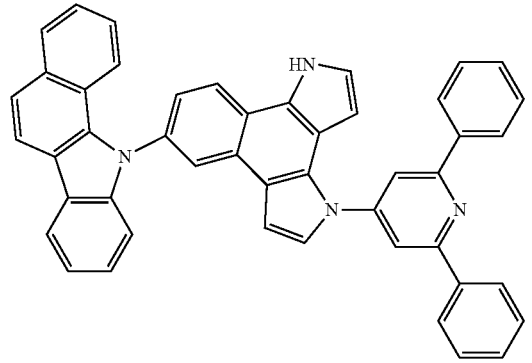

Synthesis Example 5

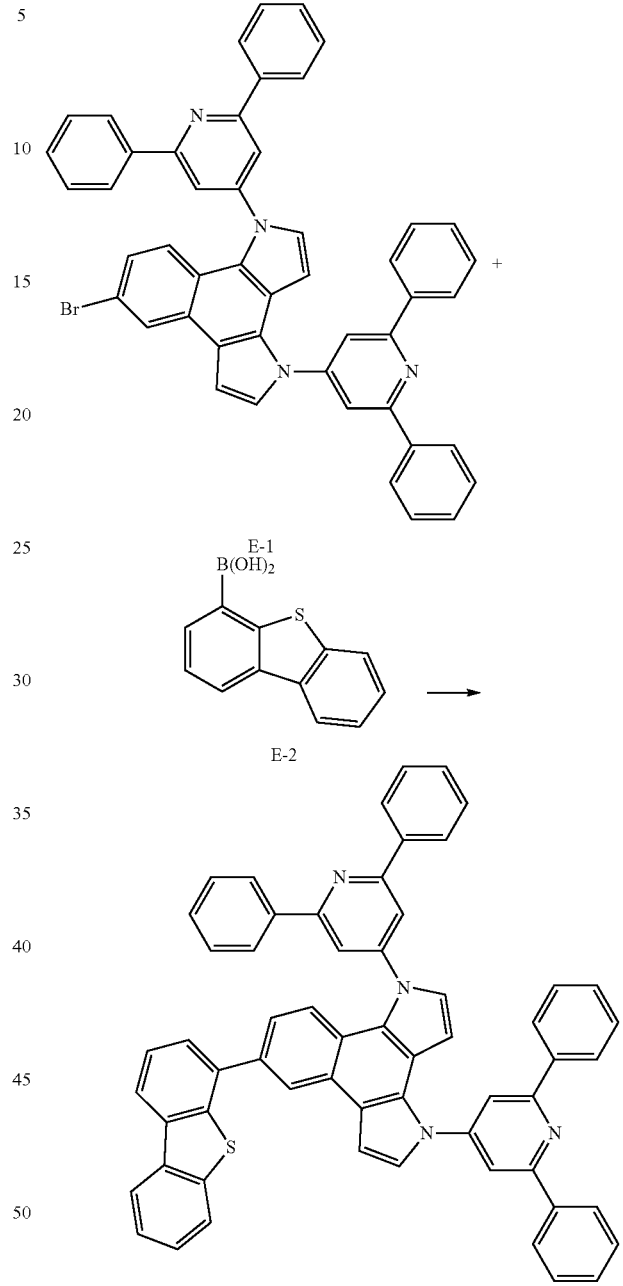

10 g (1 eq, 0.015 mol) of compound D-1, and 0.239 g (1.1 eq, 0.0153 mol) of compound D-2 were dissolved in 250 mL of toluene in a flask. 0.32 g (0.03 eq, 0.0003 mmol) of $Pd_2(dba)_3$, 3.28 g (1.1 eq, 0.025 mol) of Na(t-bu)O, 0.61 g (0.06 eq, 0.0006 mmol) of $P(t-Bu)_3$ were added to the solution, and then dissolved by further addition of 150 mL of toluene and then heated while stirring for about 12 hours. A reaction solution after termination of the reaction was filtered through a Celite, and a filtered product was refined by column chromatography to obtain 8.9 g of Compound 8 with a yield of about 81.4%.

Elemental Analysis for C53H34N4: calcd: C, 87.58; H, 4.71; N, 7.71.

HRMS for C53H34N4 [M]+: calcd 726.28, found 726.

10 g (1 eq, 0.013 mol) of compound E-1, and 3.37 g (1.1 eq, 0.0148 mol) of compound E-2 were dissolved in 250 mL of toluene in a flask. 0.3 g (0.02 eq, 0.00026 mmol) of $Pd(PPh_3)_4$ and 60 mL of a 2M $K_2CO_3$ solution were added to the solution, and then heated while stirring for about 12 hours. A reaction solution after termination of the reaction was filtered through a Celite, and a filtered product was refined by column chromatography to obtain 9.09 g of Compound 9 with a yield of about 82.7%.

Elemental Analysis for C60H38N4S: calcd: C, 85.08; H, 4.52; N, 6.61; S, 3.79.

HRMS for C60H38N4S [M]+: calcd 846.28, found 846.

Synthesis Example 6

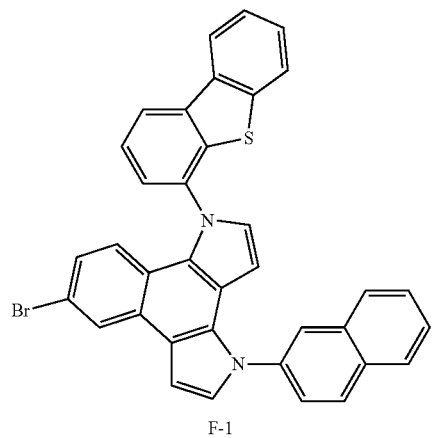

F-1

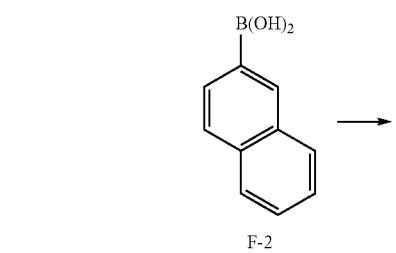

F-2

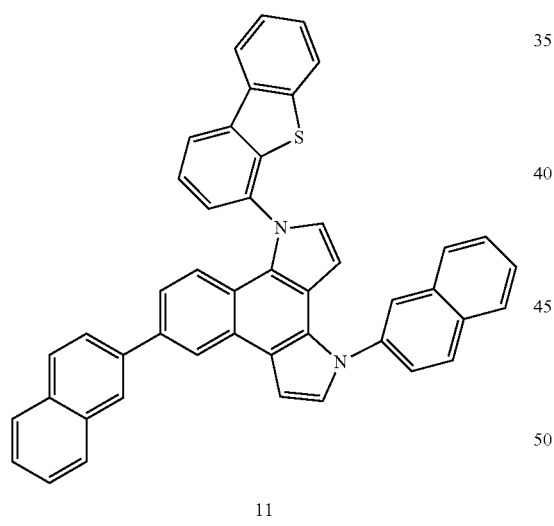

11

10 g (1 eq, 0.0163 mol) of compound F-1, and 3.19 g (1.1 eq, 0.018 mol) of compound F-2 were dissolved in 400 mL of toluene in a flask. 0.37 g (0.02 eq, 0.00032 mmol) of Pd(PPh$_3$)$_4$ and 70 mL of a 2M K$_2$CO$_3$ solution were added to the solution, and then heated while stirring for about 12 hours. A reaction solution after termination of the reaction was filtered through a Celite, and a filtered product was refined by column chromatography to obtain 9.2 g of Compound 11 with a yield of about 88.4%.

Elemental Analysis for C60H38N4S: calcd: C, 85.08; H, 4.52; N, 6.61; S, 3.79.

HRMS for C60H38N4S [M]+: calcd 846.28, found 846.

Synthesis Example 7

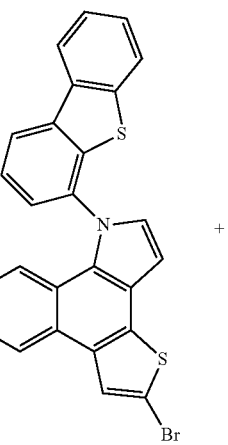

G-1

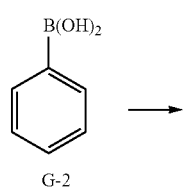

G-2

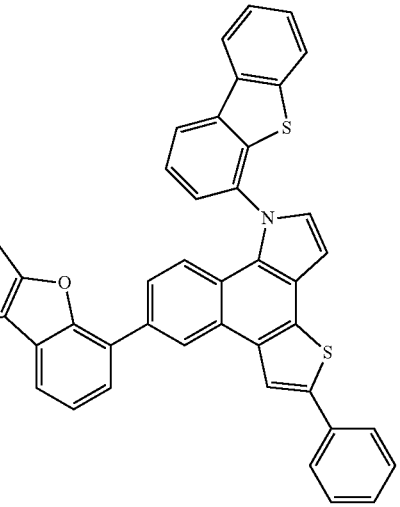

13

10 g (1 eq, 0.0124 mol) of compound G-1, and 2.06 g (1.1 eq, 0.0169 mol) of compound G-2 were dissolved in 600 mL of toluene in a flask. 0.286 g (0.02 eq, 0.000248 mmol) of Pd(PPh$_3$)$_4$ and 70 mL of a 2M K$_2$CO$_3$ solution were added to the solution, and then heated while stirring for about 12 hours. A reaction solution after termination of the reaction was filtered through a Celite, and a filtered product was refined by column chromatography to obtain 6.6 g of Compound 13 with a yield of about 82.3%.

Elemental Analysis for C44H25NOS2: calcd: C, 81.58; H, 3.89; N, 2.16; O, 2.47; S, 9.90.

HRMS for C44H25NOS2 [M]+: calcd 647.14, found 647.

Synthesis Example 8

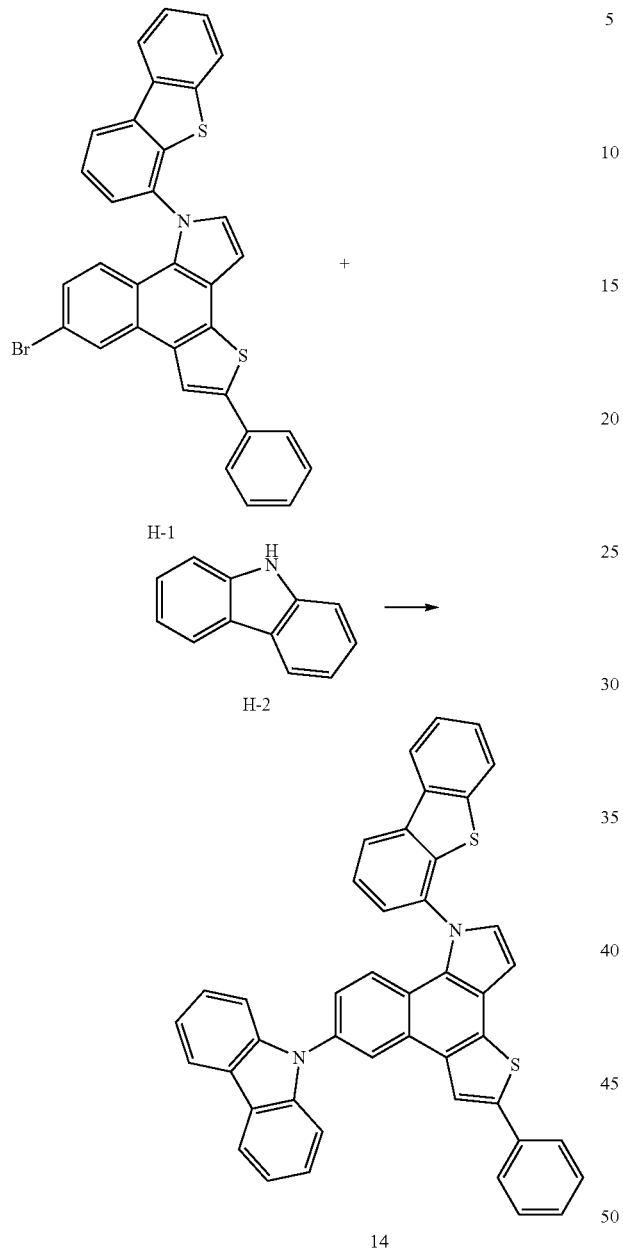

10 g (1 eq, 0.017 mol) of compound H-1, and 3.28 g (1.1 eq, 0.0196 mol) of compound H-2 were dissolved in 300 mL of toluene in a flask. 0.42 g (0.03 eq, 0.0005 mmol) of Pd$_2$(dba)$_3$, 2.74 g (1.1 eq, 0.0196 mol) of Na(t-bu)O, 0.84 g (0.06 eq, 0.001 mmol) of P(t-Bu)$_3$ were added to the solution, and then dissolved by further addition of 100 mL of toluene and then heated while stirring for about 12 hours. A reaction solution after termination of the reaction was filtered through a Celite, and a filtered product was refined by column chromatography to obtain 8.6 g of Compound 14 with a yield of about 79.1%.

Elemental Analysis for C44H26N2S2: calcd: C, 81.70; H, 4.05; N, 4.33; S, 9.91.

HRMS for C44H26N2S2 [M]+: calcd 646.15, found 646.

Synthesis Example 9

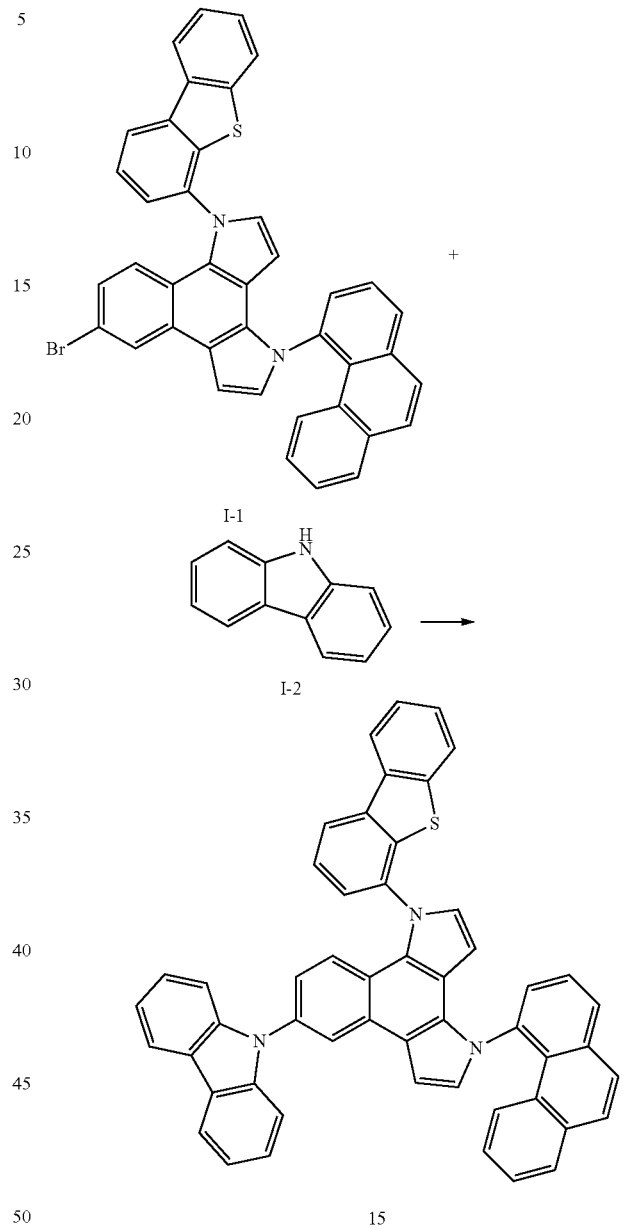

10 g (1 eq, 0.017 mol) of compound I-1, and 3.28 g (1.1 eq, 0.0196 mol) of compound 1-2 were dissolved in 300 mL of toluene in a flask. 0.42 g (0.03 eq, 0.0005 mmol) of Pd$_2$(dba)$_3$, 2.74 g (1.1 eq, 0.0196 mol) of Na(t-bu)O, 0.84 g (0.06 eq, 0.001 mmol) of P(t-Bu)$_3$ were added to the solution, and then dissolved by further addition of 100 mL of toluene and then heated while stirring for about 12 hours. A reaction solution after termination of the reaction was filtered through a Celite, and a filtered product was refined by column chromatography to obtain 9.6 g of Compound 15 with a yield of about 77.9%.

Elemental Analysis for C52H31N3S: calcd: C, 85.57; H, 4.28; N, 5.76; S, 4.39.

HRMS for C52H31N3S [M]+: calcd 729.22, found 729.

Synthesis Example 10

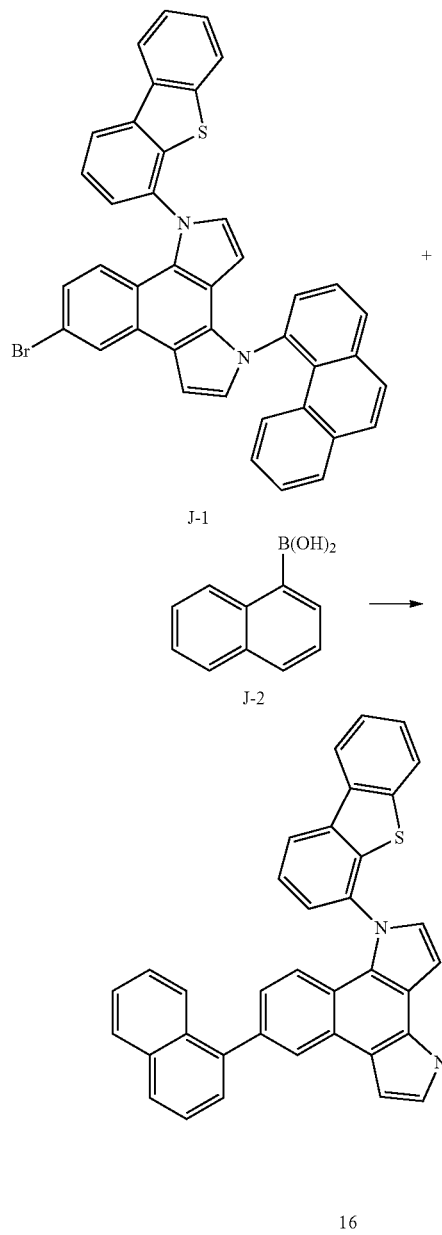

10 g (1 eq, 0.0155 mol) of compound J-1, and 2.9 g (1.1 eq, 0.0171 mol) of compound J-2 were dissolved in 550 mL of toluene in a flask. 0.35 g (0.02 eq, 0.00031 mmol) of Pd(PPh$_3$)$_4$ and 50 mL of a 2M K$_2$CO$_3$ solution were added to the solution, and then heated while stirring for about 12 hours. A reaction solution after termination of the reaction was filtered through a Celite, and a filtered product was refined by column chromatography to obtain 8.8 g of Compound 16 with a yield of about 83%.

Elemental Analysis for C50H30N2S: calcd: C, 86.93; H, 4.38; N, 4.05; S, 4.64.

HRMS for C50H30N2S [M]+: calcd 690.21, found 690.

Synthesis Example 11

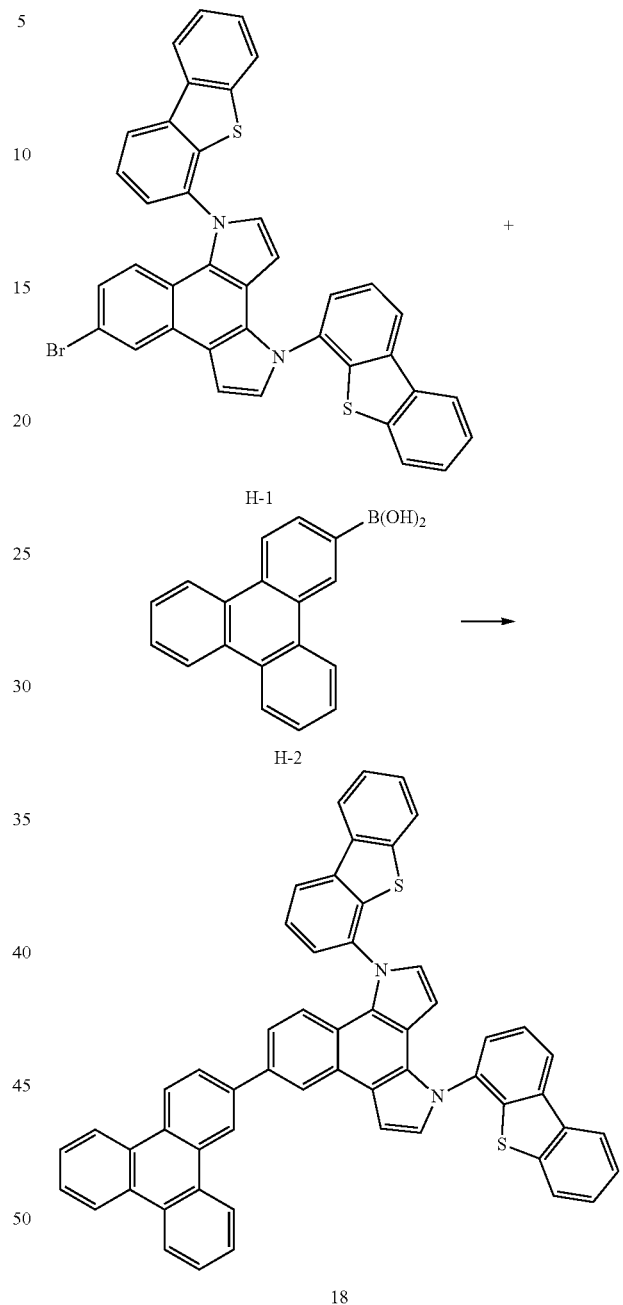

10 g (1 eq, 0.0154 mol) of compound H-1, and 4.6 g (1.1 eq, 0.0169 mol) of compound H-2 were dissolved in 450 mL of toluene in a flask. 0.35 g (0.02 eq, 0.00031 mmol) of Pd(PPh$_3$)$_4$ and 45 mL of a 2M K$_2$CO$_3$ solution were added to the solution, and then heated while stirring for about 12 hours. A reaction solution after termination of the reaction was filtered through a Celite, and a filtered product was refined by column chromatography to obtain 10.59 g of Compound 18 with a yield of about 86.4%.

Elemental Analysis for C56H32N2S2: calcd: C, 84.39; H, 4.05; N, 3.51; S, 8.05.

HRMS for C56H32N2S2 [M]+: calcd 796.2, found 796.

Example 1

To manufacture an anode, a corning 15 Ω/cm2 (500 Å) ITO glass substrate was cut to a size of 50 mm×50 mm×0.5 mm and then sonicated in isopropyl alcohol and pure water each for 10 minutes, and then cleaned by irradiation of ultraviolet rays for 10 minutes and exposure to ozone. The resulting glass substrate was loaded into a vacuum deposition device. Then, 2-TNATA as a HIL material was vacuum-deposited on the glass substrate to form a HIL having a thickness of about 600 Å. Then, 4,4'-bis[N-(1-naphthyl)-N-phenylamino]biphenyl (NPB) as a hole transporting compound, was vacuum-deposited on the HIL to form a HTL having a thickness of about 300 Å.

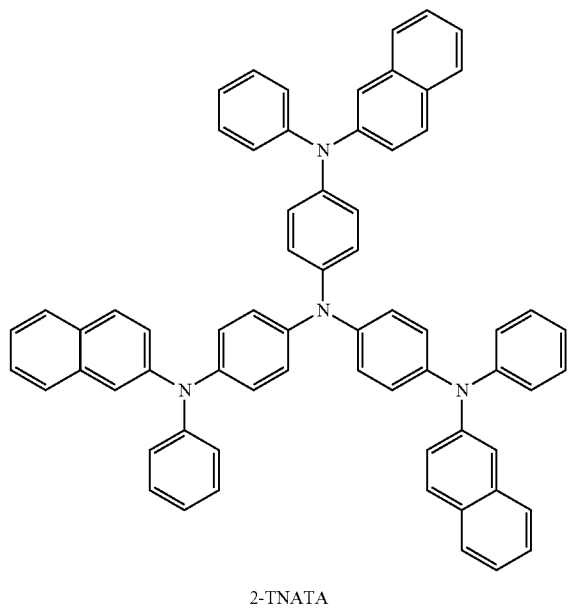

2-TNATA

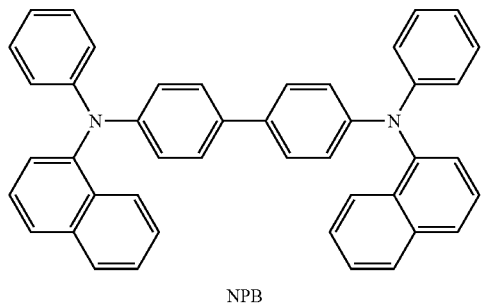

NPB

Next, Compound 3, Compound 2-2 as a host compound, and Ir(PPy)$_3$ as a phosphorescent dopant were co-deposited on the HTL in a weight ratio of 25:65:10 to form an EML with a thickness of about 400 Å. Next, Alq3 was deposited on the EML to form an ETL having a thickness of about 300 Å, and Al was vacuum-deposited to a thickness of about 1200 Å to form an Al electrode (cathode), thereby completing the manufacture of an organic light-emitting device.

Example 2

An organic light-emitting device was manufactured in substantially the same manner as in Example 1, except that Compound 3, Compound 2-2 as a host compound, and Ir(PPy)$_3$ as a phosphorescent dopant were co-deposited in a ratio of about 15:75:10 by weight to form the EML.

Example 3

An organic light-emitting device was manufactured in substantially the same manner as in Example 1, except that Compound 2, Compound 2-2 as a host compound, and Ir(PPy)$_3$ as a phosphorescent dopant were co-deposited in a ratio of about 40:50:10 by weight to form the EML.

Example 4

An organic light-emitting device was manufactured in substantially the same manner as in Example 1, except that Compound 2, Compound 2-2 as a host compound, and Ir(PPy)$_3$ as a phosphorescent dopant were co-deposited in a ratio of about 25:65:10 by weight to form the EML.

Example 5

An organic light-emitting device was manufactured in substantially the same manner as in Example 1, except that Compound 3, Compound 2-3 as a host compound, and Ir(PPy)$_3$ as a phosphorescent dopant were co-deposited in a ratio of about 30:60:10 by weight to form the EML.

Example 6

An organic light-emitting device was manufactured in substantially the same manner as in Example 1, except that Compound 3, Compound 2-3 as a host compound, and Ir(PPy)$_3$ as a phosphorescent dopant were co-deposited in a ratio of about 20:70:10 by weight to form the EML.

Example 7

An organic light-emitting device was manufactured in substantially the same manner as in Example 1, except that Compound 2, Compound 2-3 as a host compound, and Ir(PPy)$_3$ as a phosphorescent dopant were co-deposited in a ratio of about 30:60:10 by weight to form the EML.

Example 8

An organic light-emitting device was manufactured in substantially the same manner as in Example 1, except that Compound 2, Compound 2-3 as a host compound, and Ir(PPy)$_3$ as a phosphorescent dopant were co-deposited in a ratio of about 20:70:10 by weight to form the EML.

Example 9

An organic light-emitting device was manufactured in substantially the same manner as in Example 1, except that Compound 3, Compound 2-7 as a host compound, and Ir(PPy)$_3$ as a phosphorescent dopant were co-deposited in a ratio of about 40:50:10 by weight to form the EML.

Example 10

An organic light-emitting device was manufactured in substantially the same manner as in Example 1, except that Compound 3, Compound 2-7 as a host compound, and Ir(PPy)$_3$ as a phosphorescent dopant were co-deposited in a ratio of about 30:60:10 by weight to form the EML.

Example 11

An organic light-emitting device was manufactured in substantially the same manner as in Example 1, except that Compound 2, Compound 2-7 as a host compound, and Ir(PPy)$_3$ as a phosphorescent dopant were co-deposited in a ratio of about 35:55:10 by weight to form the EML.

Example 12

An organic light-emitting device was manufactured in substantially the same manner as in Example 1, except that Compound 2, Compound 2-7 as a host compound, and Ir(PPy)$_3$ as a phosphorescent dopant were co-deposited in a ratio of about 25:65:10 by weight to form the EML.

Example 13

An organic light-emitting device was manufactured in substantially the same manner as in Example 1, except that Compound 3, Compound 2-8 as a host compound, and Ir(PPy)$_3$ as a phosphorescent dopant were co-deposited in a ratio of about 45:45:10 by weight to form the EML.

Example 14

An organic light-emitting device was manufactured in substantially the same manner as in Example 1, except that Compound 3, Compound 2-8 as a host compound, and Ir(PPy)$_3$ as a phosphorescent dopant were co-deposited in a ratio of about 25:55:10 by weight to form the EML.

Example 15

An organic light-emitting device was manufactured in substantially the same manner as in Example 1, except that Compound 2, Compound 2-8 as a host compound, and Ir(PPy)$_3$ as a phosphorescent dopant were co-deposited in a ratio of about 30:60:10 by weight to form the EML.

Example 16

An organic light-emitting device was manufactured in substantially the same manner as in Example 1, except that Compound 2, Compound 2-8 as a host compound, and Ir(PPy)$_3$ as a phosphorescent dopant were co-deposited in a ratio of about 20:70:10 by weight to form the EML.

Example 17

An organic light-emitting device was manufactured in substantially the same manner as in Example 1, except that Compound 5, Compound 2-2 as a host compound, and Ir(PPy)$_3$ as a phosphorescent dopant were co-deposited in a ratio of about 60:30:10 by weight to form the EML.

Example 18

An organic light-emitting device was manufactured in substantially the same manner as in Example 1, except that Compound 5, Compound 2-2 as a host compound, and Ir(PPy)$_3$ as a phosphorescent dopant were co-deposited in a ratio of about 45:45:10 by weight to form the EML.

Example 19

An organic light-emitting device was manufactured in substantially the same manner as in Example 1, except that Compound 5, Compound 2-8 as a host compound, and Ir(PPy)$_3$ as a phosphorescent dopant were co-deposited in a ratio of about 60:30:10 by weight to form the EML.

Example 20

An organic light-emitting device was manufactured in substantially the same manner as in Example 1, except that Compound 5, Compound 2-8 as a host compound, and Ir(PPy)$_3$ as a phosphorescent dopant were co-deposited in a ratio of about 45:45:10 by weight to form the EML.

Comparative Example 1

An organic light-emitting device was manufactured in substantially the same manner as in Example 1, except that Compound 3 and Ir(PPy)$_3$ as a phosphorescent dopant were co-deposited in a ratio of about 90:10 by weight to form the EML.

Comparative Example 2

An organic light-emitting device was manufactured in substantially the same manner as in Example 1, except that Compound 2 and Ir(PPy)$_3$ as a phosphorescent dopant were co-deposited in a ratio of about 90:10 by weight to form the EML.

Comparative Example 3

An organic light-emitting device was manufactured in substantially the same manner as in Example 1, except that Compound 2-2 as a host compound and Ir(PPy)$_3$ as a phosphorescent dopant were co-deposited in a ratio of about 90:10 by weight to form the EML.

Comparative Example 4

An organic light-emitting device was manufactured in substantially the same manner as in Example 1, except that Compound 2-8 as a host compound and Ir(PPy)$_3$ as a phosphorescent dopant were co-deposited in a ratio of about 90:10 by weight to form the EML.

Comparative Example 5

An organic light-emitting device was manufactured in substantially the same manner as in Example 1, except that Compound 5 and Ir(PPy)$_3$ as a phosphorescent dopant were co-deposited in a ratio of about 90:10 by weight to form the EML.

The current densities, efficiencies, and lifetimes of the organic light-emitting devices of Examples 1 to 20 and Comparative Examples 1 to 5 were measured. The results are shown in Table 1.

TABLE 1

| Example | First host (Formula 1) | Second host (Formula 2) | Dopant | Ratio of first host:second host:dopant | Current density (mA/cm$^2$) | Efficiency (cd/A) | Lifetime (T90%) (h) |
|---|---|---|---|---|---|---|---|
| Example 1 | 3 | 2-2 | D1 | 25:65:10 | 8 | 46.9 | 160 |
| Example 2 | 3 | 2-2 | D1 | 15:75:10 | 8 | 42.5 | 190 |
| Example 3 | 2 | 2-2 | D1 | 40:50:10 | 8 | 39.3 | 130 |
| Example 4 | 2 | 2-2 | D1 | 25:65:10 | 8 | 34.9 | 110 |
| Example 5 | 3 | 2-3 | D1 | 30:60:10 | 8 | 33.3 | 88 |
| Example 6 | 3 | 2-3 | D1 | 20:70:10 | 8 | 37.3 | 100 |
| Example 7 | 2 | 2-3 | D1 | 30:60:10 | 8 | 41.0 | 65 |
| Example 8 | 2 | 2-3 | D1 | 20:70:10 | 8 | 42.6 | 86 |
| Example 9 | 3 | 2-7 | D1 | 40:50:10 | 8 | 49.0 | 180 |
| Example 10 | 3 | 2-7 | D1 | 30:60:10 | 8 | 46.6 | 210 |
| Example 11 | 2 | 2-7 | D1 | 35:55:10 | 8 | 48.2 | 89 |
| Example 12 | 2 | 2-7 | D1 | 25:65:10 | 8 | 44.1 | 93 |
| Example 13 | 3 | 2-8 | D1 | 45:45:10 | 8 | 49.0 | 66 |
| Example 14 | 3 | 2-8 | D1 | 25:55:10 | 8 | 48.1 | 88 |
| Example 15 | 2 | 2-8 | D1 | 30:60:10 | 8 | 38.5 | 185 |
| Example 16 | 2 | 2-8 | D1 | 20:70:10 | 8 | 34.4 | 216 |
| Example 17 | 5 | 2-2 | D1 | 60:30:10 | 8 | 71.3 | 69 |
| Example 18 | 5 | 2-2 | D1 | 45:45:10 | 8 | 72.9 | 77 |
| Example 19 | 5 | 2-8 | D1 | 60:30:10 | 8 | 77.0 | 89 |
| Example 20 | 5 | 2-8 | D1 | 45:45:10 | 8 | 70.5 | 101 |
| Comparative Example 1 | 3 | — | D1 | 90:10 | 8 | 41.1 | 35 |
| Comparative Example 2 | 2 | — | D1 | 90:10 | 8 | 37.1 | 27 |
| Comparative Example 3 | | 2-2 | D1 | 90:10 | 8 | 13.0 | 8 |
| Comparative Example 4 | | 2-8 | D1 | 90:10 | 8 | 14.7 | 6 |
| Comparative Example 5 | 5 | | D1 | 90:10 | 8 | 32.8 | 16 |

In Table 1, D1 indicates Ir(PPy)$_3$.

Referring to Table 1, the organic light-emitting devices of Examples 1 to 20 are found to have improved efficiencies and improved lifetimes, as compared with the organic light-emitting devices of Comparative Examples 1 to 5.

As described above, according to the one or more of the above embodiments of the present disclosure, a compound of Formula 1 and a compound of Formula 2 used in an organic light-emitting device may reduce electronic stress (or electric stress) and may reduce an electron-hole balance to improve lifetime and high-rate characteristics of the organic light-emitting device.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the FIGURES, it will be understood by those of ordinary skill in the art that various changes in form and details may be made therein without departing from the spirit and scope of the present embodiments as defined by the following claims.

What is claimed is:

1. An organic light-emitting device comprising:
    a first electrode;
    a second electrode; and
    an organic layer disposed between the first electrode and the second electrode,
    wherein the organic layer comprises a compound represented by Formula 1 and a compound represented by Formula 2:

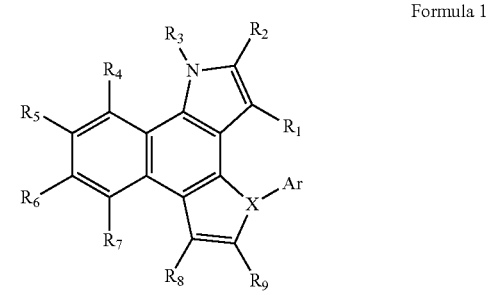

Formula 1 wherein, in Formula 1, $R_1$ to $R_9$ are each independently a hydrogen, a deuterium, a substituted or unsubstituted C1-C60 alkyl group, a substituted or unsubstituted C3-C60 cycloalkyl group, a substituted or unsubstituted C6-C60 aryl group, a substituted or unsubstituted C1-C60 heteroaryl group, C6-C60 arylsilyl group, or a substituted or unsubstituted C6-C60 condensed polycyclic group, Ar is a lone pair of electrons, a substituted or unsubstituted C6-C60 aryl group, a substituted or unsubstituted C1-C60 heteroaryl group, or a substituted or unsubstituted C6-C60 condensed polycyclic group, and X is N (nitrogen) or S (sulfur), provided when X is N (nitrogen) then Ar is a substituted or unsubstituted C6-C60 aryl group, a substituted or unsubstituted C1-C60 heteroaryl group, or a substituted or unsubstituted C6-C60 condensed polycyclic group, and when X is S (sulfur) Ar is a lone pair of electrons,

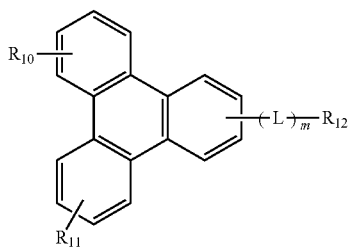

Formula 2 wherein, in Formula 2, L is a substituted or unsubstituted C6-C60 arylene group, or a substituted or unsubstituted C1-C60 heteroarylene group, $R_{10}$ to $R_{12}$ are each independently a hydrogen, a deuterium, a substituted or unsubstituted C1-C60 alkyl group, a substituted or unsubstituted C3-C60 cycloalkyl group, a substituted or unsubstituted C6-C60 aryl group, a substituted or unsubstituted C1-C60 heteroaryl group, or an amine group substituted with a C6-C60 aryl group or a C1-C60 heteroaryl group, and m is an integer of 0 to 5.

2. The organic light-emitting device of claim 1, wherein $R_3$ in Formula 1 is represented by at least one of Formulae 2a to 2e:

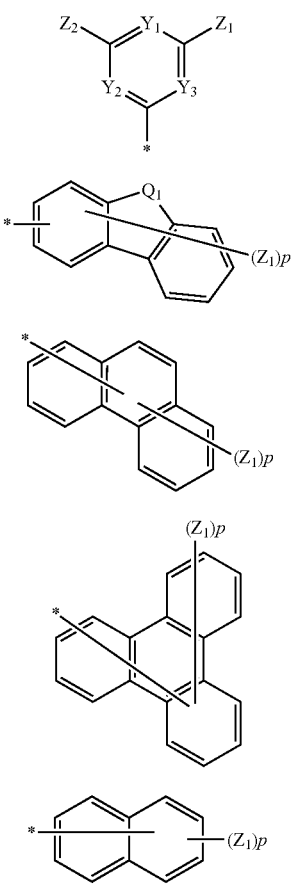

wherein, in Formulae 2a to 2e,
$Y_1$, $Y_2$, and $Y_3$ are each independently CH or N (nitrogen);

$Q_1$ is —$CR_{50}R_{51}$— or —S—;

$Z_1$, $Z_2$, $R_{50}$, and $R_{51}$ are each independently a hydrogen, a deuterium, a substituted or unsubstituted C1-C20 alkyl group, a substituted or unsubstituted C6-C20 aryl group, a substituted or unsubstituted C1-C20 heteroaryl group, a substituted or unsubstituted C6-C20 condensed polycyclic group, an amino group substituted with a C6-C20 aryl group or a C1-C20 heteroaryl group, a halogen group, a cyano group, a nitro group, a hydroxy group, or a carboxyl group;

p is an integer of 1 to 11; and

* indicates an attachment position.

3. The organic light-emitting device of claim 1, wherein $R_6$ in Formula 1 is represented by at least one of Formulae 3a to 3g:

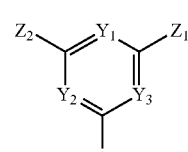

3a

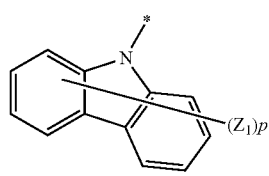

3b

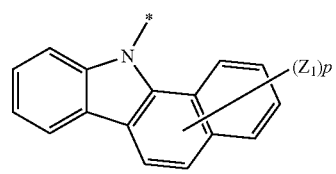

3c

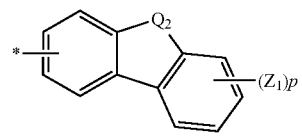

3d

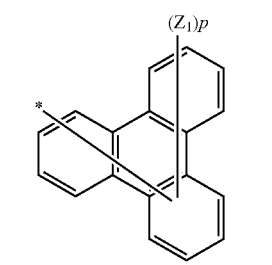

3e

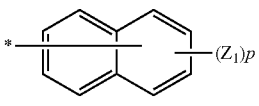

3f

*—$SiR_{21}R_{22}R_{23}$

3g wherein, in Formulae 3a to 3g,
$Y_1$, $Y_2$, and $Y_3$ are each independently CH or N (nitrogen);

$Q_2$ is —O— or —S—;

$Z_1$, $Z_2$, $R_{21}$, $R_{22}$, and $R_{23}$ are each independently a hydrogen, a deuterium, a substituted or unsubstituted C1-C20 alkyl group, a substituted or unsubstituted C6-C20 aryl group, a substituted or unsubstituted C1-C20 heteroaryl group, a substituted or unsubstituted C6-C20 condensed polycyclic group, an amino group substituted with a C6-C20 aryl group or a C1-C20 heteroaryl group, a halogen group, a cyano group, a nitro group, a hydroxy group, or a carboxyl group;

p is an integer of 1 to 11; and

* indicates an attachment position.

4. The organic light-emitting device of claim 1, wherein $R_9$ in Formula 1 is a hydrogen, a deuterium, or

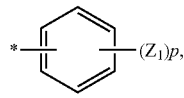

wherein $Z_1$ is a hydrogen, a deuterium, a substituted or unsubstituted C1-C20 alkyl group, a substituted or unsubstituted C6-C20 aryl group, a substituted or unsubstituted C1-C20 heteroaryl group, a substituted or unsubstituted C6-C20 condensed polycyclic group, an amino group substituted with a C6-C20 aryl group or a C1-C20 heteroaryl group, a halogen group, a cyano group, a nitro group, a hydroxy group, or a carboxyl group;

p is an integer of 1 to 5; and

* indicates an attachment position.

5. The organic light-emitting device of claim 1, wherein Ar in Formula 1 is a lone pair of electrons, or is represented by at least one of Formulae 4a to 4e:

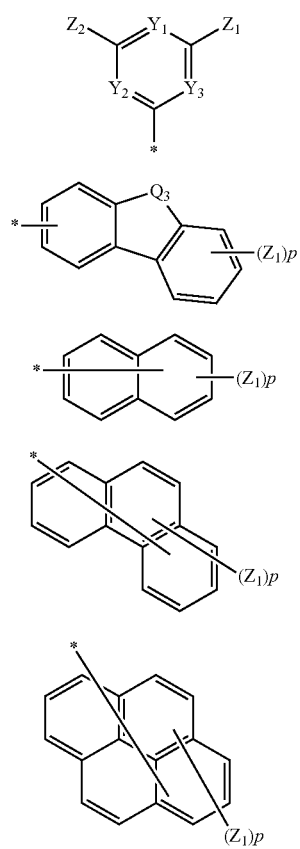

wherein, in Formulae 4a to 4e, $Y_1$, $Y_2$, and $Y_3$ are each independently CH or N (nitrogen);

$Q_3$ is —$CR_{50}R_{51}$—, —$NR_{52}$—, or —S—;

$Z_1$, $Z_2$, $R_{50}$, $R_{51}$, and $R_{52}$ are each independently a hydrogen, a deuterium, a substituted or unsubstituted C1-C20 alkyl group, a substituted or unsubstituted C6-C20 aryl group, a substituted or unsubstituted C1-C20 heteroaryl group, a substituted or unsubstituted C6-C20 condensed polycyclic group, an amino group substituted with a C6-C20 aryl group or a C1-C20 heteroaryl group, a halogen group, a cyano group, a nitro group, a hydroxy group, or a carboxyl group;

p is an integer of 1 to 9; and

* indicates an attachment position.

6. The organic light-emitting device of claim 1, wherein $R_1$, $R_2$, $R_4$, $R_5$, $R_7$, and $R_8$ in Formula 1 are each independently a hydrogen or a deuterium.

7. The organic light-emitting device of claim 1, wherein the compound of Formula 1 is at least one of Compounds 1 to 21:

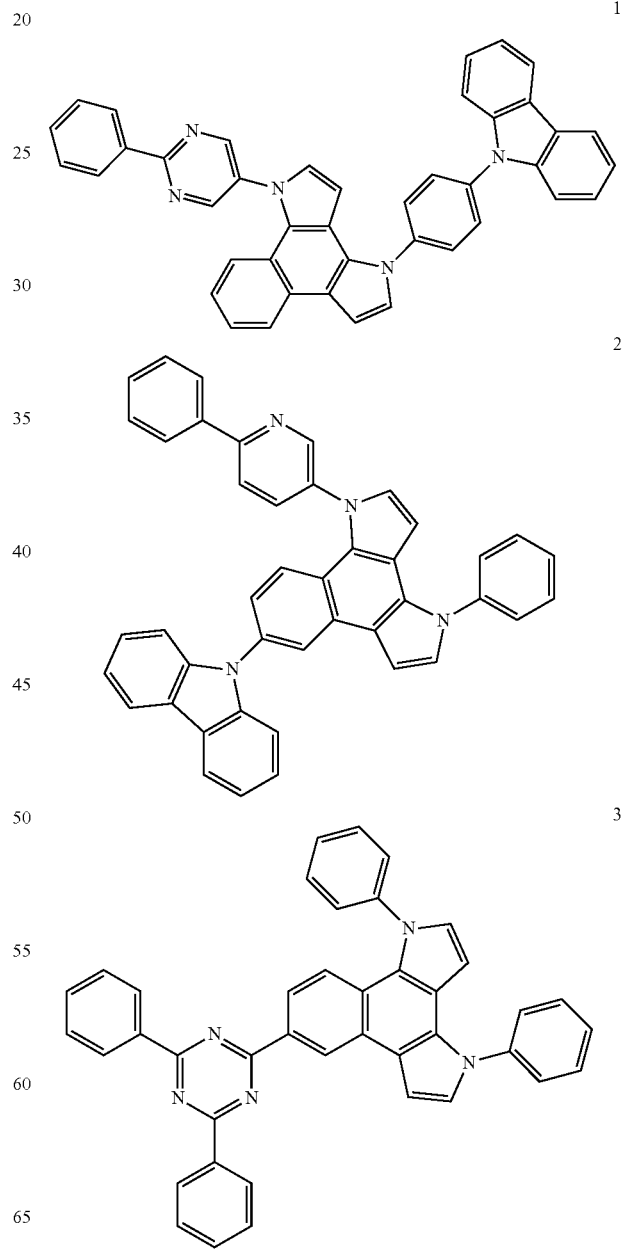

4
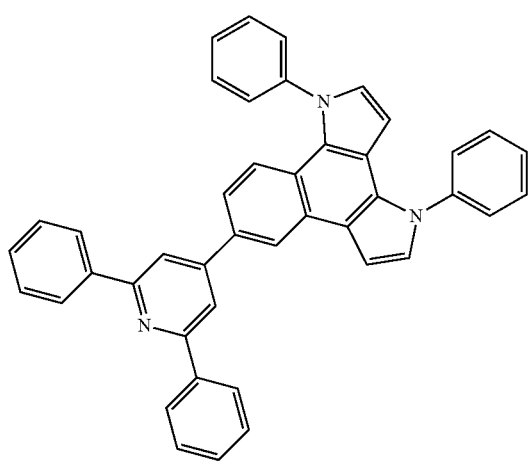
5
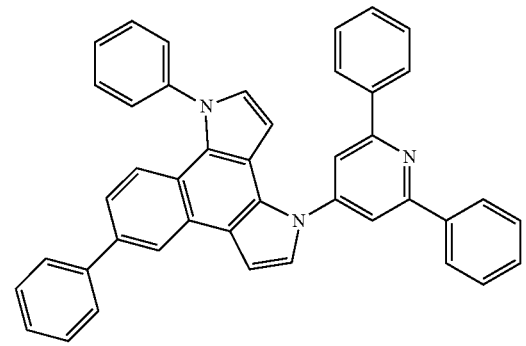
6
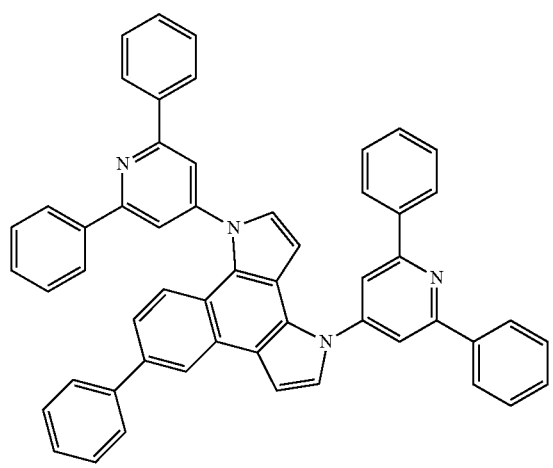
7
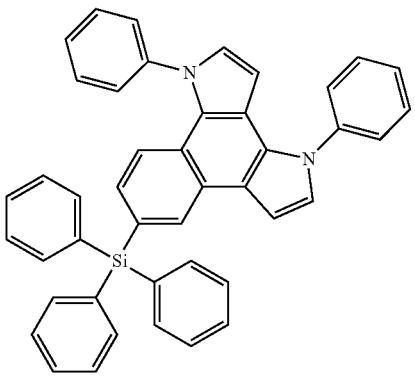
8
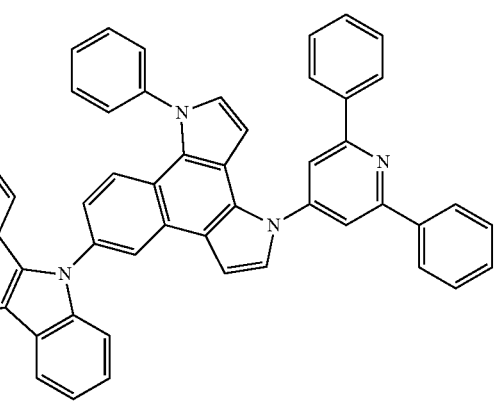
9
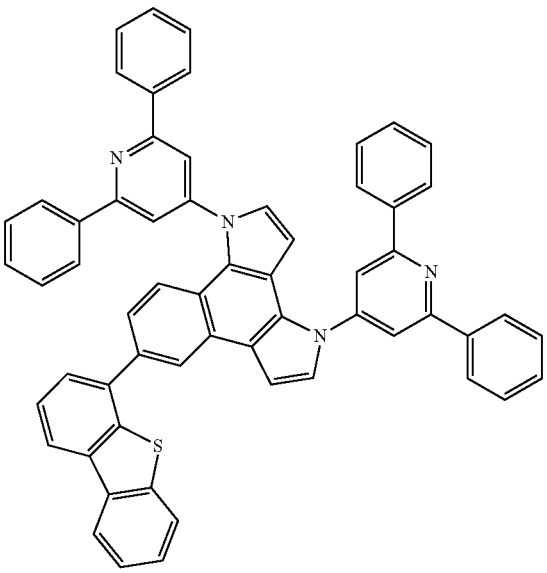

10
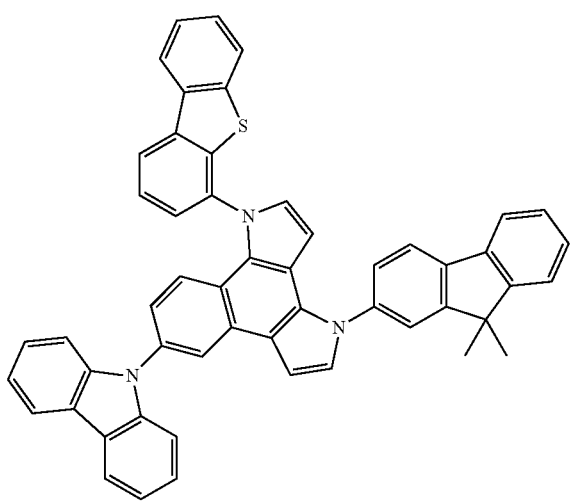
11
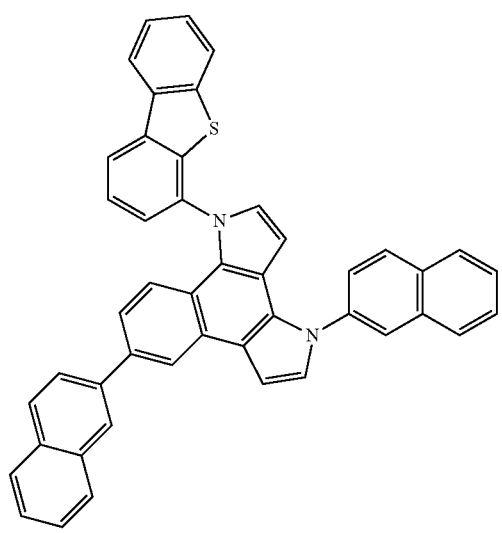
12
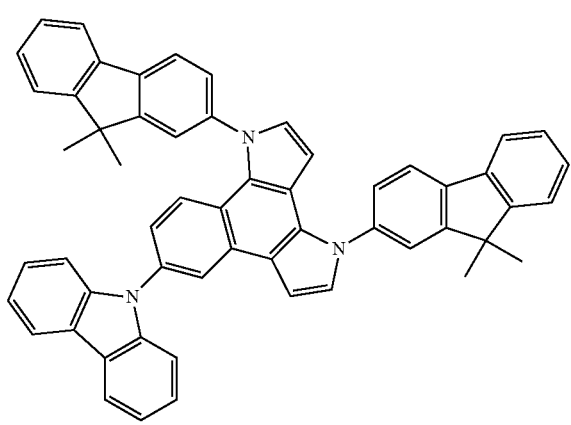
13
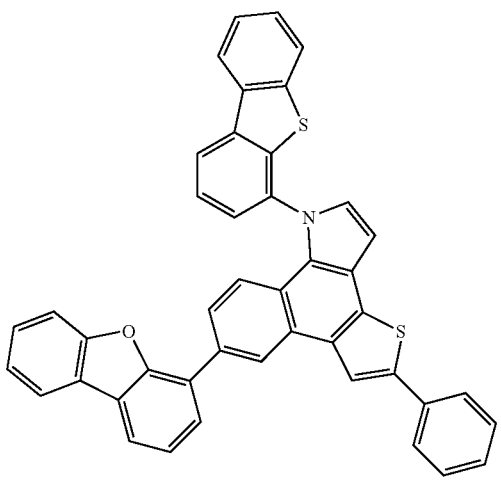
14
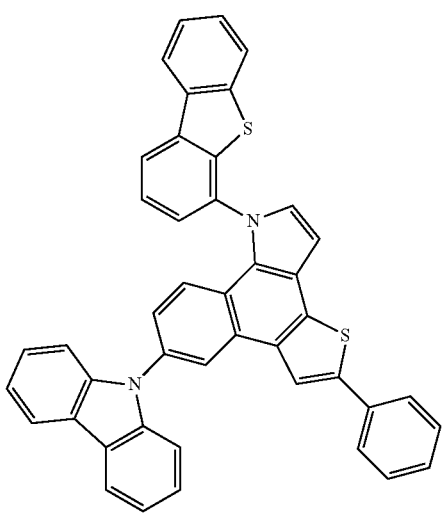
15
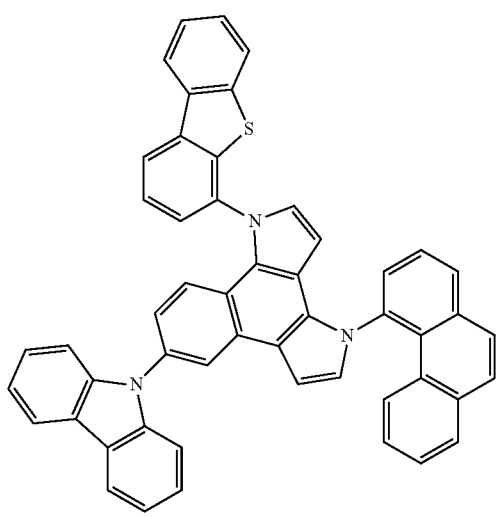

99
-continued
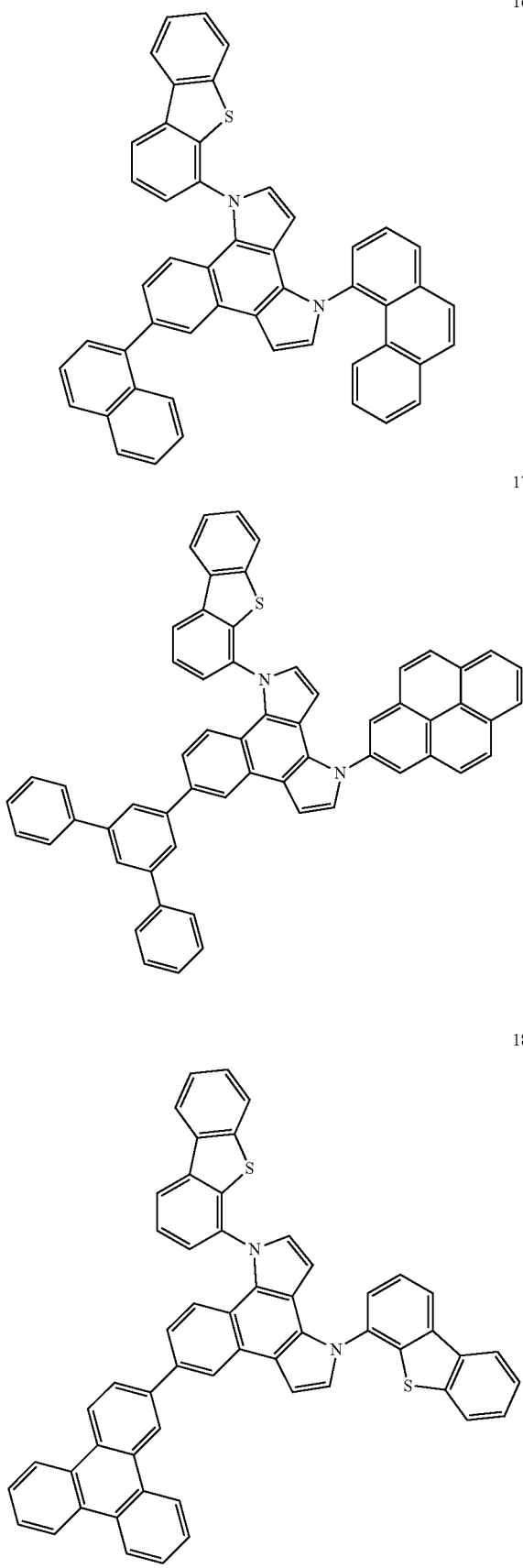
100
-continued
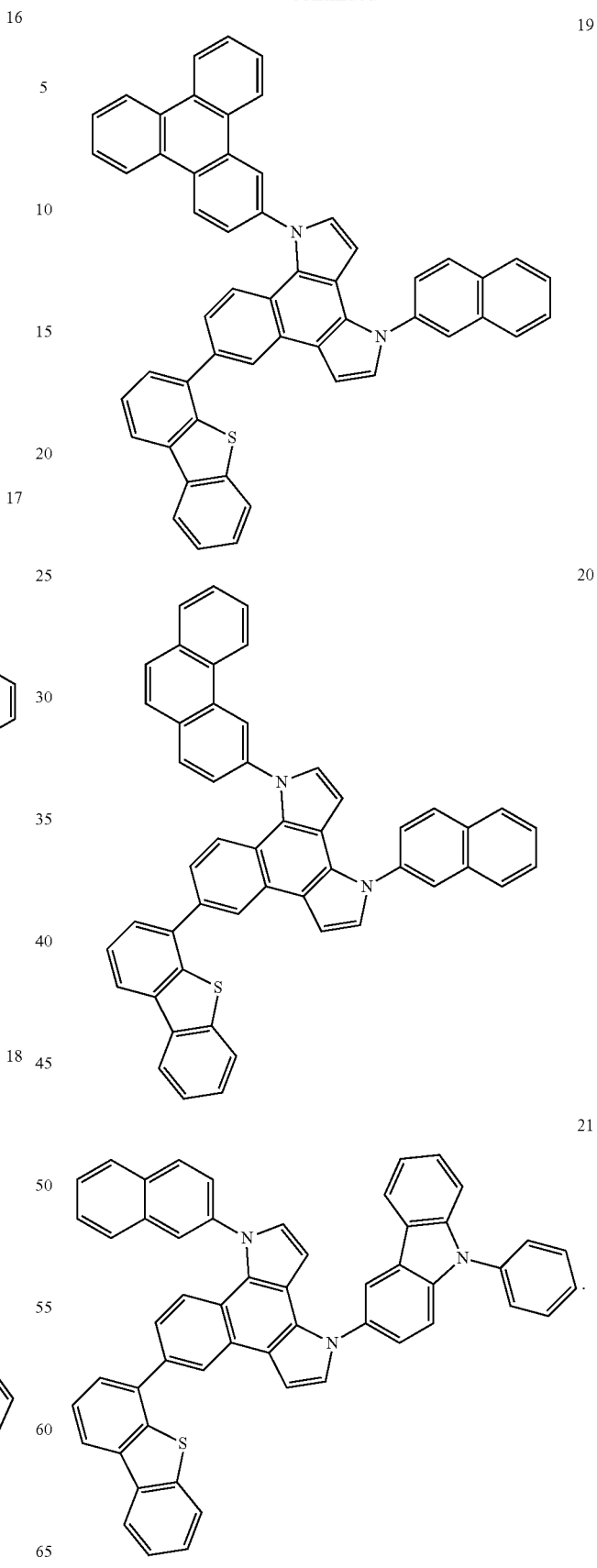

8. The organic light-emitting device of claim 1, wherein $R_{10}$ and $R_{11}$ in Formula 2 are each independently a hydrogen or a deuterium.

9. The organic light-emitting device of claim 1, wherein L in Formula 2 is represented by one of Formulae 5a and 5b:

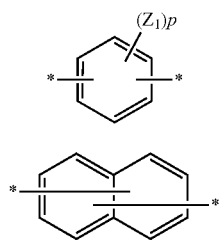

wherein, in Formulae 5a and 5b, $Z_1$ is a hydrogen, a deuterium, a substituted or unsubstituted C1-C20 alkyl group, a substituted or unsubstituted C6-C20 aryl group, a substituted or unsubstituted C1-C20 heteroaryl group, a substituted or unsubstituted C6-C20 condensed polycyclic group, an amino group substituted with a C6-C20 aryl group or a C1-C20 heteroaryl group, a halogen group, a cyano group, a nitro group, a hydroxy group, or a carboxyl group; and

* indicates an attachment position.

10. The organic light-emitting device of claim 1, wherein $R_{12}$ in Formula 2 is represented by one of Formulae 6a to 6g:

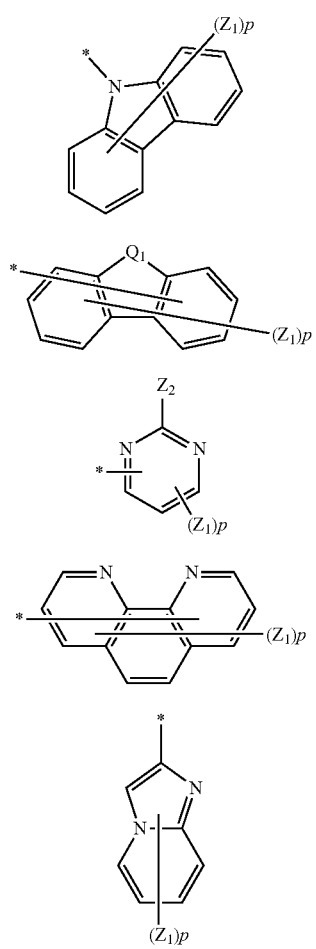

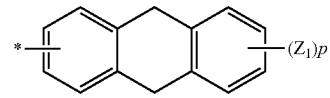

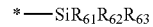

wherein, in Formulae 6a to 6g, $Q_1$ is $-NR_{51}$, $-CR_{52}R_{53}-$, or $-S-$;

$Z_1$, $Z_2$, $R_{51}$, $R_{52}$, $R_{53}$, $R_{61}$, $R_{62}$, and $R_{63}$ are each independently a hydrogen, a deuterium, a substituted or unsubstituted C1-C20 alkyl group, a substituted or unsubstituted C6-C20 aryl group, a substituted or unsubstituted C1-C20 heteroaryl group, a substituted or unsubstituted C6-C20 condensed polycyclic group, an amino group substituted with a C6-C20 aryl group or a C1-C20 heteroaryl group, a halogen group, a cyano group, a nitro group, a hydroxy group, or a carboxyl group;

p is an integer of 1 to 9; and

* indicates an attachment position.

11. The organic light-emitting device of claim 1, wherein m in Formula 2 is an integer of 0 to 3.

12. The organic light-emitting device of claim 1, wherein the compound of Formula 2 is one of Compounds [2-1] to [2-32]:

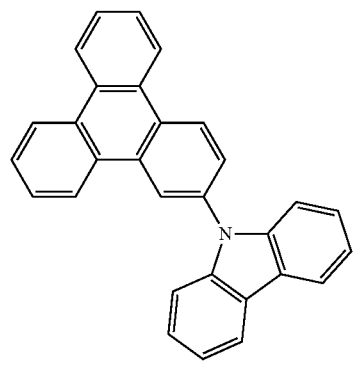

[2-1]

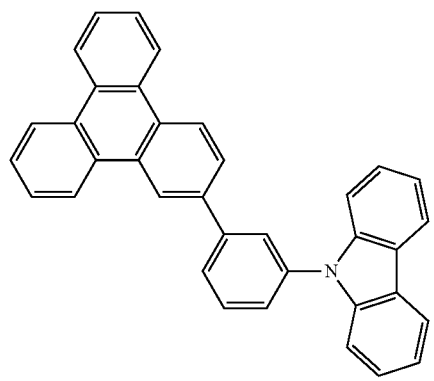

[2-2]

-continued
[2-3]
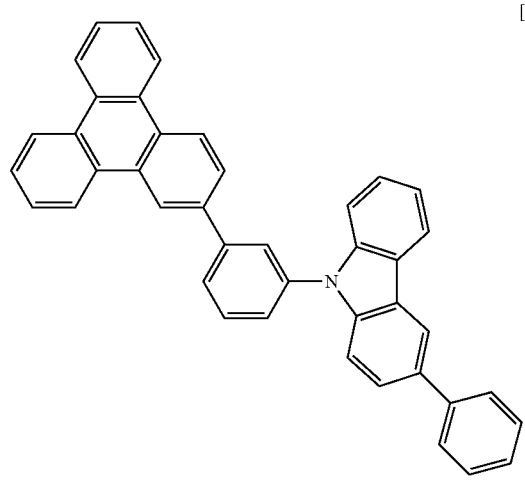
[2-4]
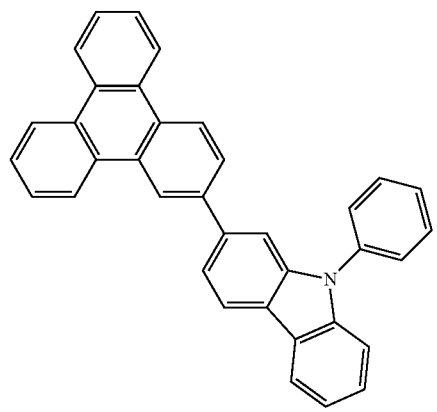
[2-5]
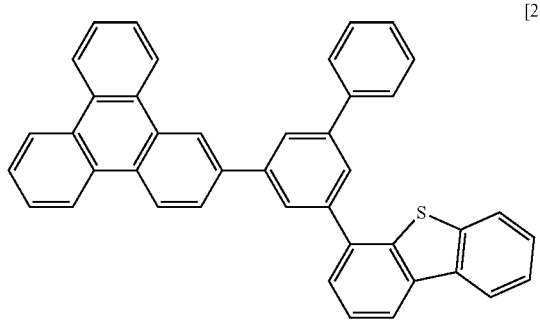
[2-6]
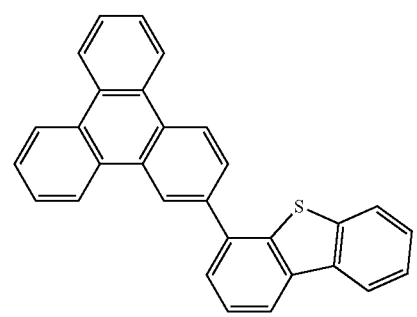
[2-7]
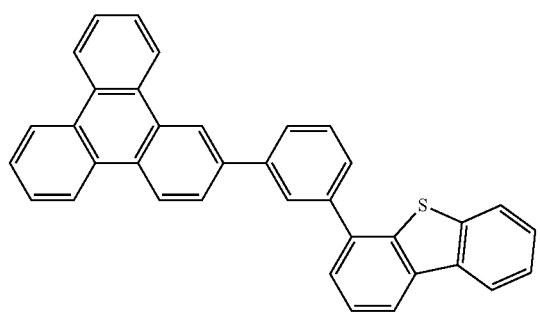
[2-8]
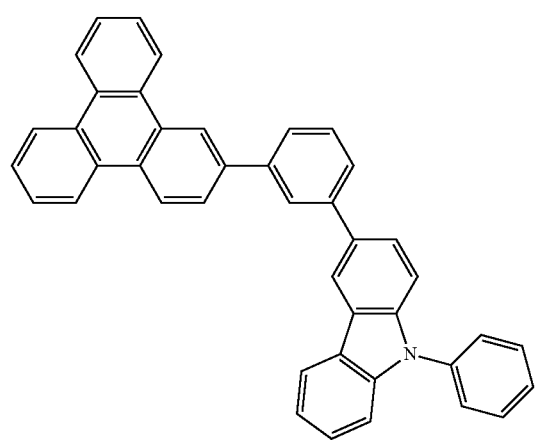
[2-9]
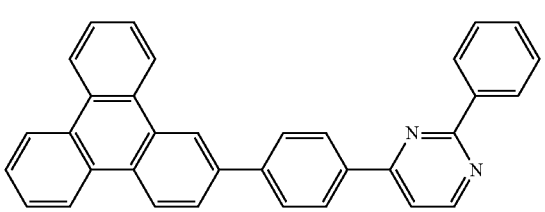
[2-10]
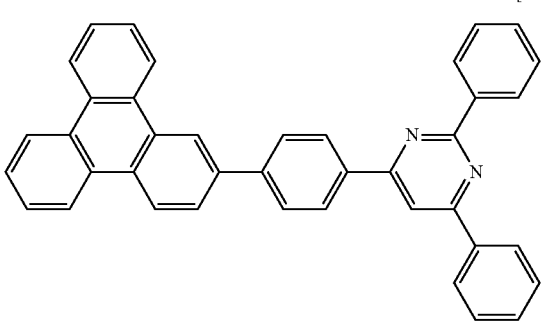

[2-11]
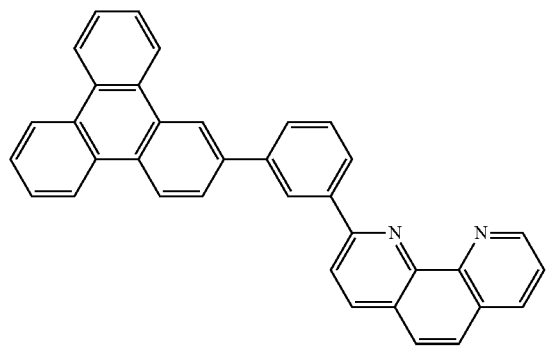
[2-12]
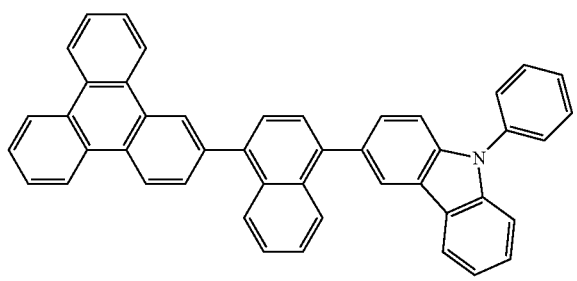
[2-13]
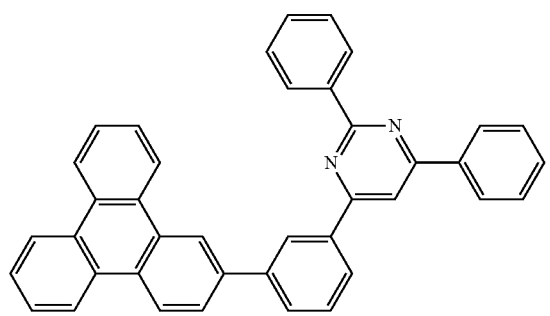
[2-14]
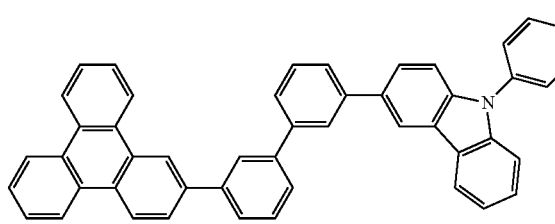
[2-15]
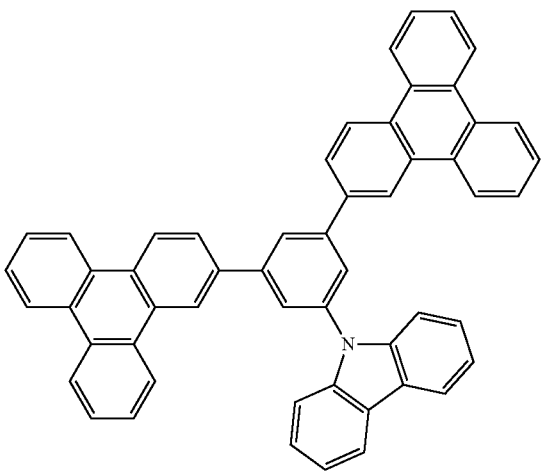
[2-16]
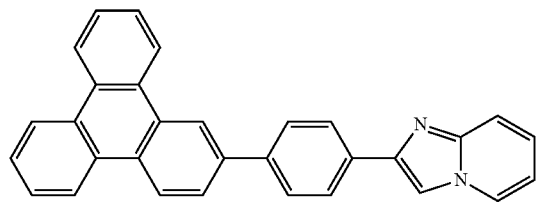
[2-17]
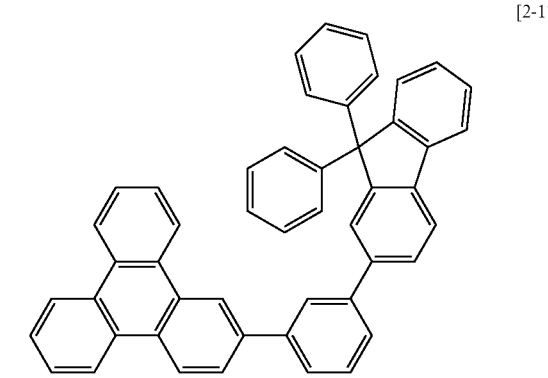
[2-18]
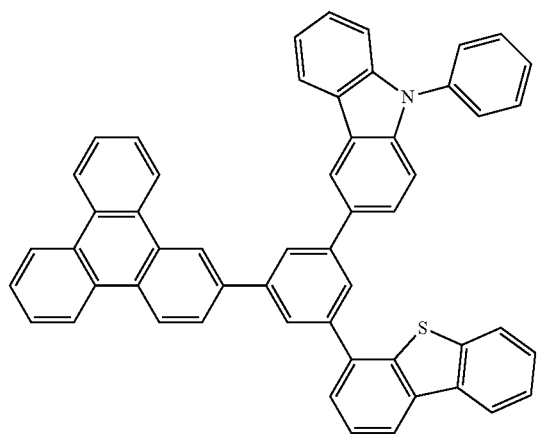

[2-19]
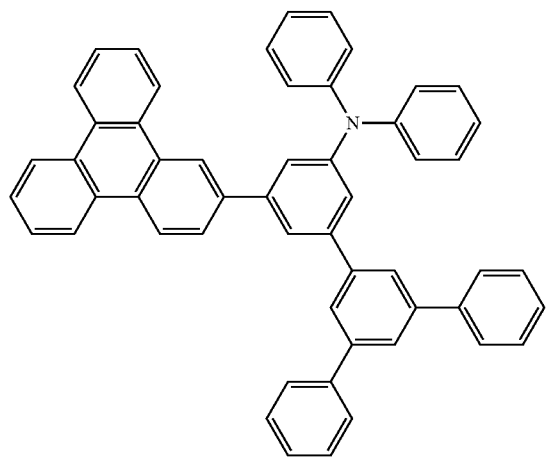
[2-20]
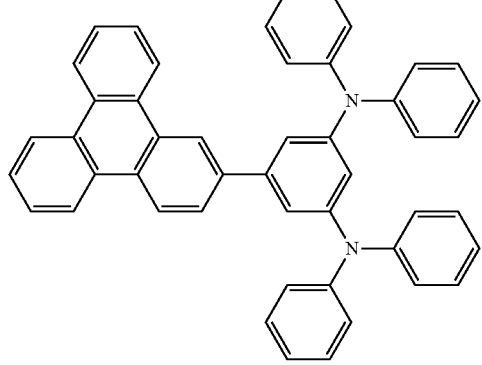
[2-23]
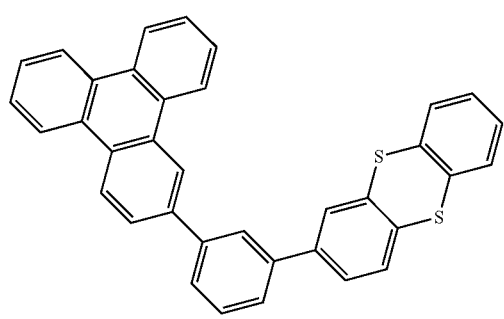
[2-24]
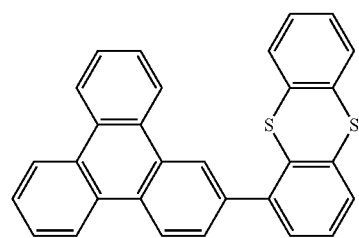
[2-25]
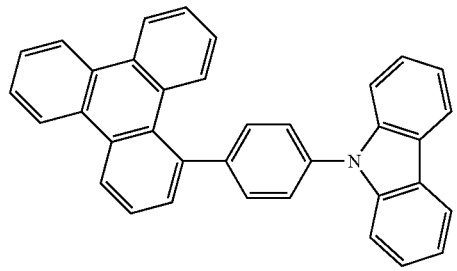
[2-26]
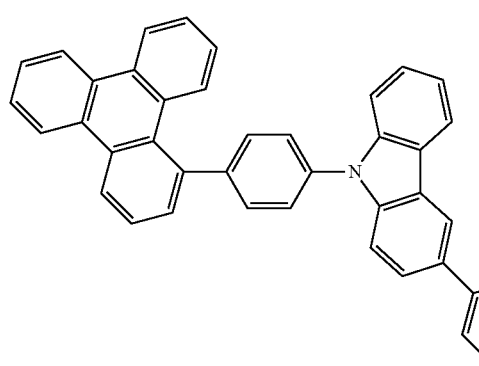
[2-27]
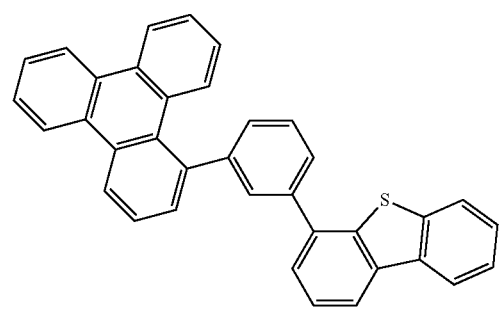
[2-28]
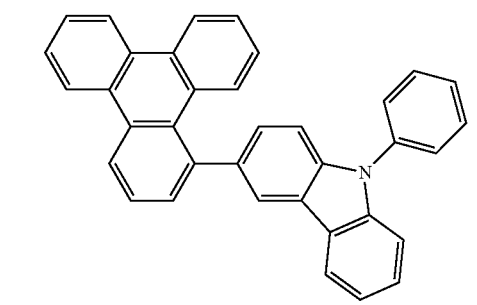
[2-29]
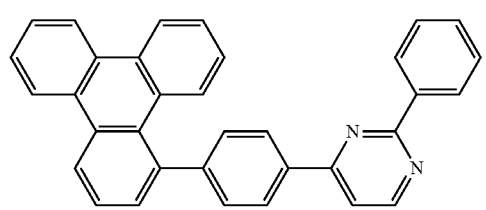

[2-30]

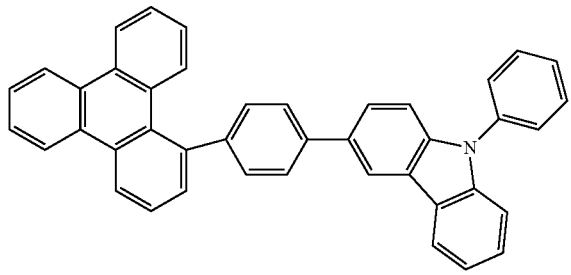

[2-31]

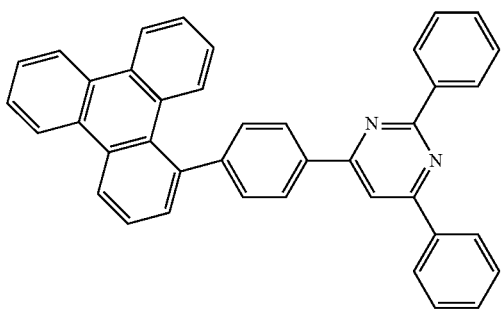

[2-32]

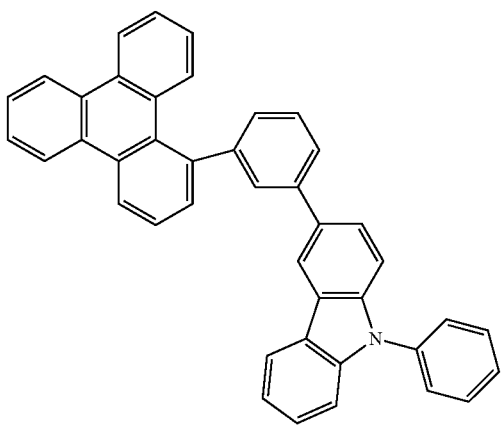

[2-21]

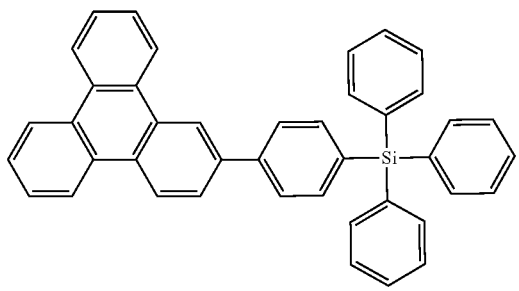

[2-22]

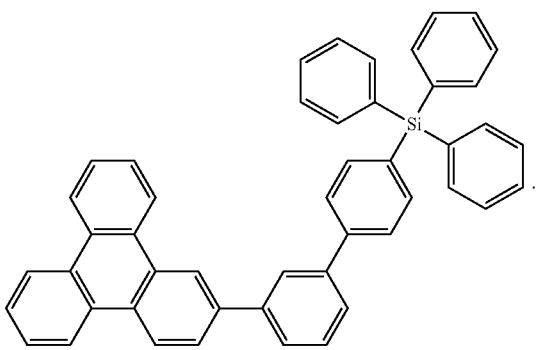

13. The organic light-emitting device of claim 1, wherein the organic layer is an emission layer.

14. The organic light-emitting device of claim 1, wherein the organic layer is an emission layer, and the emission layer comprises a phosphorescent material as a dopant.

15. The organic light-emitting device of claim 1, wherein the compound of Formula 1 and the compound of Formula 2 are in a ratio of about 5:4 to about 8:1 by weight.

16. The organic light-emitting device of claim 1, wherein the organic layer comprises the compound of Formula 1 and the compound of Formula 2 as hosts, and a phosphorescent material as a dopant, and the host and the dopant are in a ratio of about 5:4 to about 9.5:0.5 by weight.

17. The organic light-emitting device of claim 1, wherein the organic layer comprises an emission layer, an electron injection layer, an electron transport layer, a functional layer having both electron injection and transport capabilities, a hole injection layer, a hole transport layer, or a functional layer having both hole injection and transport capabilities, and the emission layer comprises red, green, blue, and white emission layers, one of which comprises the compound of Formula 1 and the compound of Formula 2 as hosts and a phosphorescent material as a dopant.

18. The organic light-emitting device of claim 17, wherein at least one of the hole injection layer, the hole transport layer, and the functional layer having both hole injection and hole transport capabilities comprises a charge-generating material.

19. The organic light-emitting device of claim 18, wherein the charge-generating material is a p-type dopant.

20. The organic light-emitting device of claim 19, wherein the p-dopant is a quinone derivative, a metal oxide, or a cyano group-containing compound.

21. The organic light-emitting device of claim 1, wherein the organic layer comprises an electron transport layer, and the electron transport layer comprises a metal complex.

22. The organic light-emitting device of claim 21, wherein the metal complex is lithium quinolate (LiQ), or Compound 203

Compound 203
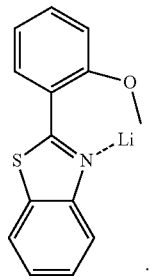
23. A flat panel display device comprising the organic light-emitting device of claim 1, wherein the first electrode of the organic light-emitting device is electrically connected to a source electrode or a drain electrode of a thin-film transistor.
* * * * *